(12) United States Patent
Kashihara

(10) Patent No.: US 9,048,355 B2
(45) Date of Patent: Jun. 2, 2015

(54) SEMICONDUCTOR DEVICE AND MANUFACTURING METHOD THEREOF

(71) Applicant: Renesas Electronics Corporation, Kawasaki-shi, Kanagawa (JP)

(72) Inventor: Keiichiro Kashihara, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/951,440

(22) Filed: Jul. 25, 2013

(65) Prior Publication Data
US 2014/0027873 A1    Jan. 30, 2014

(30) Foreign Application Priority Data

Jul. 27, 2012  (JP) ................. 2012-166690

(51) Int. Cl.
| | | |
|---|---|---|
| H01L 21/00 | (2006.01) | |
| H01L 31/0232 | (2014.01) | |
| H01L 31/18 | (2006.01) | |
| H01L 23/544 | (2006.01) | |
| H01L 27/146 | (2006.01) | |

(52) U.S. Cl.
CPC ............ *H01L 31/0232* (2013.01); *H01L 31/18* (2013.01); *H01L 23/544* (2013.01); *H01L 27/14625* (2013.01); *H01L 27/14632* (2013.01); *H01L 27/14685* (2013.01); *H01L 27/14687* (2013.01); *H01L 2223/54426* (2013.01); *H01L 2223/5446* (2013.01); *H01L 2924/0002* (2013.01)

(58) Field of Classification Search
CPC ............ H01L 23/544; H01L 27/14625; H01L 31/0232; H01L 31/18
USPC ........................................................... 438/48
See application file for complete search history.

(56) References Cited

U.S. PATENT DOCUMENTS

| | | | |
|---|---|---|---|
| 2009/0225331 A1* | 9/2009 | Van Haren | 356/614 |
| 2011/0250716 A1* | 10/2011 | Kohyama | 438/69 |
| 2012/0135559 A1* | 5/2012 | Maruyama et al. | 438/65 |

FOREIGN PATENT DOCUMENTS

JP    2006-059873 A    3/2006

* cited by examiner

*Primary Examiner* — Douglas Menz
(74) *Attorney, Agent, or Firm* — Miles & Stockbridge P.C.

(57) ABSTRACT

A semiconductor device and a manufacturing method thereof are provided which can suppress corrosion by chemicals in processes, while preventing generation of thermal stress on a mark. A semiconductor device includes a semiconductor layer with a front-side main surface and a back-side main surface opposed to the front-side main surface, a plurality of light receiving elements formed in the semiconductor layer for performing photoelectric conversion, a light receiving lens disposed above the back-side main surface for supplying light to the light receiving element, and a mark formed inside the semiconductor layer. The mark extends from the front-side main surface to the back-side main surface. The mark has a deeply located surface recessed toward the front-side main surface rather than the back-side main surface. The deeply located surface is formed of silicon.

16 Claims, 55 Drawing Sheets

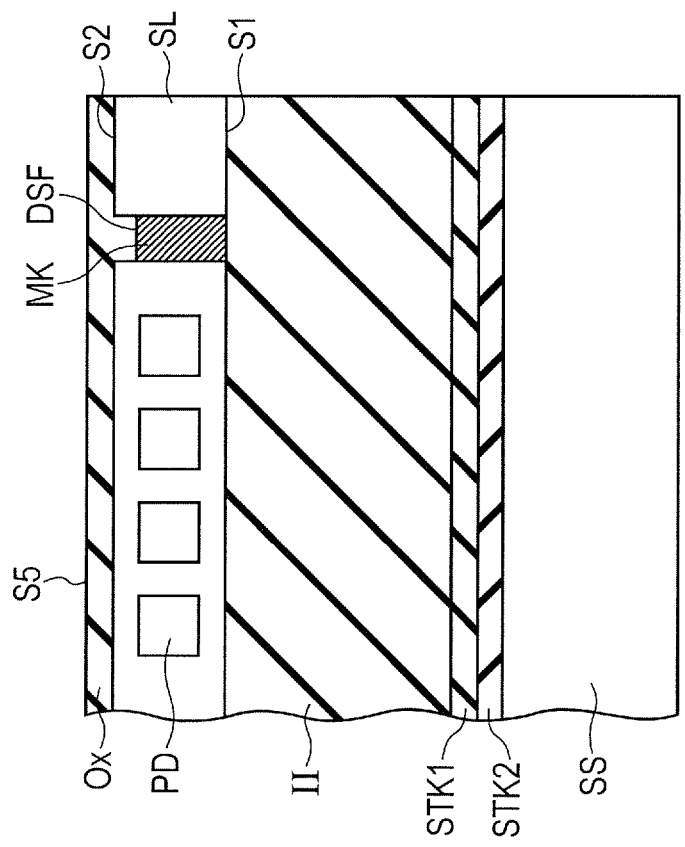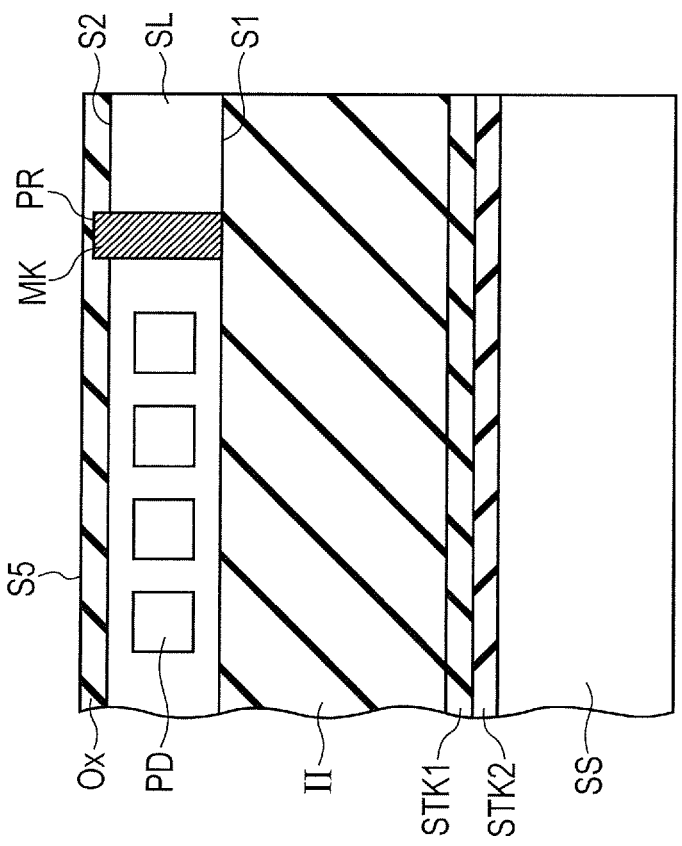

SEMICONDUCTOR DEVICE AND MANUFACTURING METHOD THEREOF

CROSS-REFERENCE TO RELATED APPLICATIONS

The disclosure of Japanese Patent Application No. 2012-166690 filed on Jul. 27, 2012 including the specification, drawings and abstract is incorporated herein by reference in its entirety.

BACKGROUND

The present invention relates to semiconductor devices and manufacturing methods thereof, and more particularly, to a solid-state imaging element including a so-called backside illuminated light receiving element, and a manufacturing method thereof.

The solid-state imaging element is a semiconductor device with an electrode, a wiring, and a light receiving element, such as a photodiode, formed over a surface of a semiconductor substrate. The solid-state imaging element normally has a so-called front-side illuminated structure that applies light for photoelectric conversion from the upper side (front-side) thereof to the light receiving element.

In the front-side illuminated light receiving element, however, the light is applied from the upper side of a metal wiring formed above the light receiving element, which causes a part of the light to be reflected by the metal wiring or the like. As a result, the light cannot effectively reach the light receiving element, which is a problem for the light receiving element. In order to solve the problem, the so-called backside illuminated solid-state imaging element has been developed which is designed to irradiate the light receiving element with light for the photoelectric conversion from the lower side (back-side) of the imaging element. For example, Japanese Unexamined Patent Publication No 2006-59873 (Patent Document 1) is disclosed in the backside illuminated solid-state imaging element.

RELATED ART DOCUMENTS

Patent Documents

[Patent Document 1]
Japanese Unexamined Patent Publication No. 2006-59873

SUMMARY

A single crystal silicon layer included in the solid-state imaging element disclosed in Patent Document 1 has a mark for processing an embedded oxide film or the like. The mark might be possibly etched together with the embedded oxide film when performing wet etching for processing the embedded oxide film or the like. The mark might expand its volume by being oxidized. The expansion of the mark can compress and apply the stress on the single crystal silicon layer near the mark to cause crystal defects, such as laminated layer defects, which can cause leakage of current or breakdown voltage.

Other problems and new features of the invention will be better understood after a reading of the following detailed description of the present application in connection with the accompanying drawings.

A semiconductor device according to one embodiment of the invention includes a semiconductor layer, a plurality of light receiving elements, a light receiving lens, and a mark. The semiconductor layer has a front-side main surface and a back-side main surface. The mark is formed in the semiconductor layer, and extends in the direction from the front-side main surface to the back-side main surface. The mark has a deeply located surface recessed toward the front-side main surface rather than the back-side main surface, and formed of silicon.

In a manufacturing method of a semiconductor device according to another embodiment of the invention, first, a semiconductor substrate with a front-side main surface and an opposed main surface opposed to the front-side main surface is provided. The semiconductor substrate has an insulating layer embedded therein along the front-side main surface and the opposed main surface. Then, a trench is formed to extend from the front-side main surface of the semiconductor substrate to the back-side main surface located at a boundary with the insulating layer opposed to the front-side main surface. A mark is formed in the trench to extend in the direction from the front-side main surface to the back-side main surface. The mark has a deeply located surface recessed toward the front-side main surface rather than the back-side main surface. A plurality of light receiving elements are formed from the front-side main surface in a semiconductor layer formed in a region between the front-side main surface and the back-side main surface of the semiconductor substrate. A region is removed from the opposed main surface to the back-side main surface of the semiconductor substrate. A light receiving lens for supplying light to the light receiving element is disposed using the mark. The deeply located surface is formed of silicon.

According to one embodiment of the present invention, the semiconductor device and the manufacturing method thereof are provided which can suppress the corrosion by chemicals in processes, while preventing the generation of thermal stress on the mark.

BRIEF DESCRIPTION OF THE DRAWINGS

FIG. 22A is a schematic cross-sectional view showing the structure of the mark protruding upward with respect to the back-side main surface upon completion of the step shown in FIG. 16;

FIG. 22B is a schematic cross-sectional view showing the structure of the mark recessed downward with respect to the back-side main surface upon the completion of the step shown in FIG. 16;

DETAILED DESCRIPTION

Now, some preferred embodiments of the present invention will be described below with reference to the accompanying drawings.

First Embodiment

A semiconductor device in a wafer state according to this embodiment will be described below.

Figure 1:
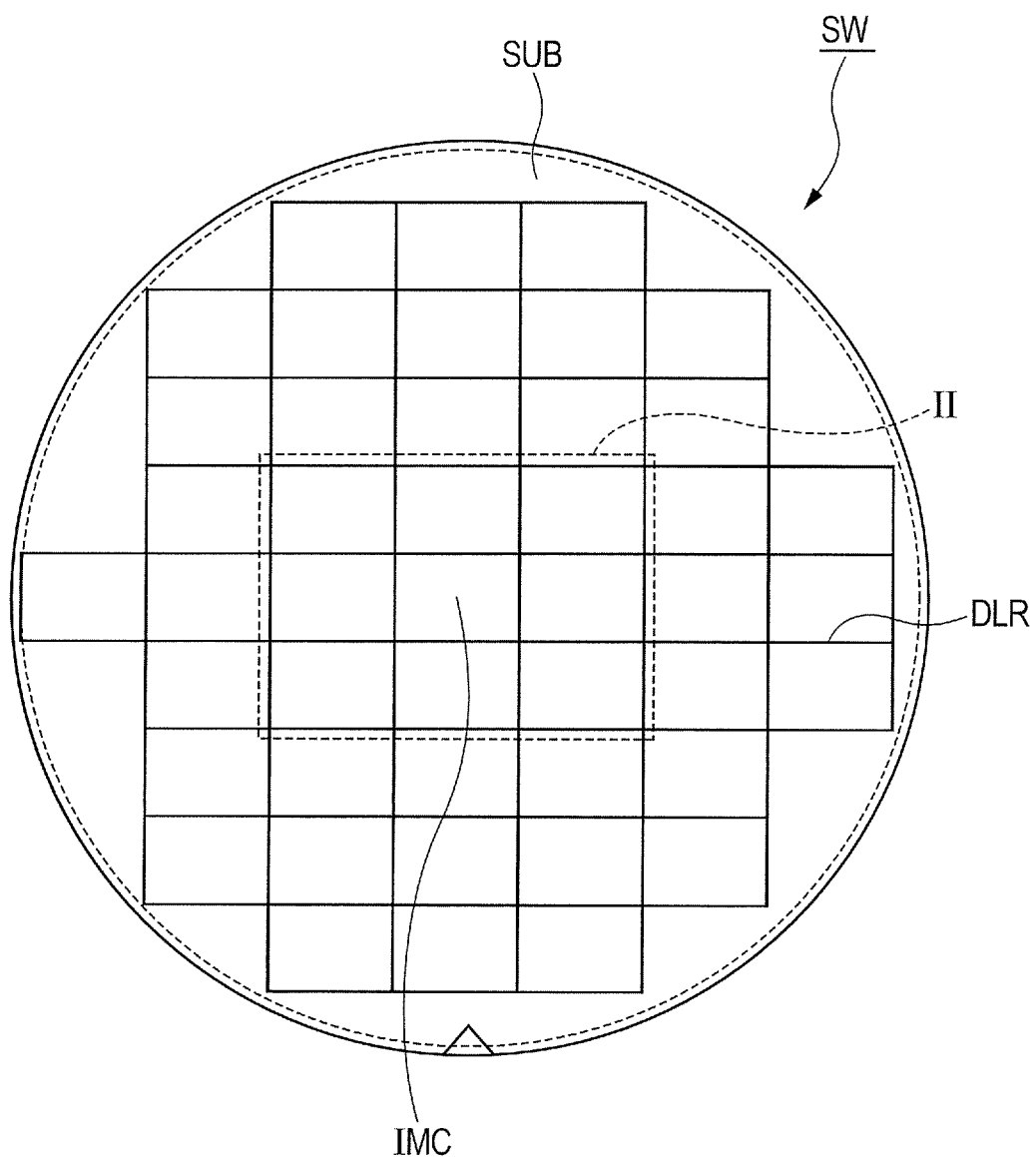
FIG. 1 is a schematic plan view showing the state of a wafer in a semiconductor device according to the invention.

Referring to FIG. 1, a plurality of chip regions IMC for an image sensor are formed in a semiconductor wafer SW. The chip regions IMC each have a rectangular plane shape, and are arranged in an array.

Figure 2:
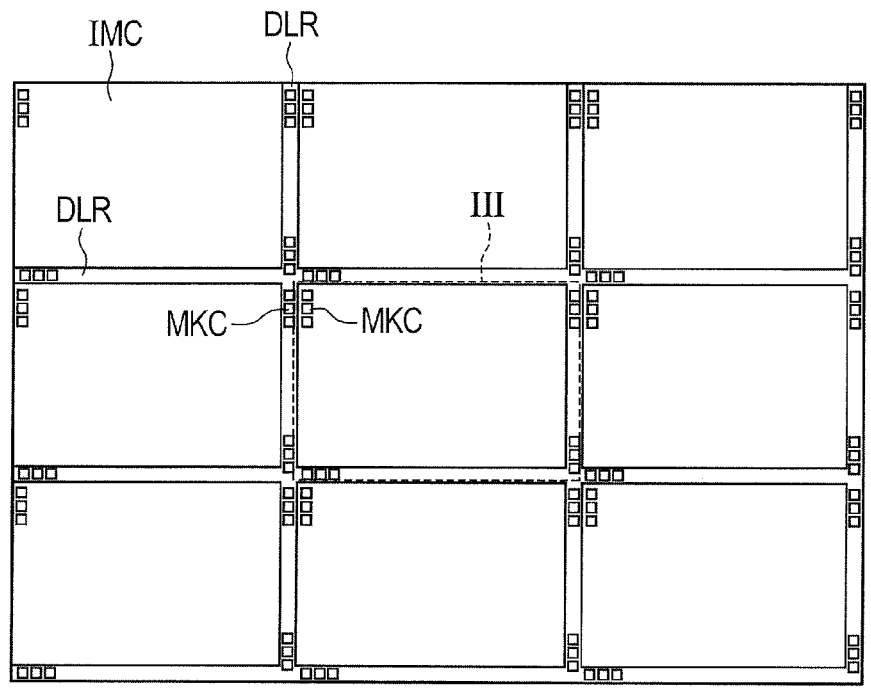
FIG. 2 is a schematic enlarged plan view of a region II enclosed by a dotted line of FIG. 1.

Referring to FIGS. 1 and 2, a solid-state imaging element including a plurality of light receiving elements is formed in each of the chip regions IMC.

Dicing line regions DLR are formed between the chip regions IMC at the semiconductor wafer SW. The semiconductor wafer SW is diced by the dicing line regions DLR to be separated into a plurality of semiconductor chips.

Marks MKC (each of which is a mark for detecting misalignment, that is, a superimposition detection mark or the so-called BOX mark) are used to form the semiconductor device, including the solid-state imaging element. The marks MKC are formed over the dicing line regions DLR or the chip regions IMC. When being formed over the chip regions IMC, the marks MKC are preferably formed in the vicinity of the edges of the chip regions IMC.

Figure 3:
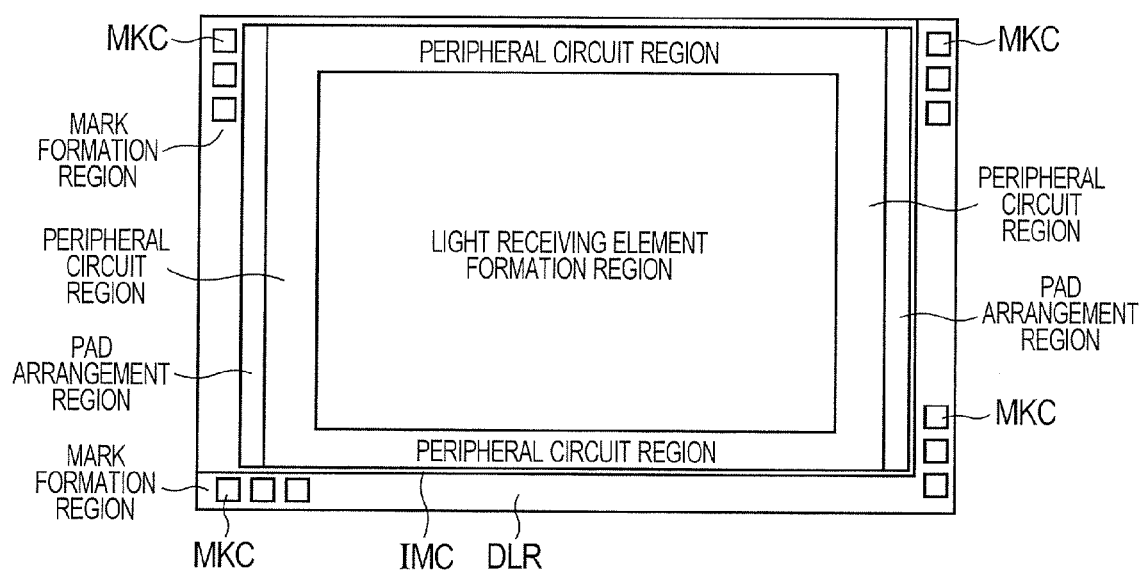
FIG. 3 is a schematic enlarged plan view of a region III enclosed by a dotted line of FIG. 2.

Referring to FIG. 3, more specifically, the chip region IMC shown in FIG. 2 includes a light receiving element formation region, a peripheral circuit region, and a pad arrangement region. The light receiving element formation region is also called a pixel array. The light receiving element formation region is a region having the solid-state imaging element with a plurality of light receiving elements.

The peripheral circuit region is disposed to enclose the light receiving element formation region. The peripheral circuit region is a region having a peripheral circuit for controlling the light receiving element, such as a photodiode. The peripheral circuit is formed, for example, as a so-called CMOS (complementary metal oxide semiconductor) transistor circuit in the outer peripheral region of the light receiving element region (pixel array) in the chip region IMC.

The pad arrangement region is a region provided with a pad for electrically coupling the light receiving element and the peripheral circuit in the chip region IMC to an external circuit of the chip region IMC.

The same marks MKC as those formed over the dicing line region DLR are also formed at the corners (outer peripheral regions) of the chip region IMC. More specifically, each mark MKC is preferably formed in the outer peripheral region over the dicing line region DLR or chip region IMC. The outer peripheral region in the plan view of FIG. 2 from over the dicing line region DLR or the chip region IMC preferably includes the mark formation region in which the marks MKC are formed, and a non-mark formation region in which no mark MKC is formed.

More specifically, for example, as shown in FIG. 2, an upper left region of the outer periphery of each chip region IMC in which the marks MKC are disposed corresponds to the above mark formation region, while a region of the outer periphery of each chip region IMC other than the above mark formation region without the mark MKC corresponds to the above non-mark formation region. The same goes for regions over the dicing line region DLR. A region of the dicing line region DLR in which the marks MKC are disposed corresponds to the above mark formation region, while a region other than the above mark formation region corresponds to the above non-mark formation region. For example, preferably, each mark for detecting the misalignment is disposed on each of four corners over the dicing line region DLR or chip region IMC, so that at least four marks are arranged in total.

Figure 4A:
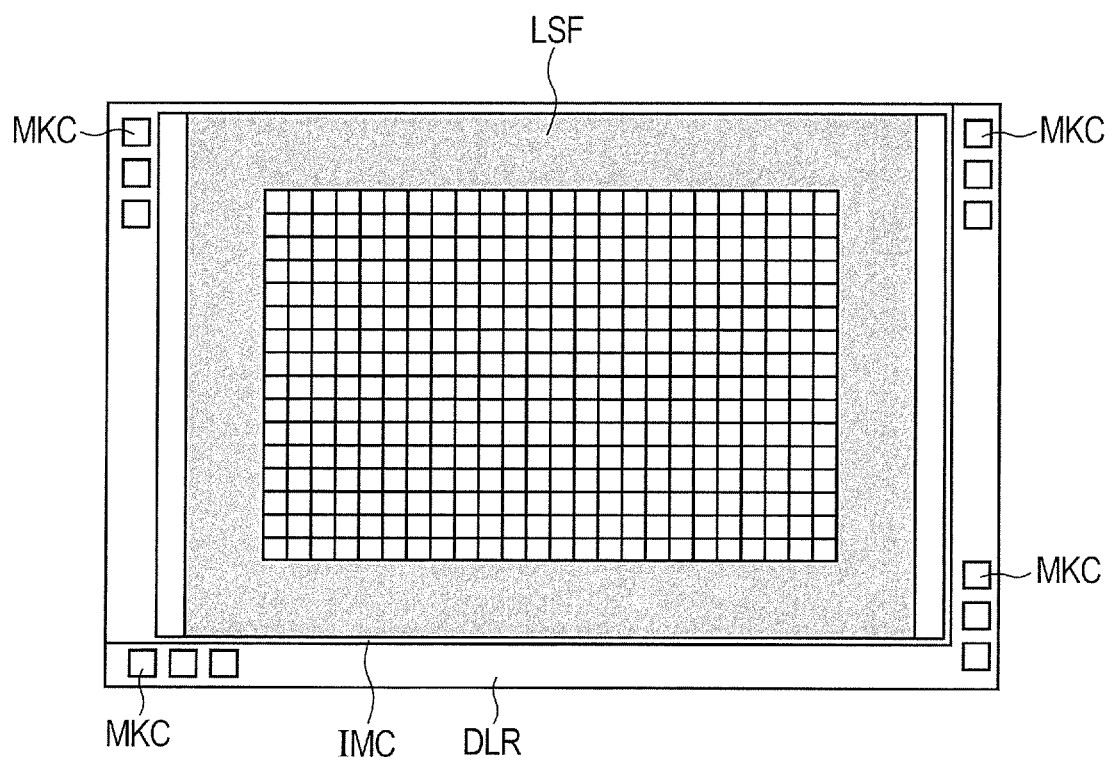
FIGS. 4A and 4B are schematic plan views showing the structure of a light shielding film formed in a chip region.

Referring to FIG. 4A, a light shielding film LSF is formed in the light receiving element formation region and the peripheral circuit region of the chip region IMC. The light shielding film LSF is a thin film for preventing the light for the light receiving element formation region from entering the peripheral circuit region to thereby suppress the inconveniences of the peripheral circuit which might be caused by application of the light for the light receiving element (light receiving element formation region) to the peripheral circuit in use. The light shielding film LSF is formed of the thin film made of material with a light shielding property, for example, an aluminum thin film that blocks the light applied to the photodiode.

Figure 4B:
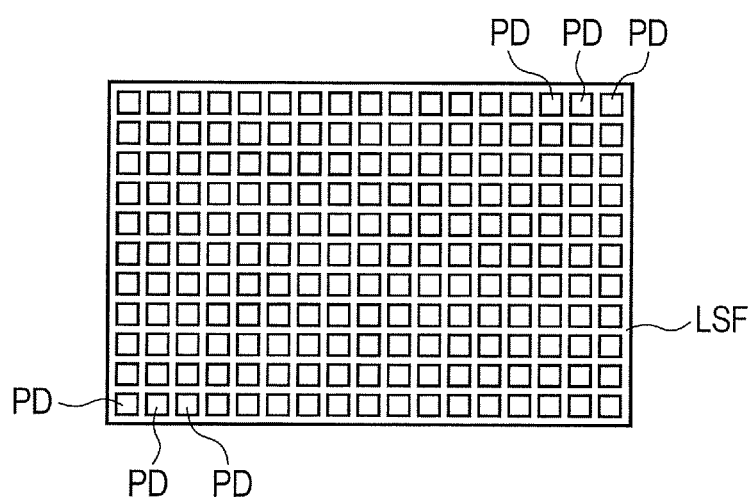

Referring to FIGS. 4A and 4B, the light shielding film LSF is formed to enclose the individual photodiodes PD arranged in the center of the light receiving element formation region, in a mesh manner in the center of the shielding film in the plan view, that is, in the center of the light receiving element formation region. In other words, the meshed light shielding film LSF is formed to serve as a partition between the photodiodes PD arranged adjacent to each other in a planar manner.

In contrast, in the region around the outer edge of the light receiving element formation region (near the boundary with the peripheral circuit region) and in the peripheral circuit region existing in the outer periphery of the light receiving element formation region, the light shielding film LSF does not take the form of mesh. For example, the light shielding film LSF completely covers the photodiodes PD located near the outer edges of the light receiving element formation region to prevent the light from entering the covered photodiodes PD. If the light is completely applied to the transistor circuit formed in the peripheral circuit region, the level of leak current might become high in OFF of the transistor. However, the presence of the light shielding film LSF that serves to completely block the light can suppress the leak current.

Figure 5:
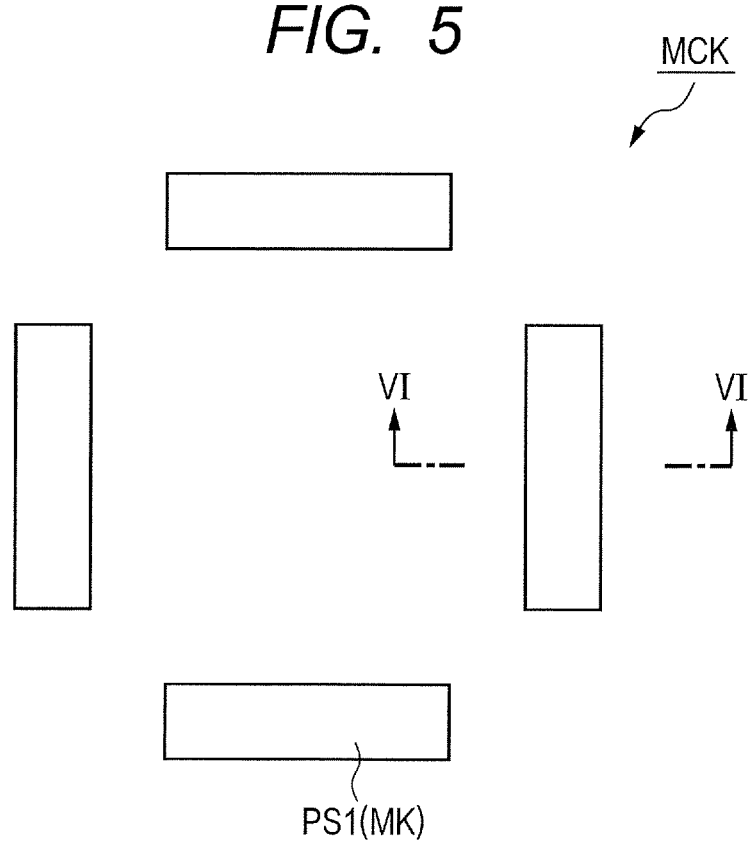
FIG. 5 is a schematic enlarged view showing an example of a plane form of a mark in a first embodiment of the invention.

Referring to FIGS. 2 and 5, the mark MKC has a rectangular frame planar shape as shown in FIG. 2. More specifically, as shown in FIG. 5, the rectangular mark MKC is formed of marks MK forming respective sides of the rectangular shape while the ends of the respective sides of the rectangular shape are not connected together, by way of example.

Figure 6:
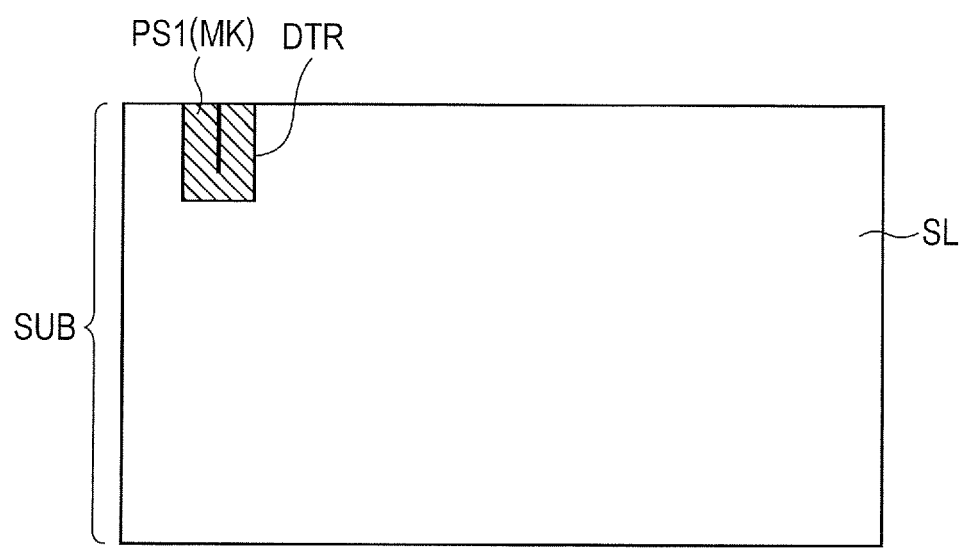
FIG. 6 is a schematic cross-sectional view showing one example of the form of the mark taken along the line VI-VI of FIG. 5 in the first embodiment.

Referring to FIGS. 5 and 6, the marks MK form a pattern of polycrystalline silicon layers PS1 in the plan view formed within a semiconductor layer SL (semiconductor substrate SUB) made of single crystal silicon, for example. That is, the mark MK is formed of the polycrystalline silicon layer PS1 disposed to fill at least a part of the inside of a trench DTR formed at the main surface of the semiconductor layer SL. More specifically, the mark MK has the form of one layer of the polycrystalline silicon PS1 that fills at least a part of the inside of the trench DTR formed at one main surface of the semiconductor layer SL (semiconductor substrate SUB). Thus, the trench DTR is not regarded as a component of the mark MK. The semiconductor substrate SUB is a substrate forming a semiconductor wafer SW.

The mark MK is formed inside the trench DTR extending in the direction from one main surface of the semiconductor layer SL to the other main surface thereof opposed to the one main surface. The mark MK may be formed only in a part of a region between the one main surface and the other main surface of the semiconductor layer SL. Alternatively, the mark MK may penetrate the semiconductor layer SL from one main surface to the other main surface thereof.

The mark may include, for example, the marks MK arranged in a rectangular shape, like the mark MKC shown in FIG. 5. Alternatively, only the single mark MK shown in FIGS. 5 and 6 may be used as the mark.

FIG. 6 emphasizes the shape of a cross-section of the mark MK shown in FIG. 5. The semiconductor substrate SUB shown in FIG. 6 may not be necessarily identical to the form of the semiconductor substrate shown in FIG. 5.

Figure 7:
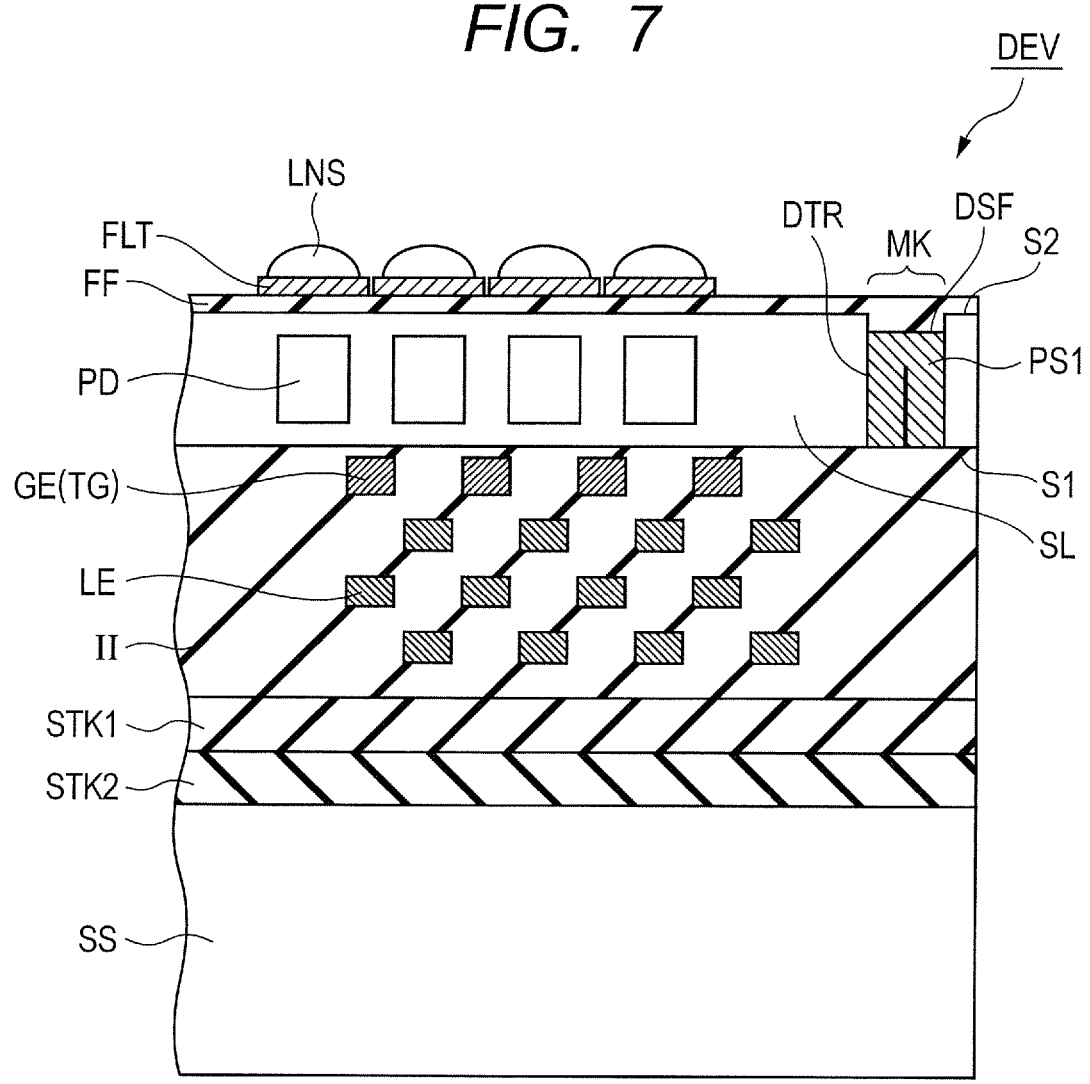
FIG. 7 is a schematic cross-sectional view showing the form of a light receiving element formation region with photodiodes and transistors formed therein, and a mark formation region with the marks formed therein in the semiconductor device according to the first embodiment.

FIG. 7 totally shows a single diagram of the light receiving elements in the light receiving element formation region and the marks in the mark formation region. Referring to FIG. 7, the semiconductor device DEV of the first embodiment includes a semiconductor layer SL formed of, for example, silicon. The semiconductor layer SL includes a front-side main surface S1 as a main surface on the front side, and a back-side main surface S2 as a main surface on the back side opposed to the front-side main surface S1.

A plurality of (for example, in FIG. 7, four) photodiodes PD (light receiving elements) are formed in the semiconductor layer SL. As shown in FIG. 7, each photodiode PD is simplified in the form of a single rectangle, but actually the photodiode PD has the well-known general structure with the so-called pn junction which includes, for example, a p-type impurity region and an n-type impurity region, as will be described later.

The back-side main surface S2 of the semiconductor layer SL is covered with a planarized layer FF formed of, for example, a silicon oxide film. A color filter FLT consisting of a red filter, a green filter, and a blue filter is formed over the planarized layer FF. Each of on-chip lenses LNS (light receiving lenses) is formed over the color filter FLT (that is, over the back-side main surface S2). The color filter FLT and the on-chip lens LNS are formed to be substantially superimposed over the photodiode PD in the plan view. Thus, the light entering the on-chip lens LNS penetrates the on-chip lens LNS to be supplied to the photodiode PD.

Thus, the semiconductor device DEV is a solid-state imaging element for generating an electric signal in the photodiode PD by electric-converting the light entering the photodiode PD from the back-side main surface S2 of the semiconductor layer SL. That is, the semiconductor device DEV is the so-called backside illuminated solid-state imaging element.

The marks MK are formed inside the semiconductor layer SL. For simplifying the figure, the single mark MK is only shown, but instead of the mark MK, the mark MKC may be disposed as shown in FIG. 5.

As mentioned above, the mark MK formed of the polycrystalline silicon layer PS1 extends within the semiconductor layer SL from the front-side main surface S1 toward the back-side main surface S2. As shown in FIG. 7, the mark MK extends from the front-side main surface S1 as a starting point toward the back-side main surface S2 (that is, in the direction intersecting the front-side main surface S1 and the back-side main surface S2).

More specifically, the trench DTR is formed inside the semiconductor layer SL to extend from the front-side main surface S1 to the back-side main surface S2 in the direction intersecting the front-side main surface S1 or the like so as to penetrate the semiconductor layer SL. The polycrystalline silicon layer PS1 formed inside the trench DTR is provided as the mark MK.

The entire mark MK is formed of silicon material, such as the polycrystalline silicon layer PS1. Thus, the semiconductor layer SL and the marks MK formed therein are formed of silicon material.

The polycrystalline silicon layer PS1 as the mark MK extends from the front-side main surface S1 toward the back-side main surface S2 inside the trench DTR, but does not reach the back-side main surface S2 and has a deeply located surface DSF inside the semiconductor layer SL (trench DTR). That is, the mark MK is formed to have the deeply located surface DSF which is recessed toward the front-side main surface S1 side rather than the back-side main surface S2. That is, the back-side main surface S2 and the deeply located surface DSF are different in height in the vertical direction as shown in FIG. 7, which produces a stepped portion between the back-side main surface S2 and the deeply located surface SDF. In other words, the mark MK is formed to extend from the front-side main surface S1 as a starting point to the deeply located surface DSF as an end point therebetween.

As described above, the mark MK is formed of silicon material, such as the polycrystalline silicon layer PS1, and the deeply located surface DSF is formed of silicon material, such as the polycrystalline silicon layer PS1.

The deeply located surface DSF expands along the front-side main surface S1 and the back-side main surface S2, and has its edge formed in contact with the trench DTR. The polycrystalline silicon layer PS1 of the mark MK extends in the direction in which the trench DTR extends, and turns back at the deeply located surface DSF to change its extending direction by 180 degrees. That is, after extending from the main surface S1 to the main surface S2, the polycrystalline silicon layer PS1 turns back at the deeply located surface DSF to change its extending direction by 180 degrees, and then extends from the main surface S2 to the main surface S1.

As shown in FIG. 7, the planarized layer FF is formed to cover the upper surface of the back-side main surface S2 of the semiconductor layer SL, the upper surface of the deeply located surface DSF, and walls of the trench DTR not covered with the polycrystalline silicon layer PS1. In other words, the planarized layer FF is formed to be in contact with the upper surface of the back-side main surface S2 of the semiconductor layer SL, the upper surface of the deeply located surface DSF, and the walls of the trench DTR not covered with the polycrystalline silicon layer PS1. The deeply located surface DSF is covered with the planarized layer FF as a coating layer for the deeply-positioned surface. However, actually, the planarized layer FF shown in FIG. 7 may not be a single layer made of a silicon oxide film, but may be a laminated structure including the above light shielding film LSF and a reflection preventing film for suppressing the reflection of light for the photodiode PD.

The planarized layer FF is formed over the back-side main surface S2 to be in contact with the upper surfaces of the back-side main surface S2 and the mark MK (to cover the back-side main surface S2 and the mark MK). The polycrystalline silicon layer PS1 of the mark MK has the deeply located surface DSF recessed toward the front-side main surface S1 rather than the back-side main surface S2. The planarized layer FF is formed flat such that the upper surface of the layer FF is substantially at the same height over both the back-side main surface S2 and the mark MK. Thus, the planarized layer FF in contact with an upper part of the deeply located surface DSF (mark MK) is preferably thicker than the planarized layer FF in contact with an upper part of the region other than the mark MK (for example, the back-side main surface S2 directly above the photodiode PD).

In addition to the above structure, the semiconductor device DEV has the following structure. The light receiving element formation region includes transistors TG. Each transistor TG is formed of, for example, a metal oxide semiconductor (MOS) transistor. The MOS transistor includes a gate electrode GE. The gate electrode GE is an electrode included in the transistor TG for input and output of electric signals with respect to the photodiode PD. More specifically, the transistor TG is a transfer transistor for input and output of electric signals between the photodiode PD and, for example, a metal wiring LE and the peripheral circuit.

A bonded layer STK1 is formed over an interlayer insulating layer II (over the main surface of the interlayer insulating layer II opposite to the semiconductor layer SL). The structure including the semiconductor layer SL and the color filter with the bonded layer STK1 formed is coupled to the support substrate SS with a bonded layer STK2 formed. The semiconductor layer SL is coupled to the support substrate SS by bonding the bonded layer STK1 to the bonded layer STK2 in contact with each other. The support substrate SS is a substrate for supporting the structure including the semiconductor layer SL. The support substrate SS is a semiconductor wafer formed of, for example, single crystal silicon. The bonded layers STK1 and STK2 are formed of, for example, a silicon oxide film. The semiconductor layer SL with the photodiodes PD formed therein can have improved mechanical strength by being bonded to the support substrate SS.

An insulating layer Ox covers the upper surface of the mark MK. When the insulating layer Ox is made of material with high light permeability, such as a silicon oxide film, the mark MK disposed under the insulating layer Ox can be seen from the above.

The polycrystalline silicon layer PS1 fills in the entire inside of the trench DTR forming the mark MK (see FIG. 6). The polycrystalline silicon layer PS1 is not formed outside the trench DTR, and the height of the lowest point of the polycrystalline silicon layer PS1 (see FIG. 7) is substantially the same as that of the front-side main surface S1.

Next, referring to FIGS. 8 to 21, a manufacturing method of the semiconductor device DEV according to this embodiment, mainly, a manufacturing method of the mark MK will be described below.

Referring to FIGS. 8 to 21, the mark formation region for the dicing line regions DLR, the peripheral circuit region with the CMOS transistors formed therein, and the light receiving element formation region with the single photodiode PD among the regions with the pixel arrays formed therein are arranged side by side.

Figure 8:
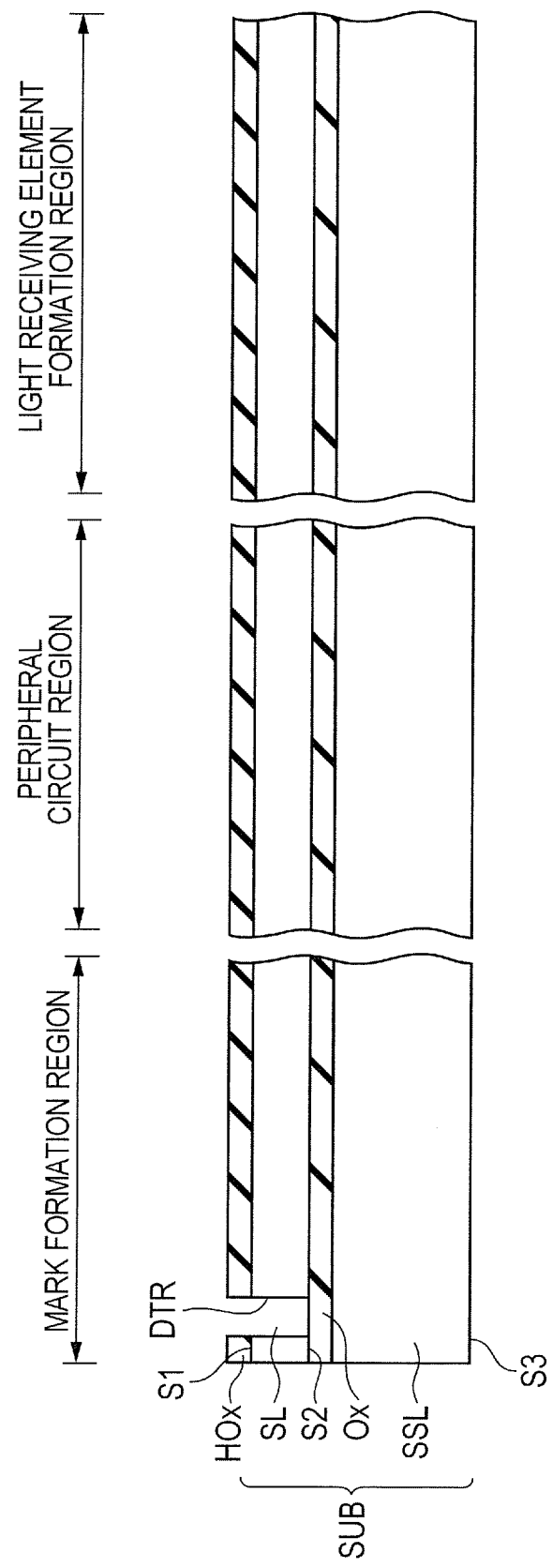
FIG. 8 is a schematic cross-sectional view showing a first step in a manufacturing method of the semiconductor device in the first embodiment.

Referring to FIG. 8, first, a semiconductor substrate SUB is provided. The semiconductor substrate SUB includes a main surface S1 (front-side main surface), and a main surface S3 (opposed main surface) opposed to the main surface S1. The semiconductor substrate SUB is formed, for example, along the main surface S1 and the main surface S3, such that the insulating layer Ox made of the silicon oxide film is embedded in the semiconductor substrate SUB. The semiconductor layer SL made of single crystal silicon is formed in contact with one of a pair of main surfaces (the main surface S1 and the other main surface along the main surface S3) of the insulating layer Ox, and a base substrate SSL made of single crystal silicon is formed in contact with the other main surface. The semiconductor layer SL and the base substrate SSL are formed of the single crystal silicon containing n-type impurities by way of example. In this way, the semiconductor substrate SUB is provided as a so-called silicon on insulator (SOI) substrate including a lamination of the base substrate SSL, the insulating layer Ox, and the semiconductor layer SL laminated in that order. The semiconductor layer SL has a pair of main surfaces, namely, the front-side main surface S1 and the back-side main surface S2. The front-side main surface S1 is the same as the main surface S1 of the semiconductor substrate SUB.

An insulating film, such as a silicon oxide film HOx, is formed, for example, by a chemical vapor deposition (CVD) method, to cover the substantially entire main surface S1 (front-side main surface S1 of the semiconductor layer SL) of the semiconductor substrate SUB. The thickness of the silicon oxide film HOx is preferably, for example, not less than 200 nm nor more than 400 nm, and more preferably, 300 nm (not less than 250 nm nor more than 350 nm) by way of example. The silicon oxide film HOx is etched in an area of the mark formation region in which especially the mark MK (trench DTR) is to be formed, using a pattern (not shown) of a photoresist (photosensitizing agent) patterned by normal photoengraving techniques (exposure and development) as a mask. The etching of the silicon oxide film HOx is dry etching, such as a reactive ion etching (RIE) method.

By using the thus-patterned silicon oxide film HOx as a hard mask for etching of the semiconductor substrate SUB, normal etching is performed on the semiconductor substrate SUB. In this way, the trench DTR is formed to penetrate from the uppermost main surface of the silicon oxide film HOx through the silicon oxide film HOx and the semiconductor layer SL to reach the back-side main surface S2, for example.

The trench DTR is formed to extend vertically shown in FIG. 8 so as to reach the front-side main surface S1 of the semiconductor layer SL from the uppermost main surface of the silicon oxide film HOx and then to reach the back-side main surface S2 from the front-side main surface S1. However, the trench DTR is preferably formed to extend at least from the front-side main surface S1 of the semiconductor layer SL toward the back-side main surface S2 of the insulating layer Ox opposed thereto. The back-side main surface S2 corresponds to the boundary between the semiconductor layer SL and the insulating layer Ox.

Figure 9:
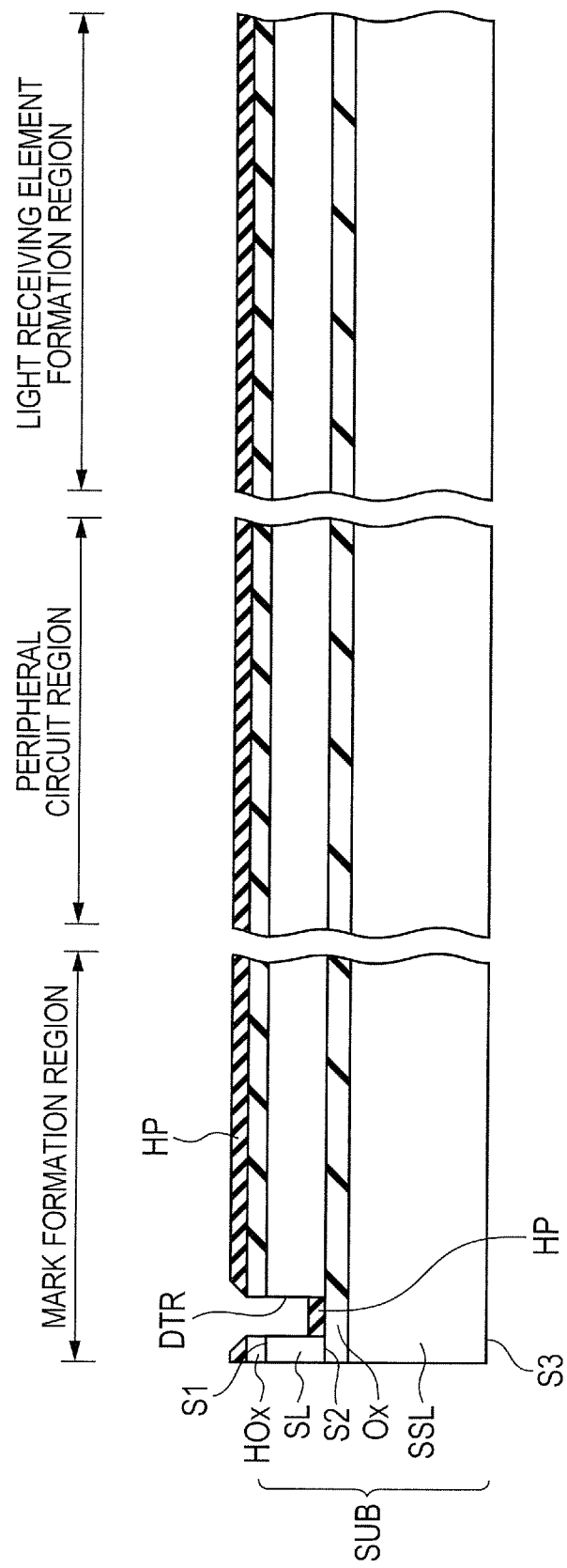
FIG. 9 is a schematic cross-sectional view showing a second step in a manufacturing method of the semiconductor device in the first embodiment.

Referring to FIG. 9, a high-density plasma insulating film HP is formed, for example, by a high density plasma CVD method so as to cover the inner bottom of the trench DTR and the upper surface of the silicon oxide film HOx. The inner bottom of the trench DTR means the bottom of the trench DTR closest to the opposed main surface S3 (expanding substantially in parallel to the opposed main surface S3).

The high-density plasma insulating film HP is a silicon oxide film containing plasma at a high density. The plasma insulating film HP preferably has a thickness of, for example, not less than 0.05 μm nor more than 0.2 μm, and more preferably, 0.1 μm by way of example. Instead of the high-density plasma insulating film HP, for example, an oxide layer may be formed only over the inner bottom of the trench DTR, for example, by a spin on dielectric (SOD) method.

The high-density plasma insulating film HP is preferably formed such that its surface, especially, at the bottom (inner bottom) of the trench DTR is positioned on the front-side main surface S1 side (upper side shown in FIG. 9) rather than the back-side main surface S2 after being formed.

Figure 10:
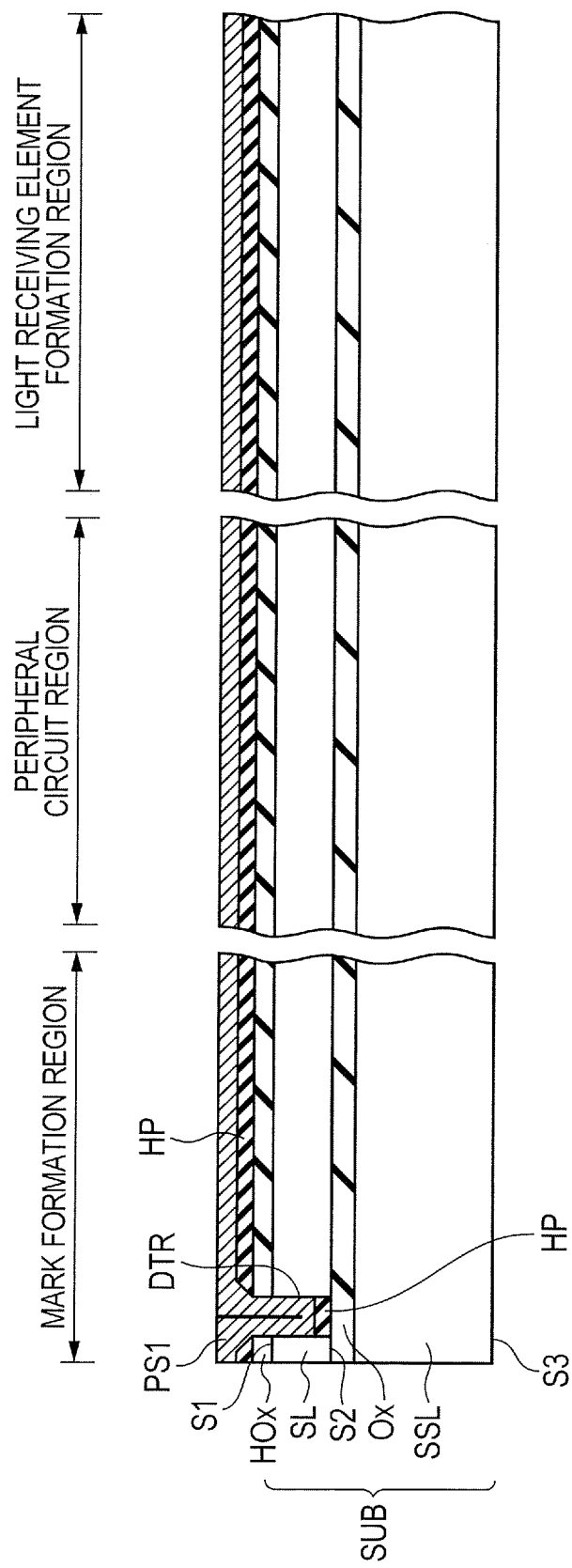
FIG. 10 is a schematic cross-sectional view showing a third step in a manufacturing method of the semiconductor device in the first embodiment.

Referring to FIG. 10, a semiconductor film (silicon thin film), such as a polycrystalline silicon layer PS1, is formed, for example, by the CVD method to cover the inner sides of the DTR, the upper surface of the high-density plasma insulating film HP in the trench DTR, and the upper surface of the high-density plasma insulating film HP over the silicon oxide film HOx. The semiconductor film includes a semiconductor thin film not containing impurities. The term "inner side" as used therein means the side of the inside of the trench DTR (extending from the front-side main surface S1 to the back-side main surface S2).

The polycrystalline silicon layer PS1 preferably has a thickness of not less than 100 nm nor more than 1 μm, and more preferably 600 nm (not less than 500 nm nor more than 700 nm) by way of example. The polycrystalline silicon layer PS1 preferably covers the inner peripheral walls (inner side and/or inner bottom) of the trench DTR to fill the inside of the trench DTR (specifically, bottom and its surroundings).

Thus, when w is the width of the trench DTR (in the lateral direction of the figure) and h is the thickness of the polycrystalline silicon layer PS1, the relationship of w≤2h is preferably satisfied, that is, the width is preferably equal to or less than twice the thickness. In this way, the trench DTR is filled with the polycrystalline silicon layer PS1, which can suppress the inconveniences including etching of an exposed part or region of the bottom or side of the inside of the polycrystalline silicon layer PS1 deposited in the trench DTR without intension in the later silicon etching step.

In performing the process by the CVD method to form the polycrystalline silicon layer PS1, for example, phosphine ($PH_3$) gas is introduced, so that n-type impurities of phosphorus (P) can be introduced into the polycrystalline silicon layer PS1 to form the polycrystalline silicon layer PS1 with the n-type impurities. Alternatively, in forming the thin film of the polycrystalline silicon layer PS1, no impurities may be introduced, and in the later step, impurities may be introduced into the polycrystalline silicon layer PS1 by using normal ion implantation.

Alternatively, instead of the polycrystalline silicon layer PS1 made of the polycrystalline silicon, a thin film made of, for example, amorphous silicon may be formed. The layer PS1 is more preferably made of material containing silicon.

Figure 11:
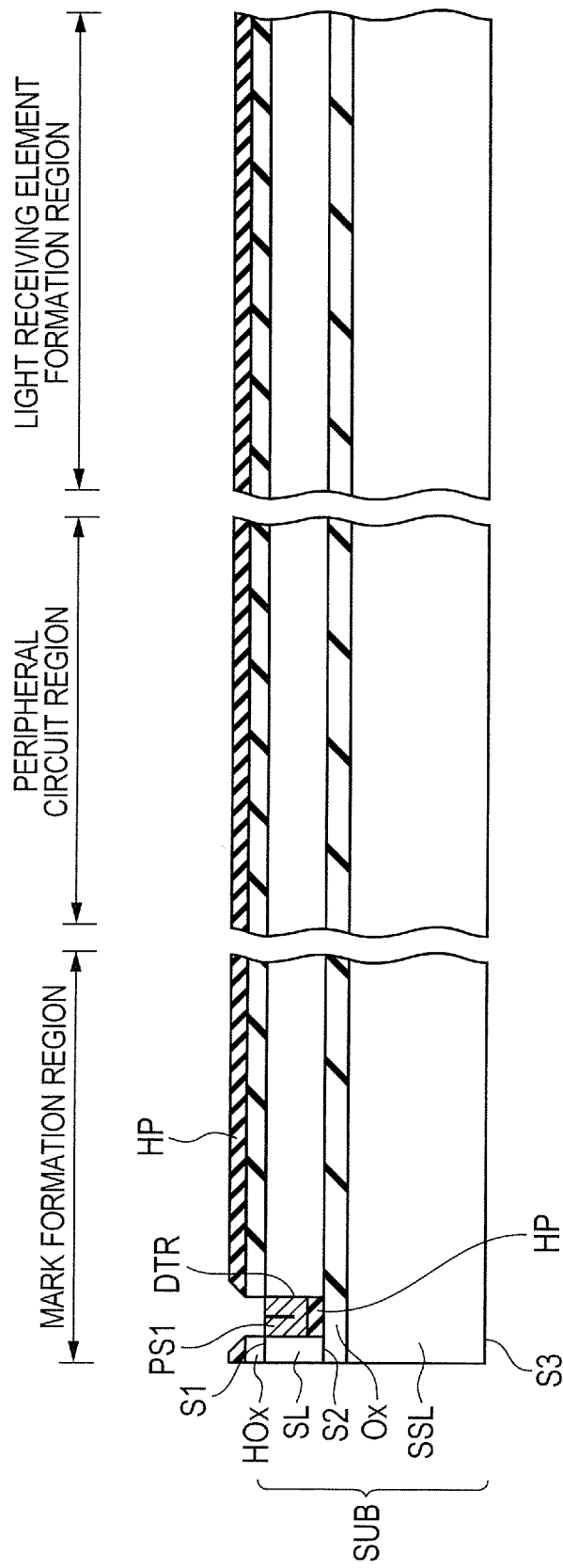
FIG. 11 is a schematic cross-sectional view showing a fourth step in a manufacturing method of the semiconductor device in the first embodiment.

Referring to FIG. 11, the polycrystalline silicon layer PS1 over the silicon oxide film HOx is etched back using a technique, such as an RIE method. Specifically, etching back of the polycrystalline silicon layer PS1 removes the polycrystalline silicon layer PS1 (specifically, located over the main surface S1, and directly over the inside of the trench DTR) except for a part of the silicon layer PS1 located in the trench DTR, while the polycrystalline silicon layer PS1 filled in the trench DTR remains in the trench. All the polycrystalline silicon layer PS1 over the main surface S1 may be removed. The polycrystalline silicon layer PS1 is etched back, by way of example, such that the front-side main surface S1 of the semiconductor layer SL is substantially at the same height at the uppermost surface of the polycrystalline silicon layer PS1 after the etching back (that is, such that the polycrystalline silicon layer PS1 remains only in the trench DTR and the trench DTR is filled with the polycrystalline silicon layer PS1). In the above etching back, the silicon oxide film HOx functions as a stopper (for the etching back).

Figure 12:
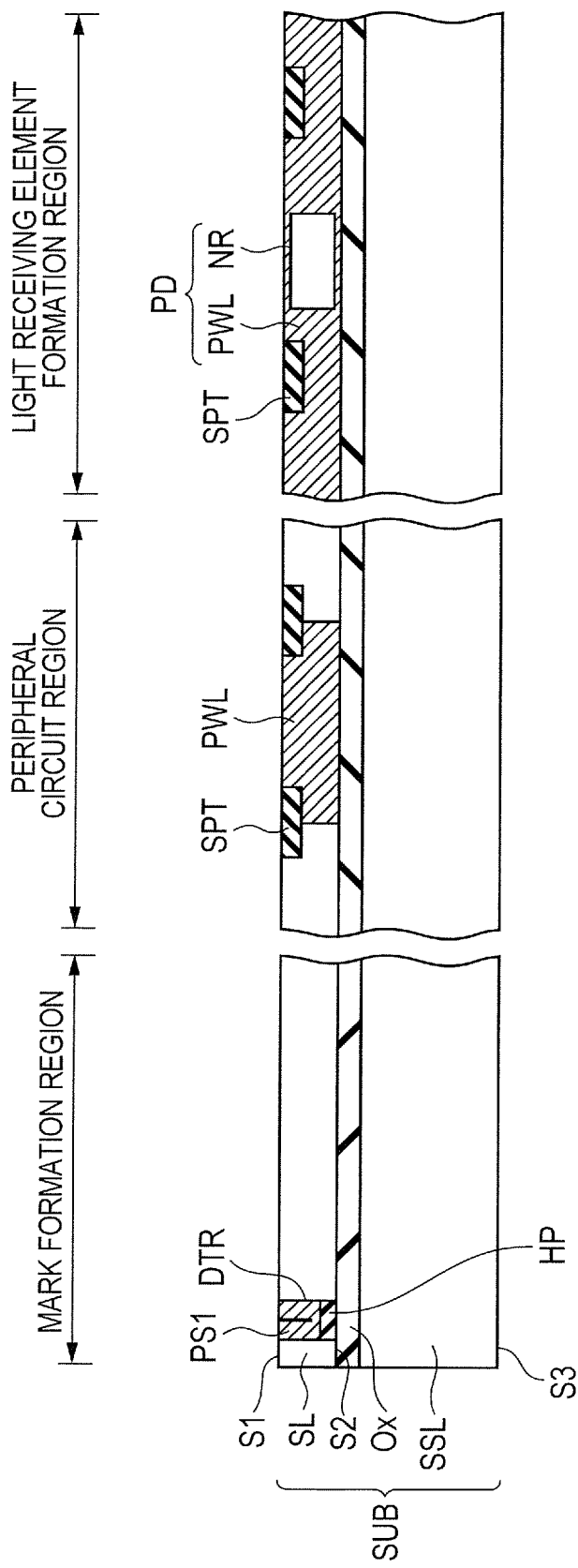
FIG. 12 is a schematic cross-sectional view showing a fifth step in a manufacturing method of the semiconductor device in the first embodiment.

Referring to FIG. 12, the silicon oxide film HOx is etched and removed by chemicals, for example, hydrofluoric acid.

Then, a plurality of element isolation regions SPT are formed spaced apart from each other in the main surface S1 especially in the light receiving element formation region and the peripheral circuit region of the semiconductor substrate SUB. Each element isolation region SPT has a function of electrically isolating the photodiodes PD. The element isolation region SPT may be formed, for example, by the so-called junction isolation or local oxidation of silicon (LOCOS) method, or the so-called shallow trench isolation (STI).

After forming the element isolation regions SPT, the p-type well region PWL of the light receiving element formation region is formed, for example, by implanting boron (B) into the semiconductor layer SL by the normal ion-implantation. The p-type well region PWL may be formed before the formation of the element isolation region SPT. Alternatively, after the formation of the p-type well region PWL, the element isolation region SPT may be formed and then another p-type well region PWL may be implanted thereinto again. At this time, a further p-type well PWL may also be formed in a region for forming the NMOS transistor in the peripheral circuit region at the same time (or in another step).

Then, in order to form the n-type region NR of the photodiode PD in the light receiving element formation region, n-type impurities, such as phosphorus (p) ions, are introduced into a predetermined region of the p-type well PWL in the light receiving element formation region by the normal ion implantation. In this way, (a plurality of) photodiodes PD are formed in the semiconductor layer SL of the light receiving element formation region. Although not shown in the figure, impurities are implanted for adjusting a threshold voltage of the NMOS transistor formed in the peripheral circuit region. Further, in order to form the n-type well region, or to adjust the threshold voltage of the PMOS transistor, impurities are implanted into the region in which the PMOS transistor is formed to provide a CMOS circuit (peripheral circuit region shown in FIG. 10).

Figure 13:
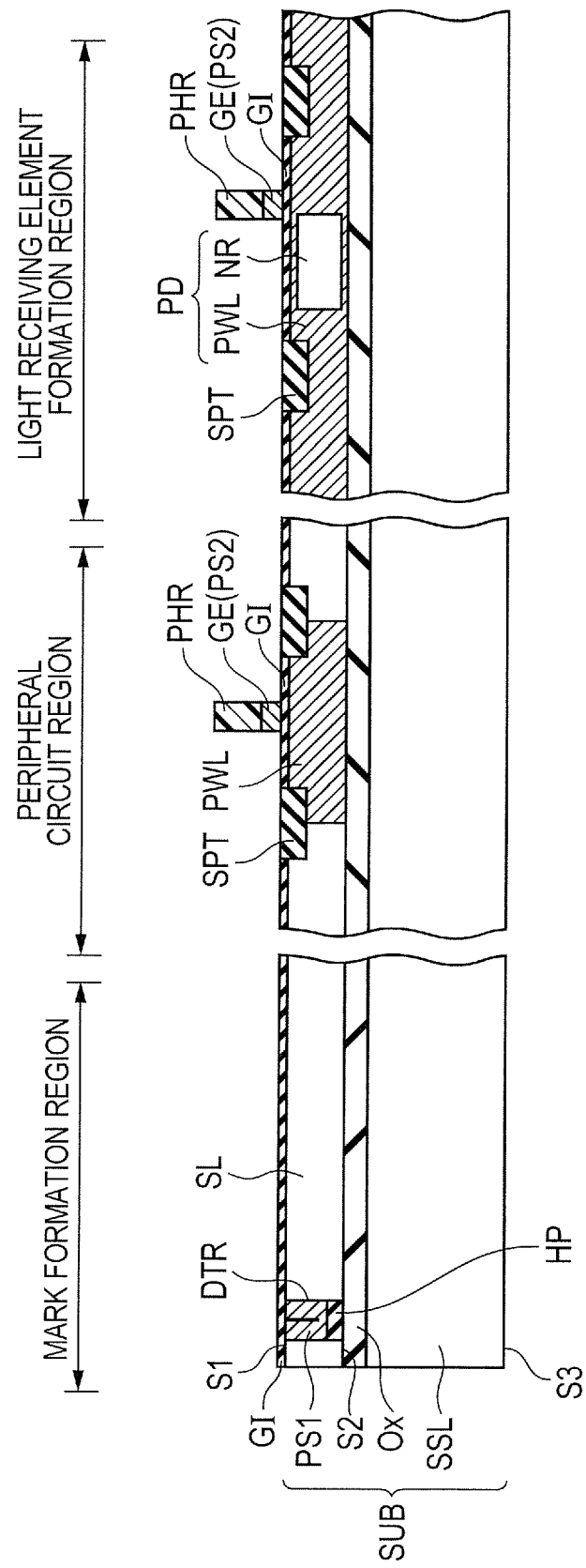
FIG. 13 is a schematic cross-sectional view showing a sixth step in a manufacturing method of the semiconductor device in the first embodiment.

Referring to FIG. 13, an insulating film GI made of a silicon oxide film is formed over the front-side main surface S1, for example, by a normal thermal oxidation method, Then, for example, a polycrystalline silicon thin film is formed to cover the front-side main surface S1 with the insulating film GI formed thereover, for example, by a CVD method. At this time, the CVD process is preferably performed, for example, by introducing phosphine ($PH_3$) gas. Thus, the polycrystalline silicon layer PS2 containing n-type impurities is formed. Instead of the polycrystalline silicon layer PS2, the so-called amorphous silicon film may be formed. Alternatively, after forming the polycrystalline silicon layer PS2 or amorphous silicon film not containing any impurities, impurities may be doped into the thus-formed thin film by the normal ion implantation.

Then, a pattern of the photoresist PHR is formed using the well-known photosensitizing agent by the normal photoengraving technique. The polycrystal silicon layer PS2 (or amorphous silicon film) is etched using the photoresist PHR as the mask to thereby form a gate electrode GE. The etching of the polycrystalline silicon layer PS2 is performed, for example, by the normal RIE method. Thereafter, the photoresist PHR (not shown) is removed.

Although not shown in the figure, impurities for forming a source region and a drain region are introduced into desired regions of the semiconductor layer SL, for example, by ion implantation, using the photoresist formed by the normal photoengraving technique as the mask. A so-called LDD (lightly doped drain) region is formed as a part of the source/drain region of the NMOS transistor. After a protective film for a sidewall spacer and a photodiode PD of the transistor is formed by the CVD method, the impurities introduced by the normal thermal oxidation are activated to form the source/drain region. The source/drain region and the sidewall spacer are not shown in the figure.

A plurality of transfer transistors TG (see FIG. 7) each are formed of the photodiode PD (source region), the drain region, the gate electrode GE, and the gate insulating film GI in the light receiving element formation region.

Figure 14:
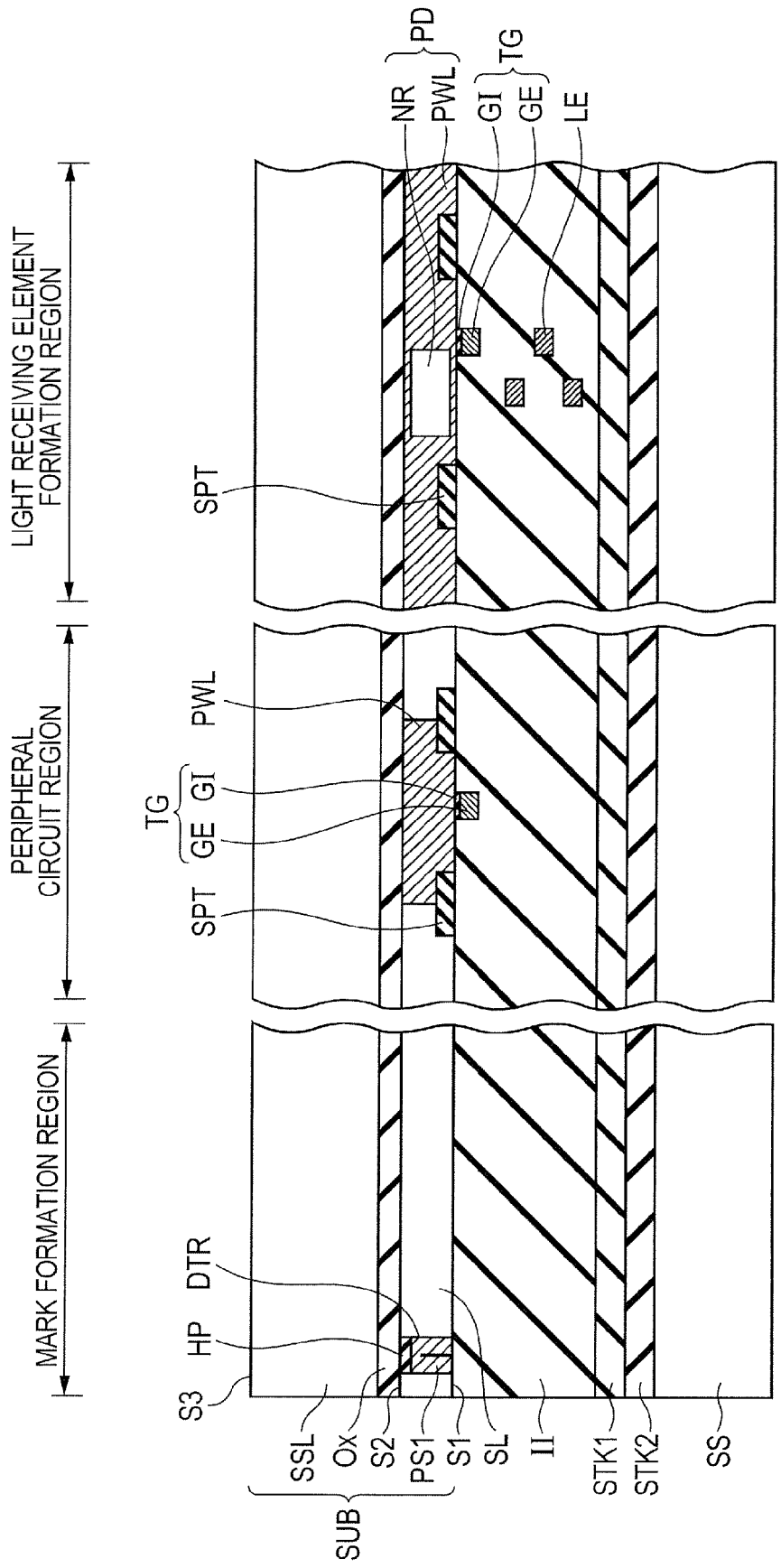
FIG. 14 is a schematic cross-sectional view showing a seventh step in a manufacturing method of the semiconductor device in the first embodiment.

Referring to FIG. 14, metal wirings LE and an interlayer insulating layer II are formed in desired positions using a normal multilayer wiring formation process. The metal wiring LE is formed as a metal thin film made of, for example, aluminum. The interlayer insulating layer II is made of, for example, a silicon oxide film. The uppermost surface of the interlayer insulating layer II is polished, for example, by a chemical mechanical polishing (CMP) to be flat.

Then, the bonded layer STK1 is formed of, for example, a silicon oxide film over the uppermost surface of the interlayer insulating layer II flatly polished, for example, by the CMP. The bonded layer STK1 is the silicon oxide film formed over the uppermost surface of the interlayer insulating layer II, for example, by the plasma CVD method.

Aside from the semiconductor substrate SUB, a support substrate SS made of, for example, single crystal silicon containing n-type impurities is provided. The bonded layer STK2 is formed of, for example, a silicon oxide film over one main surface of the support substrate SS in the same way as the bonded layer STK1. Both the bonded layer STK1 and the bonded layer STK2 are bonded together by the normal bonding technique while being brought into contact with each other so as to be opposed to each other. After the bonding of both the bonded layers STK1 and STK2, the lamination of the layers is turned upside down.

Figure 15:
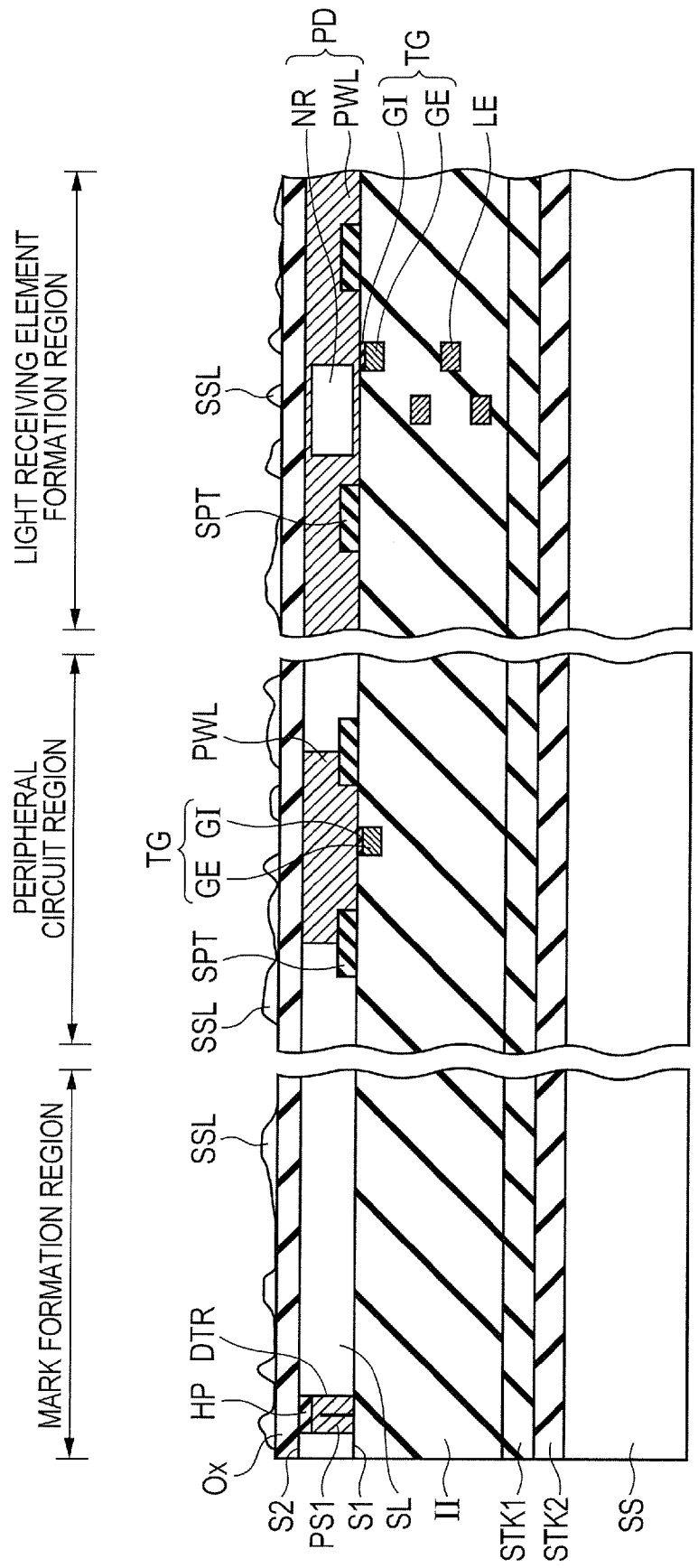
FIG. 15 is a schematic cross-sectional view showing an eighth step in a manufacturing method of the semiconductor device in the first embodiment.
Figure 16:
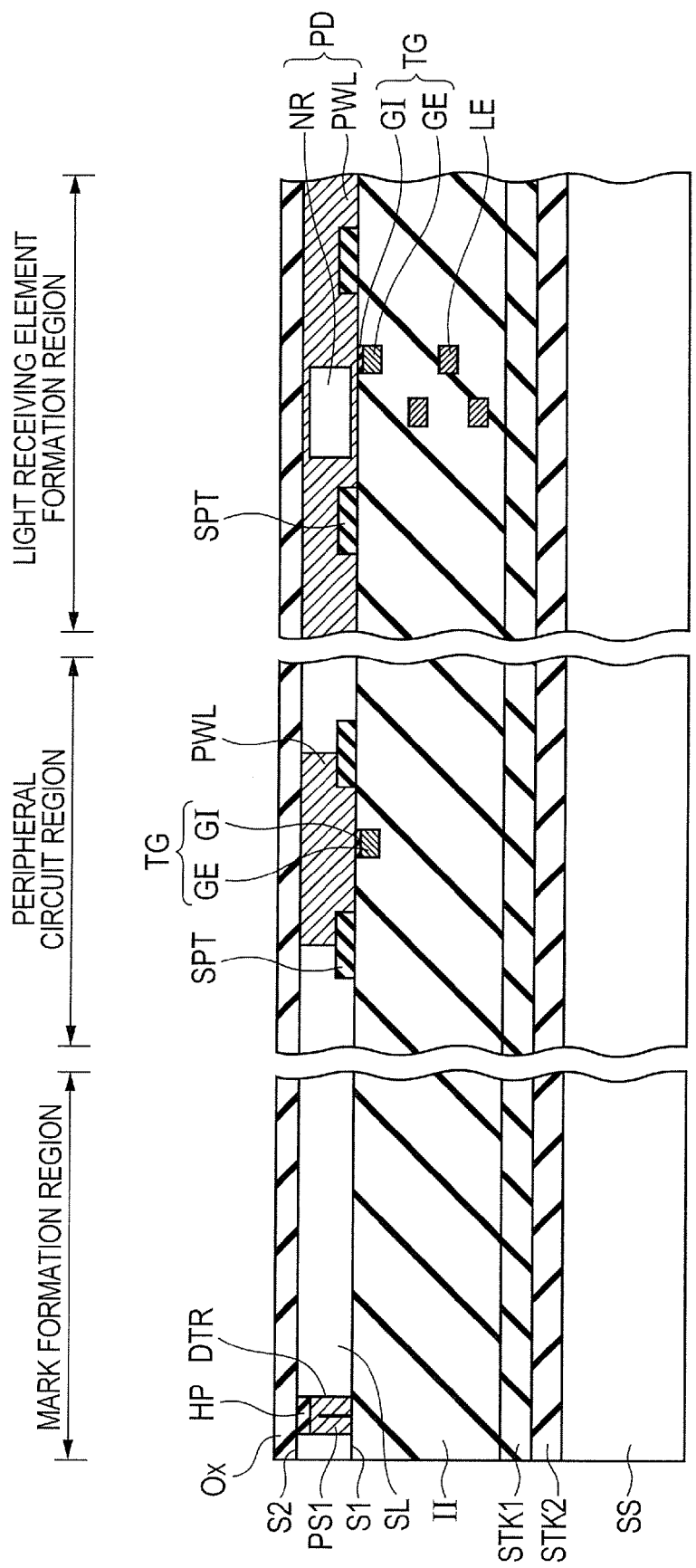
FIG. 16 is a schematic cross-sectional view showing a ninth step in a manufacturing method of the semiconductor device in the first embodiment.

Referring to FIGS. 15 and 16, the base substrate SSL is polished and removed from the main surface S3 (in other words, from the main surface S3 to the upper surface of the insulating layer Ox) as a starting point such that at least an upper surface of the insulating layer Ox is exposed. The term "upper surface of the insulating layer Ox" as used herein means a surface (uppermost surface shown in FIG. 15) of the insulating layer Ox closest to the main surface S3.

The base substrate SSL is removed, for example, by performing the following steps in that order. Referring to FIG. 15, the base substrate SSL is removed by a normal grinding process (crude processing). Then, the removal processing of the base substrate SSL is further performed by the CMP such that the processed surface becomes flatter with higher accuracy as compared to the above crude processing.

Even after these processes are finished, as shown in FIG. 15, the remains of the base substrate SUB can be left. Referring to FIG. 16, after the above grinding process, the remains of the base substrate SSL are subjected to the normal wet etching with an alkaline solution, so that the base substrate SSL can be completely removed, which exposes the surface of the insulating layer Ox having a higher level of flatness. At this time, the insulating layer Ox serves as an etching stopper.

Figure 17:
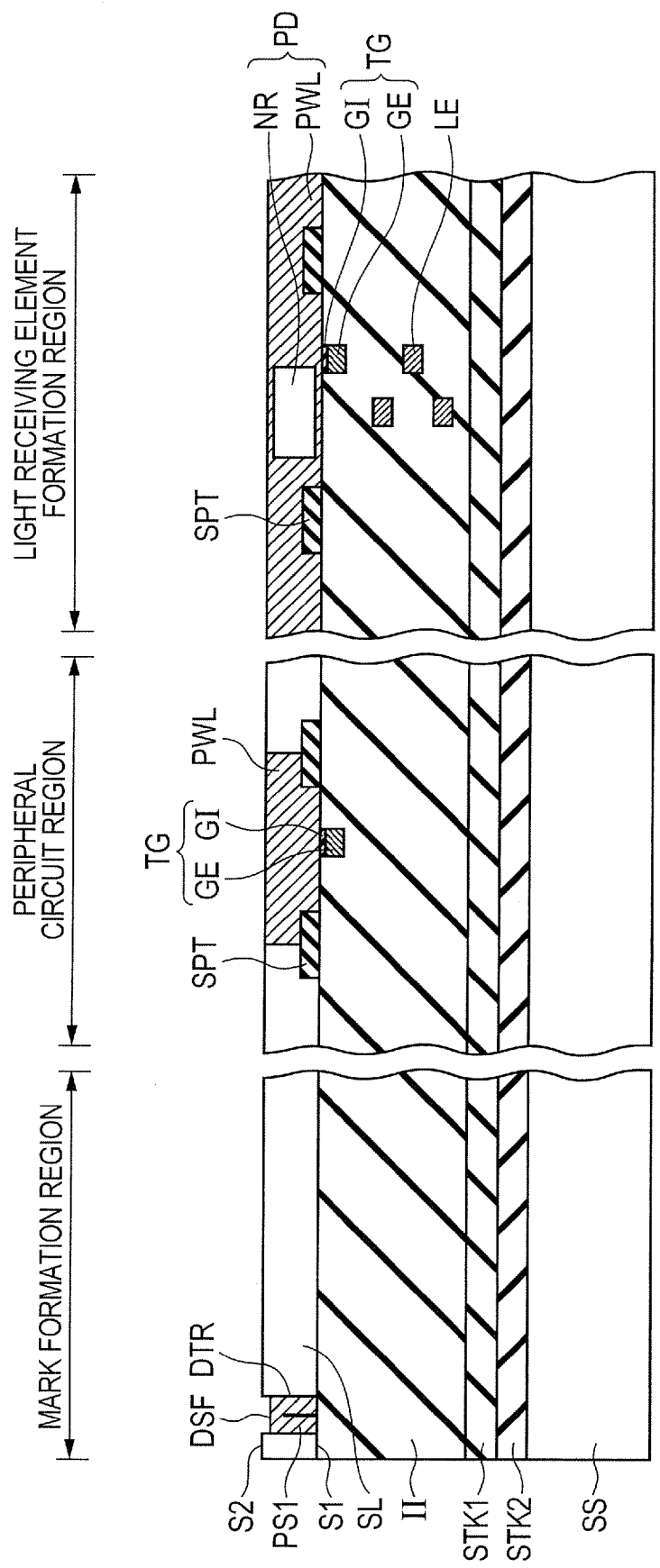
FIG. 17 is a schematic cross-sectional view showing a tenth step in a manufacturing method of the semiconductor device in the first embodiment.

Referring to FIG. 17, the insulating layer Ox made of a silicon oxide film, and the high-density plasma insulating film HP made of a silicon oxide film and covering the inner bottom of the trench DTR are removed by etching with a hydrofluoric acid-based chemical. By the above processes, only the polycrystalline silicon layer PS1 remains in the trench DTR, and the polycrystalline silicon layer PS1 forms a stepped portion with respect to the back-side main surface S2 such that the deeply located surface DSF is exposed on the front-side main surface S1 rather than the back-side main surface S2.

The polycrystalline silicon layer PS1 inside the trench DTR extends in the direction from the front-side main surface S1 toward the back-side main surface S2, and has the deeply located surface DSF recessed toward the front-side main surface S1 with respect to the back-side main surface S2, whereby the mark MK is formed with the stepped portion against the back-side main surface S2. The reason why the mark MK has the stepped portion with respect to the back-side main surface S2 is that the high-density plasma insulating film HP is formed to cover the inner bottom of the trench DTR.

Except for the regions with the marks MK, the back-side main surface S2 is exposed. In the steps shown in FIGS. 15 to 17, the region of the semiconductor substrate SUB from the opposed main surface S3 to the back-side main surface S2 is removed.

Figure 18:
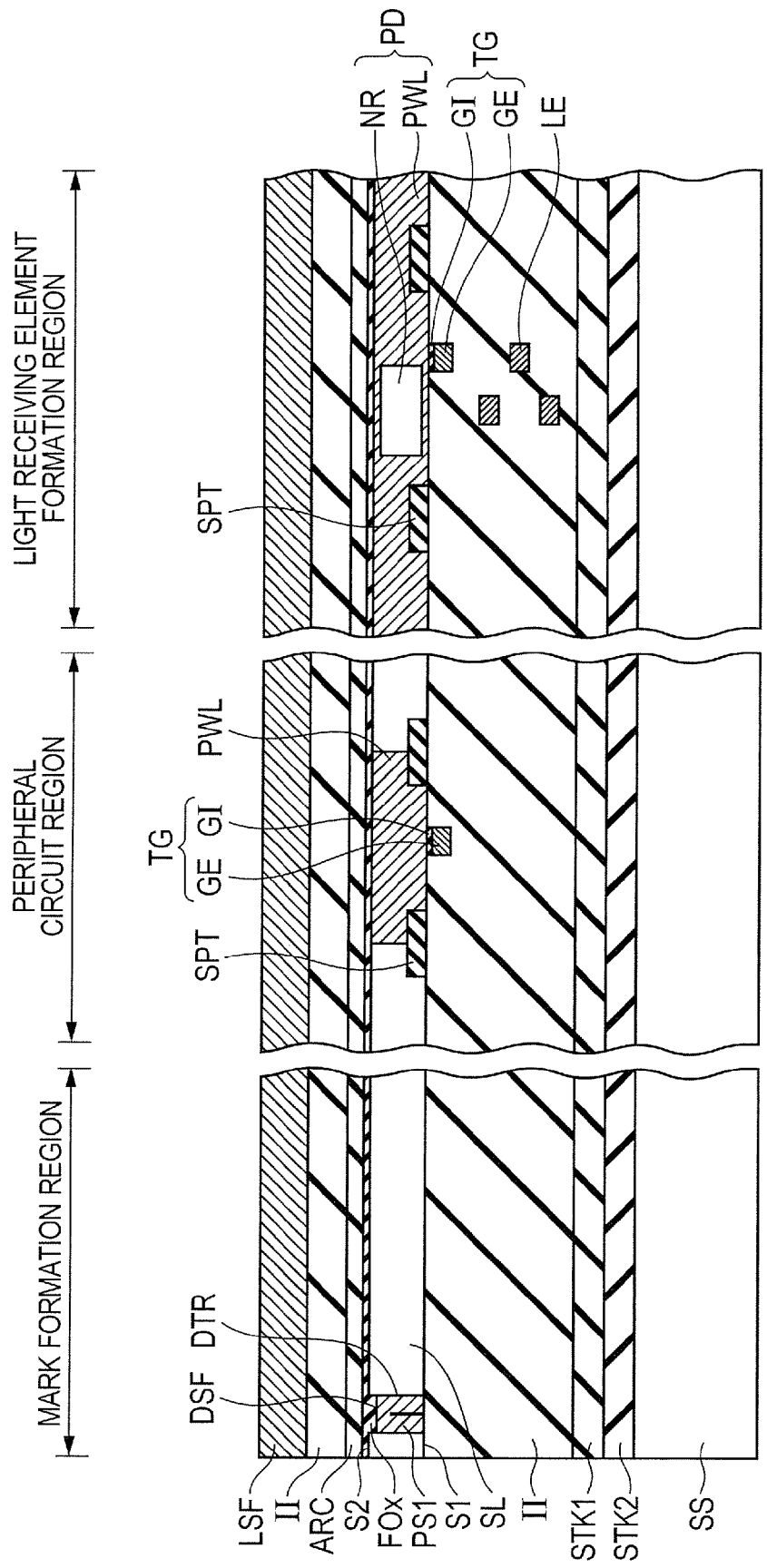
FIG. 18 is a schematic cross-sectional view showing an eleventh step in a manufacturing method of the semiconductor device in the first embodiment.

Referring to FIG. 18, first, a thin silicon oxide film FOx is formed so as to cover the deeply located surface DSF of the mark MK and the back-side main surface S2. Then, a reflection preventing film ARC, the interlayer insulating layer II, and the light shielding film LSF are laminated in that order to cover the thin silicon oxide film FOx.

The reflection preventing film ARC is sandwiched between the thin silicon oxide film FOx and the interlayer insulating layer II made of a silicon oxide film. The reflection preventing film ARC is formed of a material whose reflective index is an intermediate value between a reflective index of the single crystal silicon and a reflective index of the silicon oxide film. For example, the reflection preventing film is a silicon nitride film, a metal oxide film, or the like.

For example, without the reflection preventing film ARC, the difference in reflective index among the interlayer insulating layer II, the thin silicon oxide film FOx (silicon oxide film), and the semiconductor layer SL (single crystal silicon) thereunder causes the light entering these regions to reflect at a high ratio. However, the reflection preventing film is formed of material, for example, a silicon nitride film, whose reflective index takes an intermediate value between those of the silicon oxide film and the single crystal silicon, which can decrease the above reflection ratio. This arrangement allows the desired light to more effectively enter the photodiode PD.

The light shielding film LSF is formed to suppress the light to break in, especially, the peripheral circuit region as mentioned above. The film LSF is a thin film made of material with a light shielding property against the light applied to the photodiode PD, for example, an aluminum thin film or a tungsten thin film.

Figure 19:
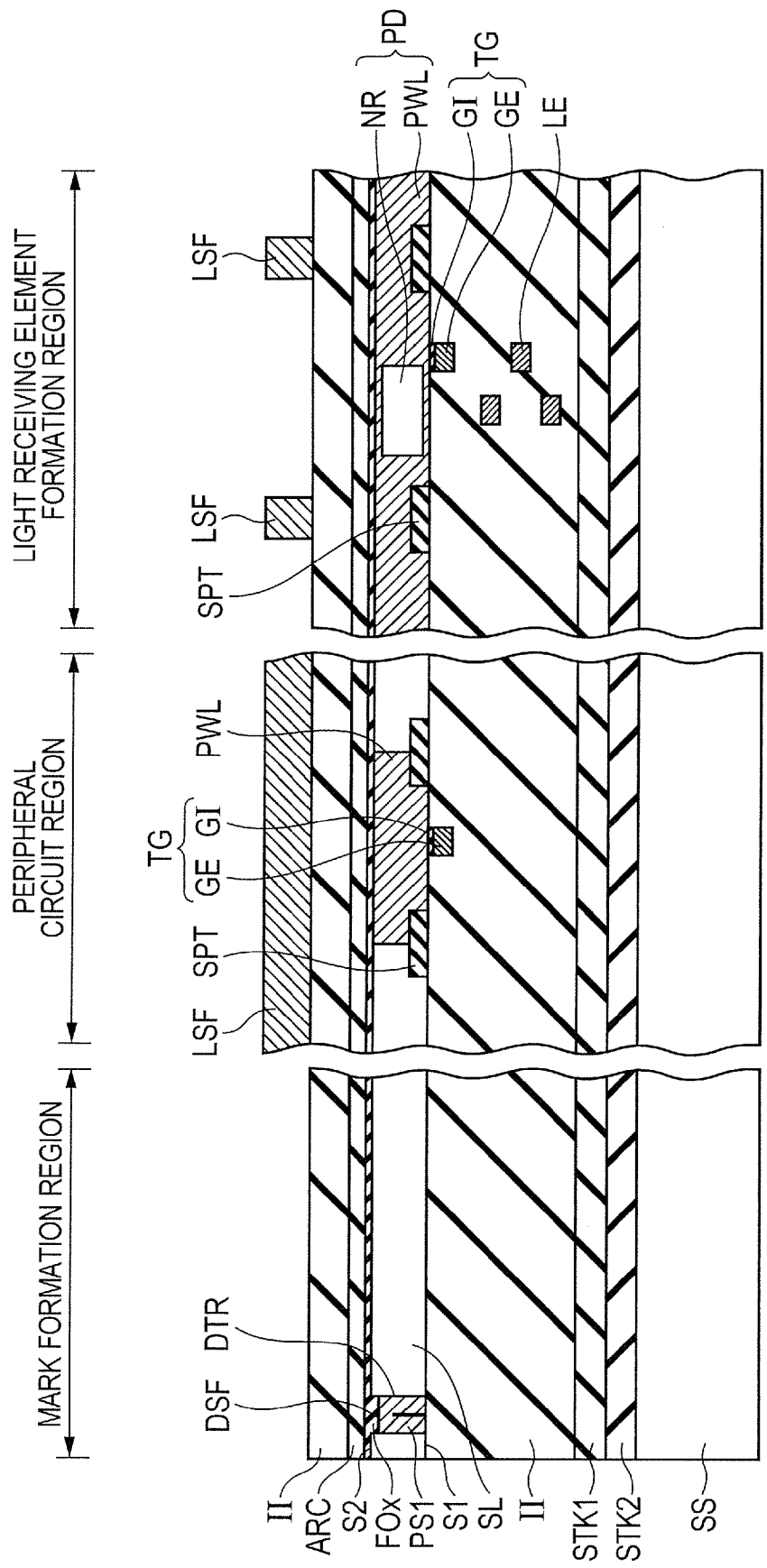
FIG. 19 is a schematic cross-sectional view showing a twelfth step in a manufacturing method of the semiconductor device in the first embodiment.

Referring to FIG. 19, the light shielding film LSF has a pattern positioned only near the transistors TG of the peripheral circuit region and the photodiodes PD of the light receiving element formation region by the normal photoengraving and etching techniques.

Figure 20:
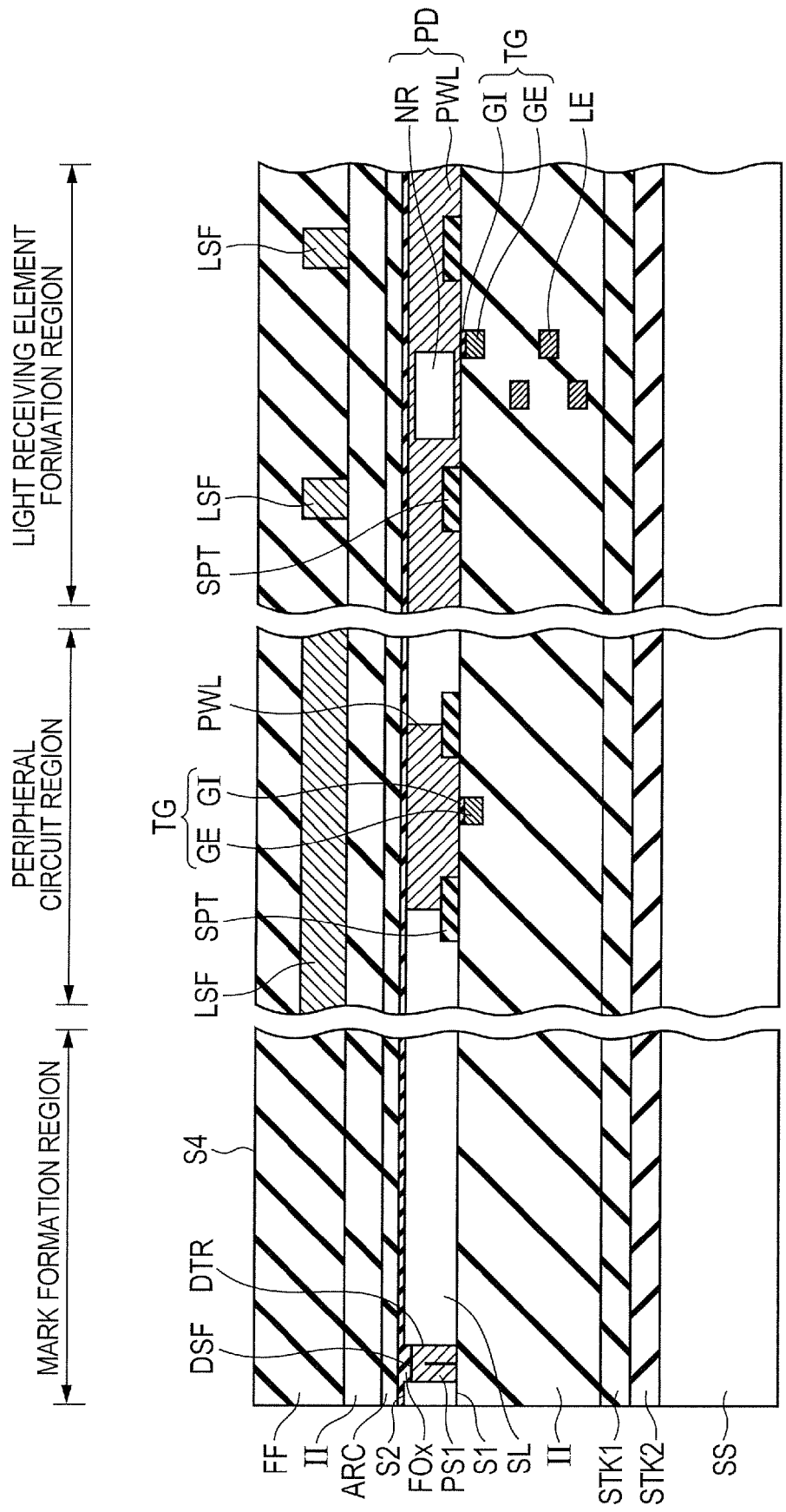
FIG. 20 is a schematic cross-sectional view showing a thirteenth step in a manufacturing method of the semiconductor device in the first embodiment.

Referring to FIG. 20, the planarized layer FF is formed to cover the interlayer insulating layer II and the light shielding film LSF formed in the steps up to FIG. 19. The planarized layer FF is formed, for example, by applying a silicon oxide film for application, such as a Spin On Glass (SOG), to upper surfaces of the interlayer insulating layer II and the light shielding film LSF, and by rotating the substrate with the silicon oxide film. After the above rotation, the thus-formed planarized layer FF has a flat upper surface S4 with less irregularities.

As shown in the schematic cross-sectional view of the semiconductor device DEV of FIG. 7, the planarized layer FF is formed to cover the back-side main surface S2 of the semiconductor substrate SUB and the deeply located surface DSF of the mark MK. The planarized layer FF shown in FIG. 7 is simply illustrated as a combination of the thin silicon oxide film FOx, the reflection preventing film ARC, the interlayer insulating layer II, the light shielding film LSF, and the planarized layer FF shown in FIG. 20.

At this time, the deeply located surface DSF is formed to be recessed toward the front-side main surface S1 with respect to the back-side main surface S2. The planarized layer FF shown in FIG. 20 (which includes both the respective layers formed as shown in FIG. 18 and the planarized layer FF formed in the step shown in FIG. 20, and which is the same as the planarized layer FF shown in FIG. 7) is formed to have the flat upper surface. Thus, the planarized layer FF (see FIG. 7) in contact with the upper surface of the deeply located surface DSF is preferably thicker than the planarized layer FF in contact with an upper part of a region except for the marks MK (for example, back-side main surface S2 directly above the photodiode PD).

Figure 21:
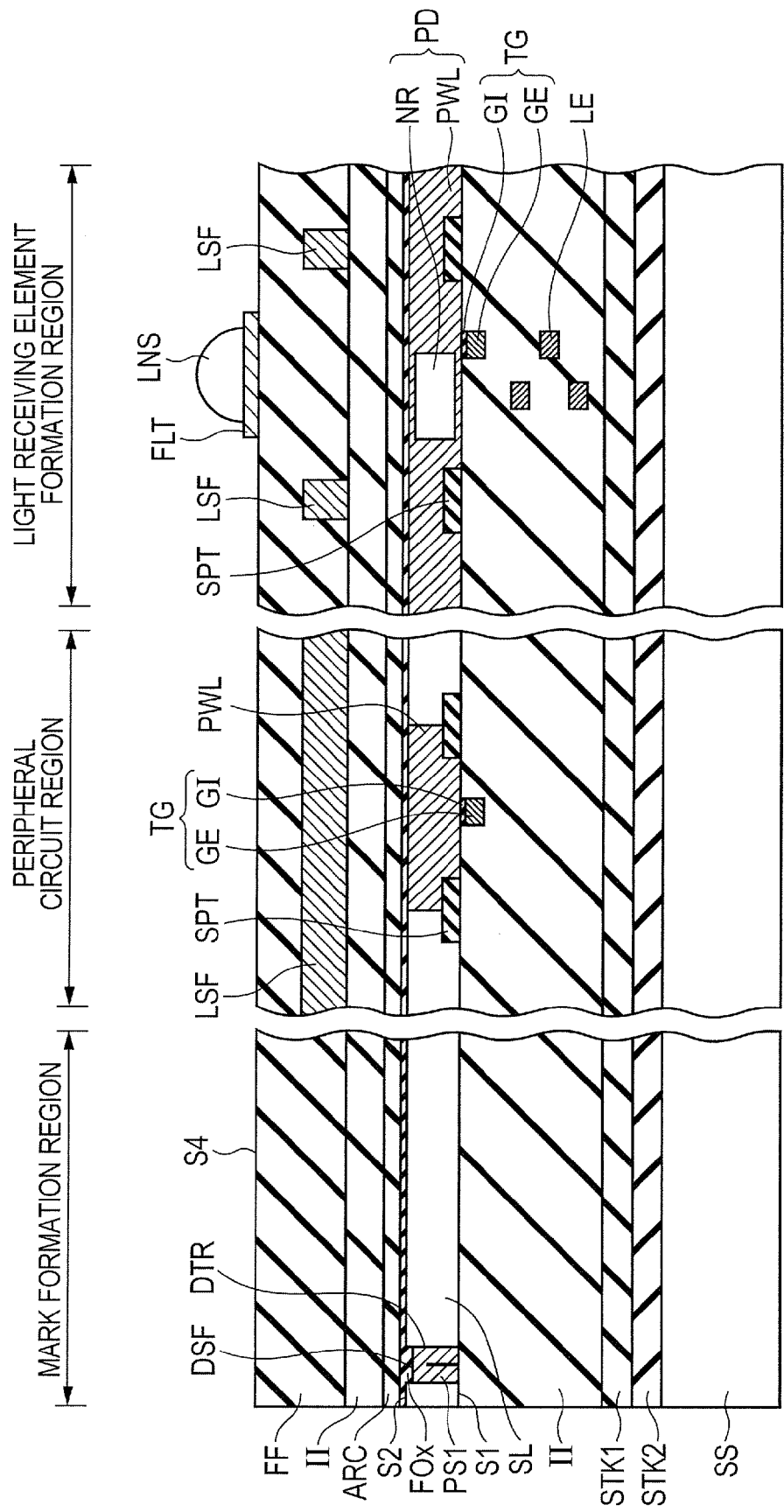
FIG. 21 is a schematic cross-sectional view showing a fourteenth step in a manufacturing method of the semiconductor device in the first embodiment.

Referring to FIG. 21, the color film FLT and the on-chip lens LNS are formed over an upper surface S4 of the planarized layer FF in the light receiving element formation region. The alignment of these elements is adjusted by viewing the mark MK from above the planarized layer FF. Thus, each on-chip lens LNS is formed as a light receiving lens in such a position as to be planarly superimposed over the photodiode PD in the light receiving element formation region.

Now, the operation and effects of this embodiment will be described below. First, for example, in this embodiment, the mark MK (whole mark) inside the semiconductor layer SL (inside the trench DTR) is formed of the same silicon as that of the semiconductor layer SL. Thus, a difference in coefficient of thermal expansion between the semiconductor layer SL and the mark MK is set small. The arrangement can reduce the inconveniences, including the generation of compression stress (thermal stress) in the semiconductor layer SL near the mark due to the abnormal expansion of the volume of the mark MK in the heat treatment during the process of the semiconductor device DEV. As a result of reducing the compression stress (thermal stress), the generation of crystal defects of the single crystal silicon included in the semiconductor layer SL can be suppressed, which can also suppress the leakage of current or breakdown voltage due to the defects.

For example, when the silicon oxide film or silicon nitride film is embedded in the trench formed of silicon in the semiconductor layer to form the mark optically viewable from the back side, the mark can be identified using the difference in optical properties, that is, reflective index and reflectance between the semiconductor layer and the mark. In this case, however, the material of the semiconductor layer is different from that of the mark, which can cause the above compression stress (thermal stress). Such compression stress can cause crystal defects, such as laminated layer defects, in the single crystal silicon included in the semiconductor layer near the mark, and thus might possibly cause the leakage of current or breakdown voltage in the solid-state imaging element. This embodiment (structure shown in FIG. 7), however, can suppress the above troubles.

FIGS. 22A and 22B each show schematic cross-sectional views of the form in which the base substrate SSL in FIG. 16 is removed from the region of the semiconductor device DEV shown in FIG. 7 (for example, these figures omit the illustration of some components, including the metal wiring LE and the high-density plasma insulating film HP). Referring to FIG. 22B, like FIG. 7, the mark MK has the deeply located surface DSF recessed toward the front-side main surface S1 with respect to the back-side main surface S2 of the semiconductor layer SL. In contrast, referring to FIG. 22A, the mark MK has a protrusion PR that protrude toward the upper surface S5 with respect to the back-side main surface S2 of the semiconductor layer SL to reach the inside of the insulating film Ox.

In this point, FIGS. 22A and 22B differ from each other, but are the same in other points. For example, in each of FIGS. 22A and 22B, the semiconductor layer SL is formed of single crystal silicon, and the mark MK is formed of material containing silicon, such as polycrystalline silicon.

As mentioned above, in this embodiment, in the step shown in FIG. 16, the base substrate SSL is removed on stages to expose the insulating layer Ox to the outside. If some defects are generated in the insulating layer Ox located near the region finally serving as the mark MK within the trench DTR, the alkaline solution for wet etching penetrates the inside of the insulating layer Ox through the defects to expose the insulating layer Ox.

The alkaline solution penetrating the inside of the insulating layer Ox is used to perform wet etching on the polycrystalline silicon layer PS1 in the trench DTR and the semiconductor layer SL near the layer, which might disadvantageously form defective parts in the semiconductor layer SL and mark MK.

The above conveniences of the mark MK or semiconductor layer SL tend to be caused especially in the mark MK shown in FIG. 22A. This is because a distance from the protrusion PR to the upper surface S5 of the insulating layer Ox in the mark MK is so short as shown in FIG. 22A that the alkaline solution entering from the upper surface S5 easily penetrates in the mark MK from the protrusion PR.

In contrast, when the uppermost surface DSF of the mark MK is recessed toward the front-side main surface S1 rather than the back-side main surface S2 as shown in FIG. 22B, a distance from the deeply located surface DSF to the upper surface S5 becomes long as compared to the case shown in FIG. 22A, which increases the thickness of the silicon oxide film directly above the mark MK (insulating layer Ox and the high-density plasma insulating film HP (not shown)). The silicon oxide film directly above the mark MK is thicker than the silicon oxide film in regions (for example, over the photodiode PD) other than the region directly above the mark MK.

Even if the alkaline solution penetrates the inside of the insulating layer Ox from above the upper surface S5, this embodiment can reduce the possibility for the solution to reach the mark MK. Accordingly, the use of the mark MK in this embodiment can suppress the damage on the mark MK which might be caused by the erosion of the defect by a wet etching solution.

The deeply located surface DSF of the mark MK in this embodiment is covered with the thin silicon oxide film FOx as a deeply located surface coating layer. Thus, the thin silicon film FOx and the planarized layer FF thereover also serve to protect the marks MK against the erosion in steps following the step shown in FIG. 18 for forming these layers, especially, even when the semiconductor device DEV is completed and actually used.

The trench DTR in this embodiment is formed to penetrate the semiconductor layer SL from the front-side main surface S1 to the back-side main surface S2 in the direction from the front-side main surface S1 to the back-side main surface S2. As a result, the stepped portions are formed by the deeply located surface DSF and the back-side main surface S2, and by the edges of the trench DTR.

Thus, the edges of the trench DTR are planarly viewed, whereby the stepped portion between the main surface S2 and the deeply located surface DSF can be easily identified. Even if the mark MK and the semiconductor layer SL are formed of silicon and the mark MK is formed to fill in the semiconductor layer SL, the mark MK can be easily identified.

Second Embodiment

This embodiment differs from the first embodiment in structure of the mark MK. Now, a semiconductor device of this embodiment will be described below with reference to FIG. 23.

Figure 23:
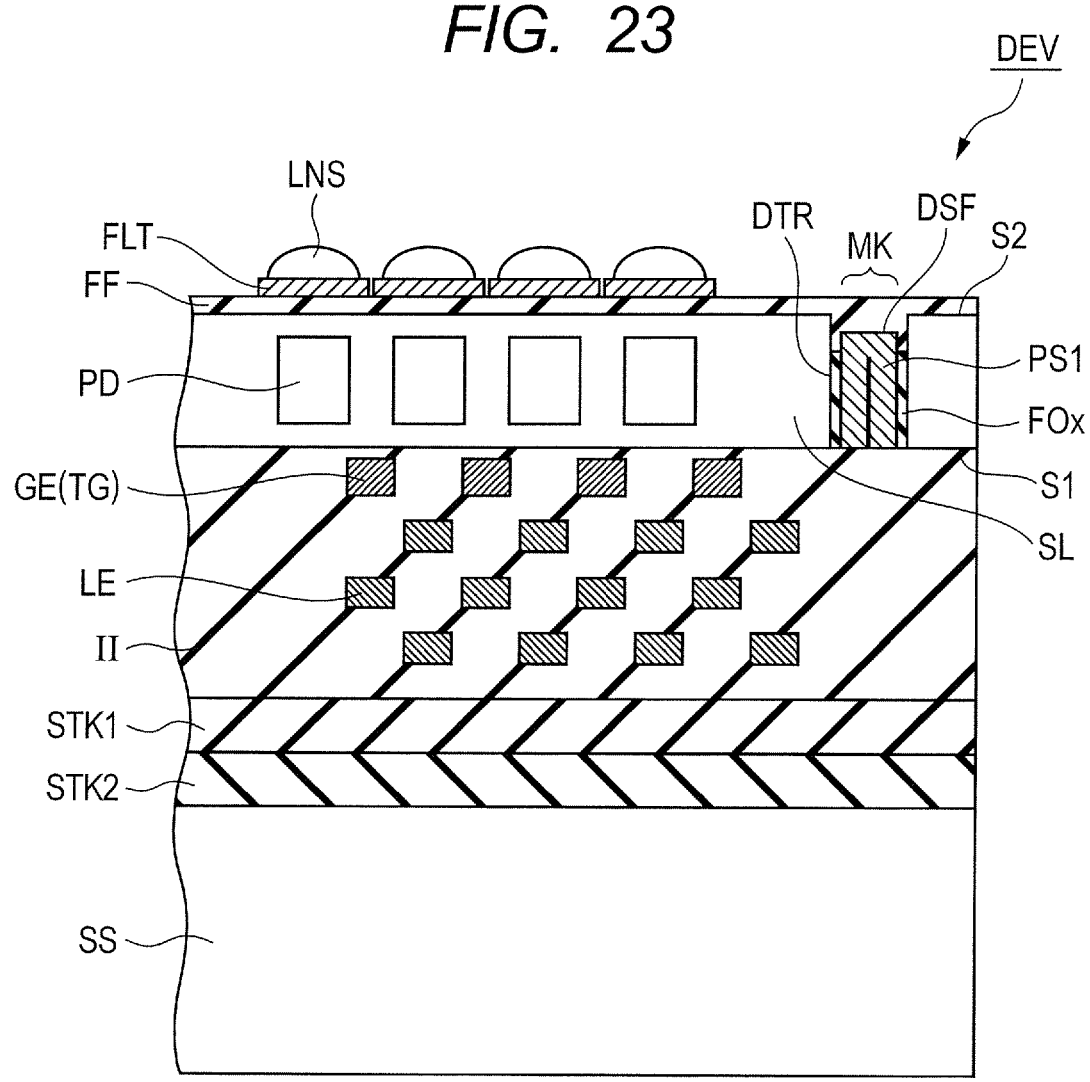
FIG. 23 is a schematic cross-sectional view showing the form of a light receiving element formation region with photodiodes and transistors formed therein, and a mark formation region with the marks formed therein in a semiconductor device according to a second embodiment of the invention.

Like FIG. 7, FIG. 23 totally shows a single diagram of a combination of the light receiving element in the light receiving element formation portion, and a mark in the mark formation portion. Referring to FIG. 23, the semiconductor device DEV of the second embodiment basically has the same structure as that of the semiconductor device DEV of the first embodiment. The mark MK covers a first region including the polycrystalline silicon layer PS1, and a second region including a thin silicon oxide film $FO_x$ covering at least a part of the sides of the polycrystalline silicon layer PS1.

Specifically, the mark MK is disposed in the trench DTR, and includes the first region formed of the polycrystalline silicon layer PS1 and extending from the front-side main surface S1 to the back-side main surface S2, and the second region formed of the silicon oxide film $FO_x$. The first region (polycrystalline silicon layer PS1) extends from the front-side main surface S1 as a starting point to the deeply-positioned surface DSF as an end point.

The thin silicon oxide film FOx is formed as the second region so as to cover the region extending from the front-side main surface S1 to a region slightly before the deeply located surface DSF (that is, a region near the front-side main surface S1, of the sides of the polycrystalline silicon layer PS1) among the outer sides extending from the front-side main surface S1 to the deeply located surface DSF in the first region. The thin silicon oxide film FOx is preferably, for example, a tetraethyl orthosilicate (TEOS) oxide film, but is not limited thereto. The second region is not limited to a silicon oxide film, and may be formed of other insulating materials, such as a silicon nitride film.

As shown in FIG. 23, the thin silicon oxide film $FO_x$ is formed to cover some regions of the sides extending from the front-side main surface S1 to the deeply located surface DSF of the polycrystalline layer PS1 (that is, except for the sides near the deeply located surface DSF). The thin silicon oxide film FOx may be formed to cover the entire sides of the polycrystalline silicon layer PS1.

Like the first embodiment, the planarized layer FF which is simply illustrated in FIG. 23 is actually a combination of the thin silicon oxide film FOx, the reflection preventing film ARC, the interlayer insulating layer II, the light shielding film LSF, and the planarized layer FF (see FIG. 20). The planarized layer FF is formed to cover the back-side main surface S2 and the marks MK. That is, the planarized layer FF is formed to cover the polycrystalline silicon layer PS1 and the thin silicon oxide film FOx.

Thus, the planarized layer FF in contact with an upper part of the deeply located surface DSF (mark MK) is preferably thicker than the planarized layer FF in contact with an upper part of the region other than the mark MK (for example, the back-side main surface S2 directly above the photodiode PD).

The structure shown in FIG. 23 differs from the structure shown in FIG. 7 in the above respective points, but is the same in other points, and thus the description thereof will not be repeatedly described below.

Now, referring to FIGS. 24 to 28, a manufacturing method of the semiconductor device DEV according to this embodiment, especially, a manufacturing method of the mark MK will be described.

Figure 24:
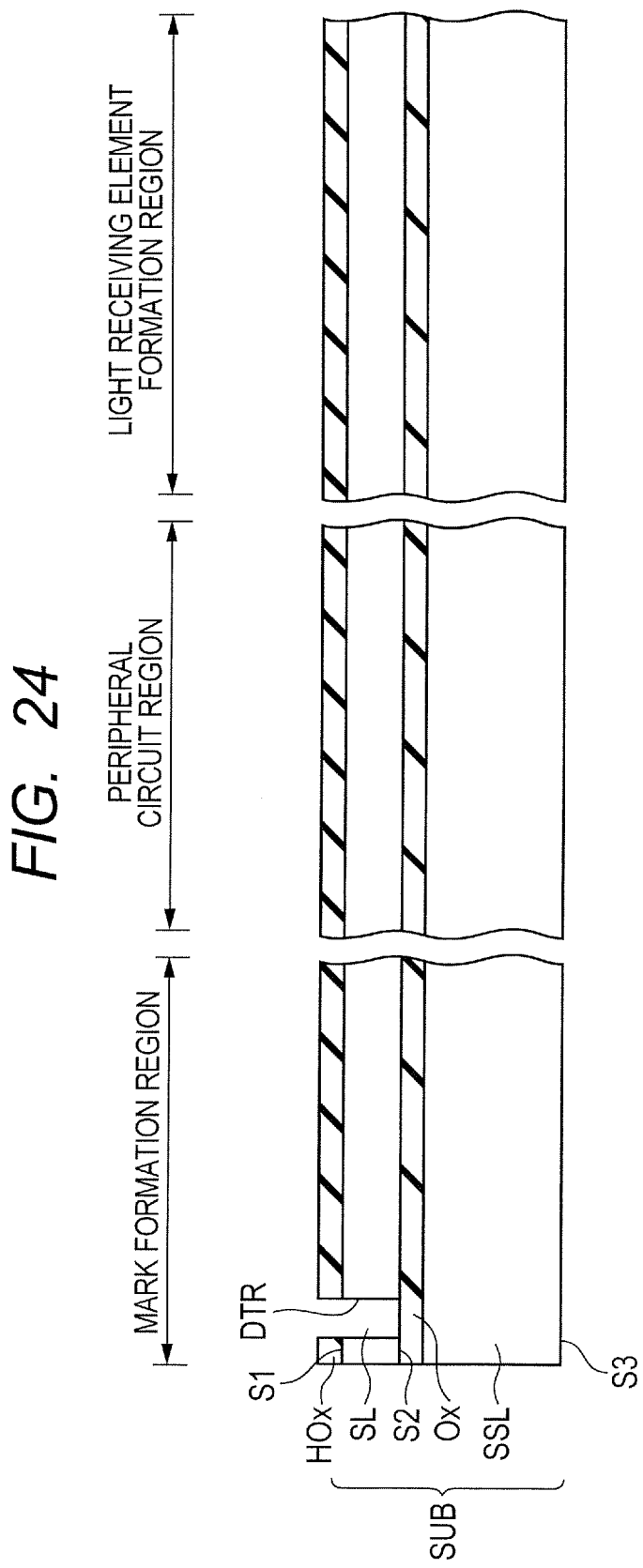
FIG. 24 is a schematic cross-sectional view showing a first step in a manufacturing method of the semiconductor device in the second embodiment.

Referring to FIG. 24, the semiconductor substrate SUB is provided as the so-called SOI substrate which is the same as that shown in FIG. 8, and each trench DTR is formed. The trench DTR is formed by the same etching as that in the step shown in FIG. 8. In forming the trench DTR, the etching is preferably performed such that the trench DTR substantially reaches the back-side main surface S2 (or substantially stops the back-side main surface S2). Thus, the inner bottom of the trench DTR is substantially at the same height as (flush with) the back-side main surface S2.

Figure 25:
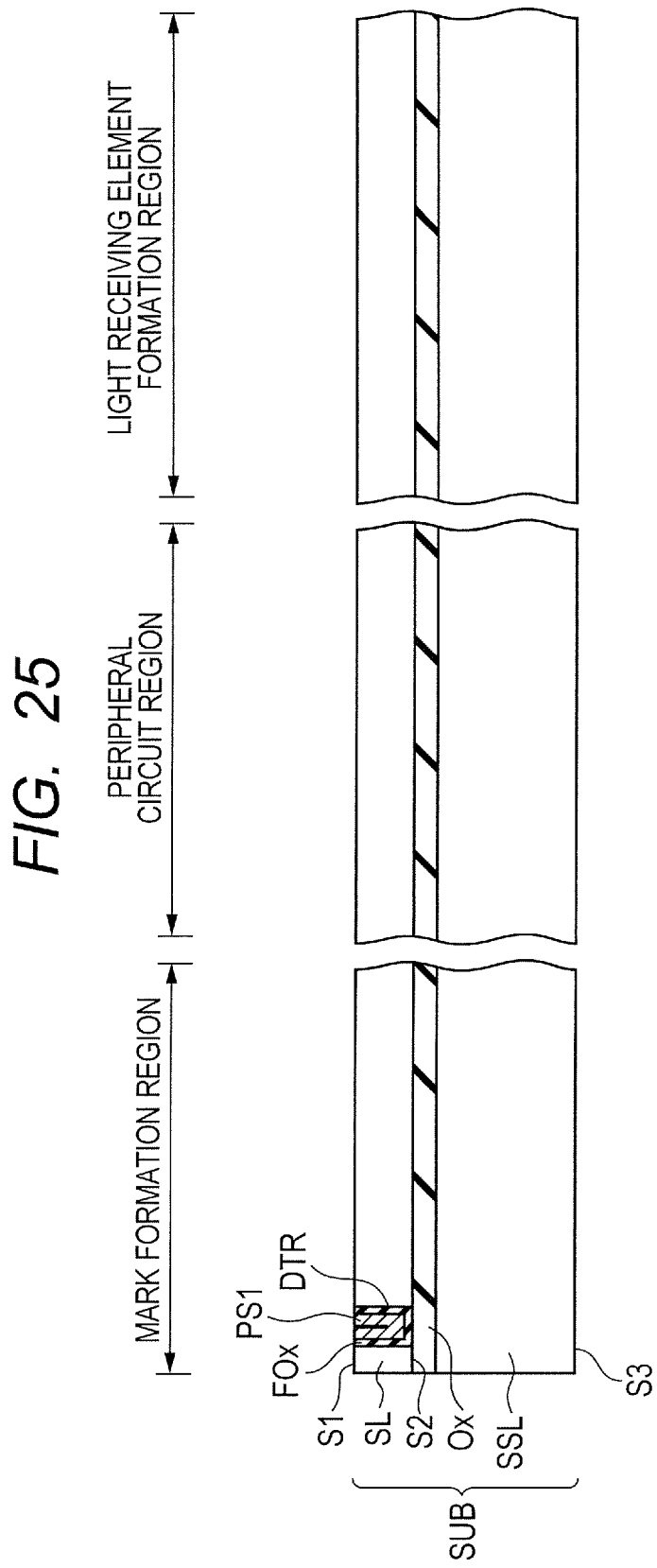
FIG. 25 is a schematic cross-sectional view showing a second step in a manufacturing method of the semiconductor device in the second embodiment.

Referring to FIG. 25, the thin silicon oxide film FOx (insulating film) is formed over the inner peripheral walls of the trench DTR to cover the uppermost surface of the silicon oxide film HOx. The thin silicon oxide film FOx is, for example, a TEOS oxide film, and preferably has a thickness of not less than 0.05 µm nor more than 0.2 µm (more preferably, 0.1 µm). Then, a semiconductor film (thin silicon film), such as the polycrystalline silicon layer PS1, is formed to cover the silicon oxide film FOx over the silicon oxide film HOx, and to fill in the trench DTR. Thereafter, the silicon oxide film HOx, the thin silicon oxide film FOx over the uppermost surface of the silicon oxide film, and the polycrystalline silicon layer PS1 are removed by etching back. In the way described above, the silicon oxide film FOx and the polycrystalline silicon layer PS1 remain in each trench DTR to expose the front-side main surface S1.

Figure 26:
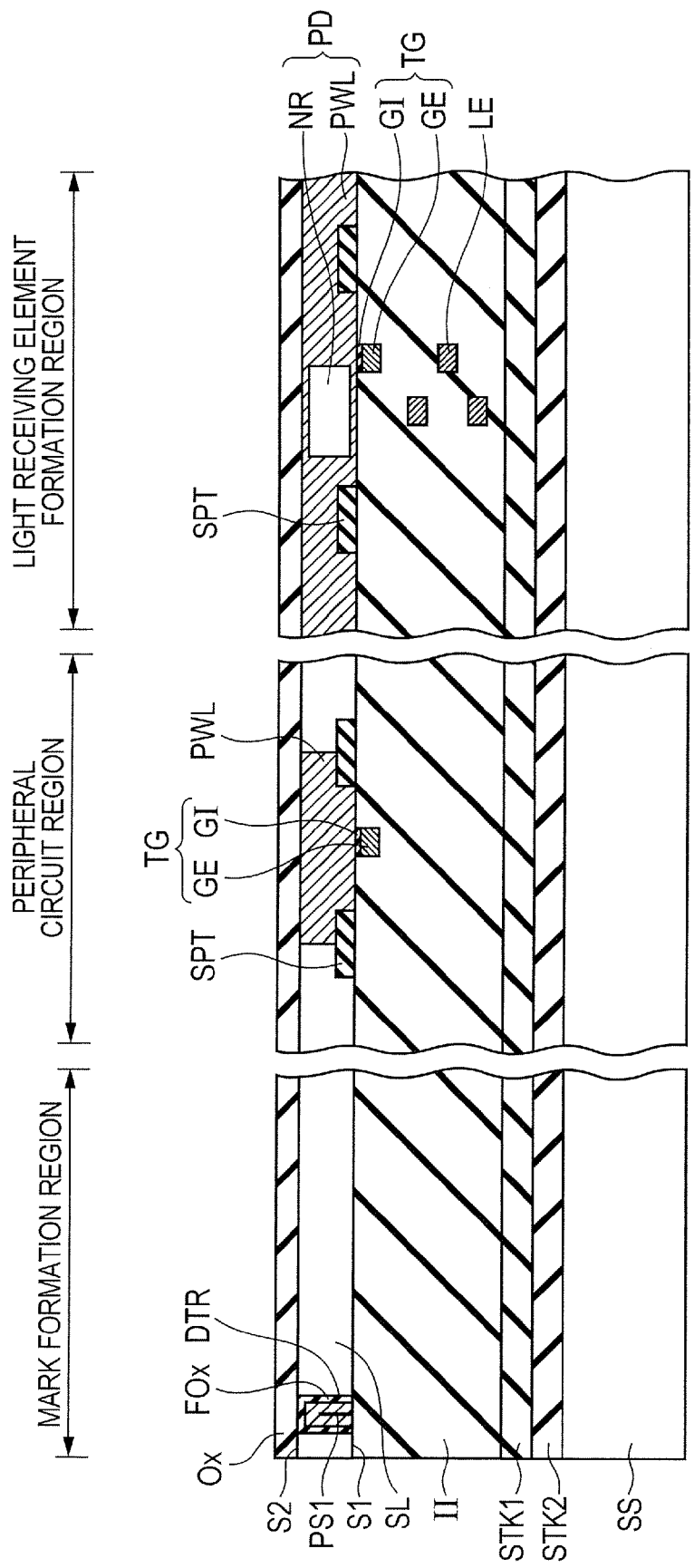
FIG. 26 is a schematic cross-sectional view showing a third step in a manufacturing method of the semiconductor device in the second embodiment.

Referring to FIG. 26, the same processes as those shown in FIGS. 13 and 14 are applied to the front-side main surface S1.

Figure 27:
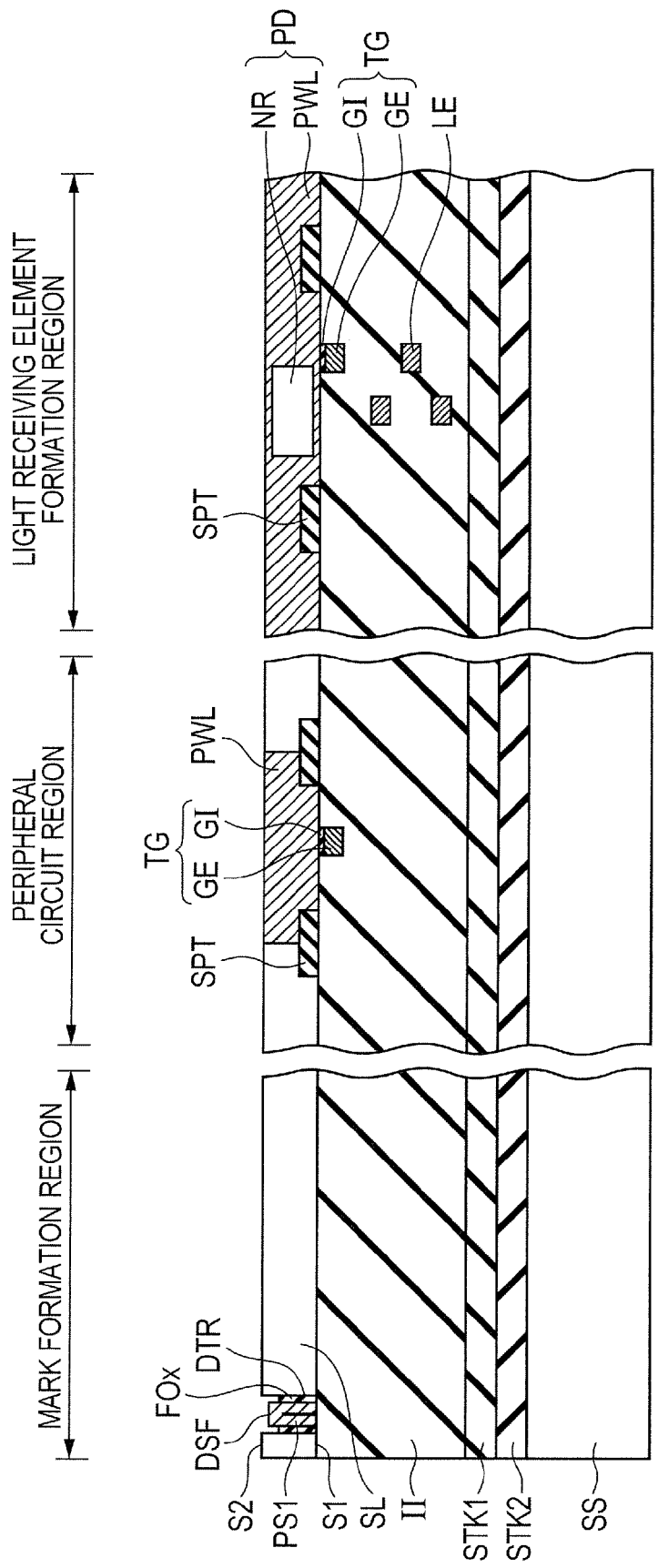
FIG. 27 is a schematic cross-sectional view showing a fourth step in a manufacturing method of the semiconductor device in the second embodiment.

Referring to FIG. 27, the base substrate SSL is removed in the same step as that shown in FIG. 15. Then, the insulating layer Ox made of the silicon oxide film is removed in the same way as that shown in FIG. 16. At the same time, a part of the thin silicon oxide film FOx made of the silicon oxide film is removed. Specifically, the silicon oxide film FOx located in the region near the back-side main surface S2 is also removed together with the insulating layer Ox. At this time, a part of the silicon oxide film FOx covering the inner sides of the trench DTR along which the polycrystalline silicon layer PS1 extends (located near the back-side main surface S2) may be removed. The part of the silicon oxide film FOx covering the sides of the polycrystalline silicon layer PS1 is removed, so that the deeply located surface DSF is formed as the surface of the polycrystalline silicon layer PS1 located closest to the back-side main surface S2 and expanding in the direction along the back-side main surface S2. The deeply located surface DSF is positioned to be recessed toward the front-side main surface S1 rather than the back-side main surface S2 by the thickness of the removed part of the silicon oxide film FOx.

In the step shown in FIG. 27, a region of the semiconductor substrate SUB from the opposed main surface S3 to the back-side main surface S2 is removed. Inside the trench DTR, the mark MK including the polycrystalline silicon layer PS1 and the thin silicon oxide film $FO_x$ is formed.

Figure 28:
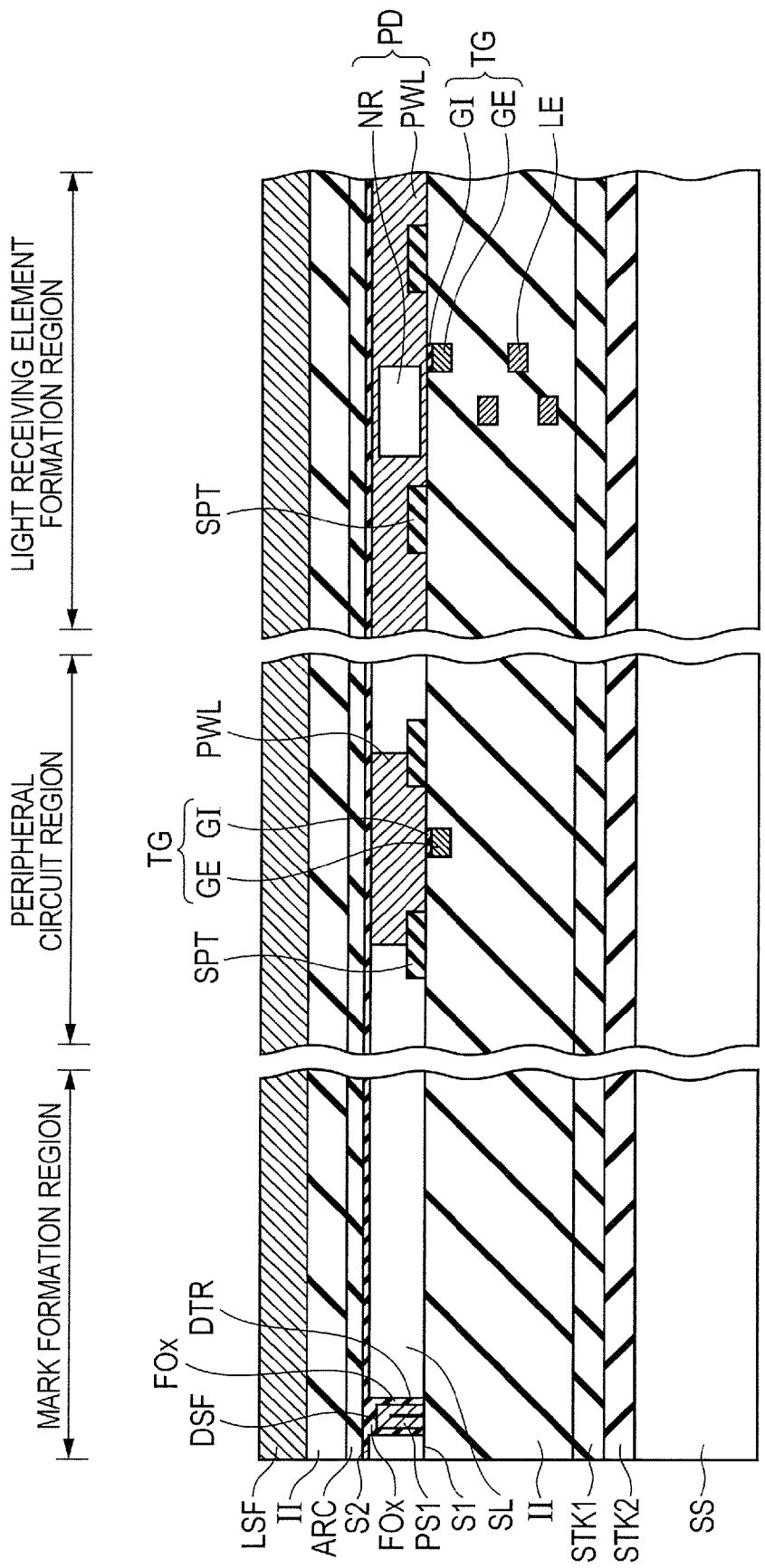
FIG. 28 is a schematic cross-sectional view showing a fifth step in a manufacturing method of the semiconductor device in the second embodiment.

Referring to FIG. 28, the thin silicon oxide film FOx, the reflection preventing film ARC, the interlayer insulating layer II, and the light shielding film LSF are laminated in that order so as to cover the back-side main surface S2, the deeply located surface DSF of the mark Mk, and the thin silicon oxide film FOx in the same way as the process shown in FIG. 18. The following steps are the same as those shown in FIGS. 19 to 21.

Then, the operation and effects of this embodiment will be described below. This embodiment has the following operation and effects in addition to those shown in the first embodiment.

In this embodiment, the mark MK has not only the polycrystalline silicon layer PS1 made of the same material (silicon) as that of the semiconductor layer SL, but also the thin silicon oxide film FOx (for example, TEOS) made of material different from the semiconductor layer SL over the sides of the silicon layer PS1. This embodiment facilitates the detection of the mark MK by viewing as compared to the case where the mark MK is formed of only the polycrystalline silicon layer PS1 in the semiconductor layer SL (silicon) like the first embodiment.

In this embodiment, the thin silicon oxide film FOx is formed over the inner peripheral walls of the trench DTR in the manufacturing method of the mark MK. As a result, the mark MK includes the polycrystalline silicon layer PS1 and the thin silicon oxide film FOx covering the sides of the layer PS1. The mark MK can be more easily viewed and identified through the thin silicon oxide film FOx.

Third Embodiment

Figure 29:
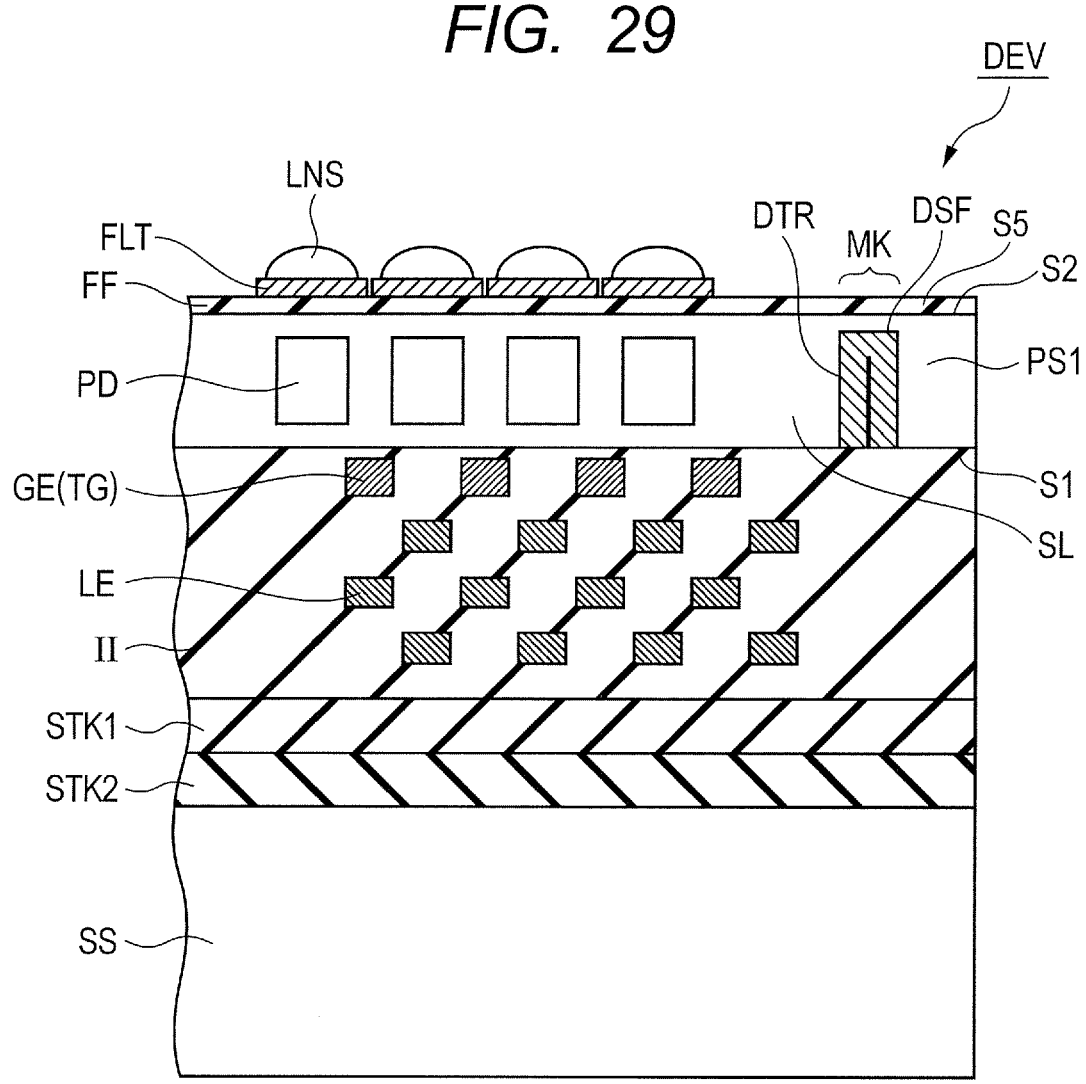
FIG. 29 is a schematic cross-sectional view showing the form of a light receiving element formation region with photodiodes and transistors formed therein, and a mark formation region with the marks formed therein in a semiconductor device according to a third embodiment of the invention.

This embodiment differs from the first embodiment in structure of the mark MK. Referring to FIG. 29, a semiconductor device of this embodiment will be described below.

Referring to FIG. 29, the semiconductor device DEV basically has the same structure as that of the semiconductor device DEV of the first embodiment. As shown in FIG. 29, the trench DTR for accommodating therein the mark MK extends in the direction from the front-side main surface S1 of the semiconductor layer SL (with the front-side main surface S1 as a starting point) toward the back-side main surface S2, but has its bottom ended in the middle of the way to the back-side main surface S2.

The trench DTR for accommodating therein the mark MK in the first and second embodiments penetrates the semiconductor layer SL from the front-side main surface S1 to the back-side main surface S2 of the semiconductor layer SL in the direction from the front-side main surface S1 to the back-side main surface S2. The mark MK of the third embodiment, however, does not penetrate the semiconductor layer SL from the front-side main surface S1 to the back-side main surface S2.

The structure shown in FIG. 29 differs from the structure shown in FIG. 7 in the above respective points, but is the same in other points, and thus the description thereof will not be repeatedly described below.

Now, referring to FIGS. 30 to 33, a manufacturing method of the semiconductor device DEV according to this embodiment, especially, a manufacturing method of the mark MK will be described.

Figure 30:
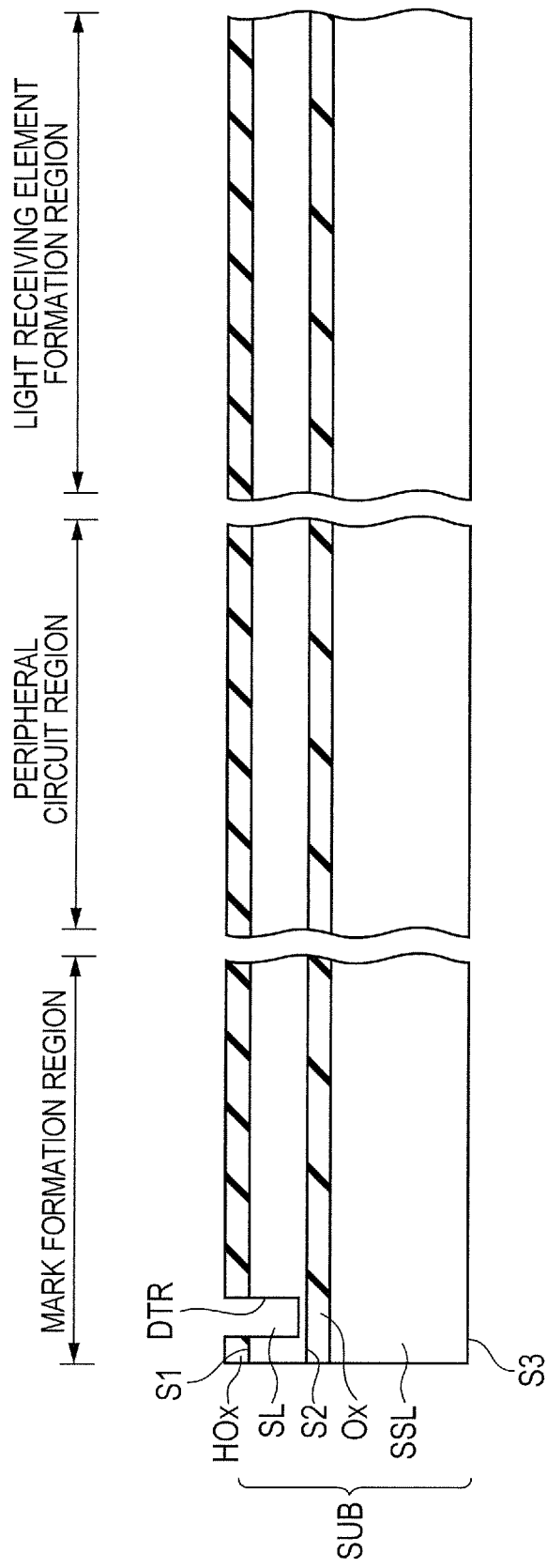
FIG. 30 is a schematic cross-sectional view showing a first step in a manufacturing method of the semiconductor device in the third embodiment.

Referring to FIG. 30, the semiconductor substrate SUB is provided as the so-called SOI substrate which is the same as that shown in FIG. 8, and each trench DTR is formed. The trench DTR is formed by the same etching process as that shown in FIG. 8, but the trench DTR extending in the direction from the front-side main surface S1 to the back-side main surface S2 is formed to have the bottom ended in the middle of the way to the back-side main surface S2 without reaching the back-side main surface S2.

Figure 31:
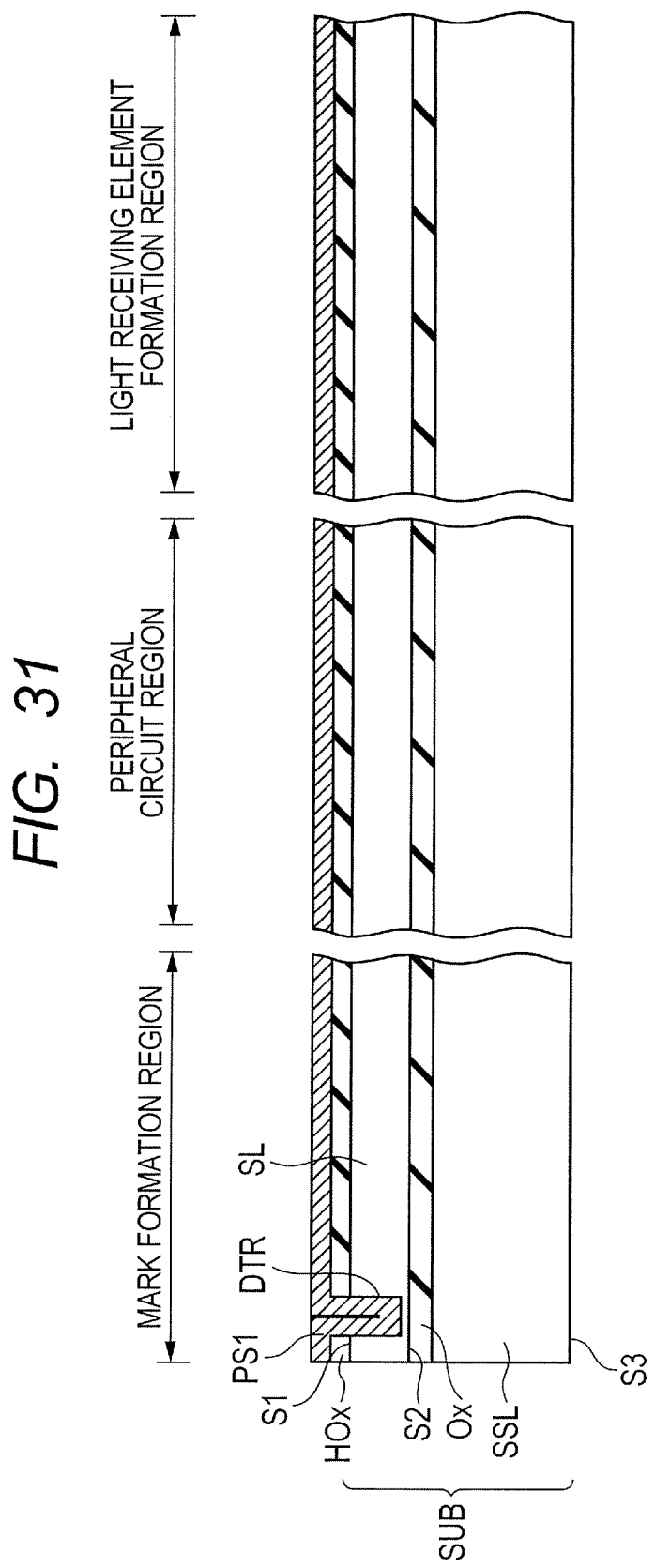
FIG. 31 is a schematic cross-sectional view showing a second step in a manufacturing method of the semiconductor device in the third embodiment.

Referring to FIG. 31, the polycrystalline silicon layer PS1 is formed over the uppermost main surface of the silicon oxide film HOx to fill in the trench DTR.

Figure 32:
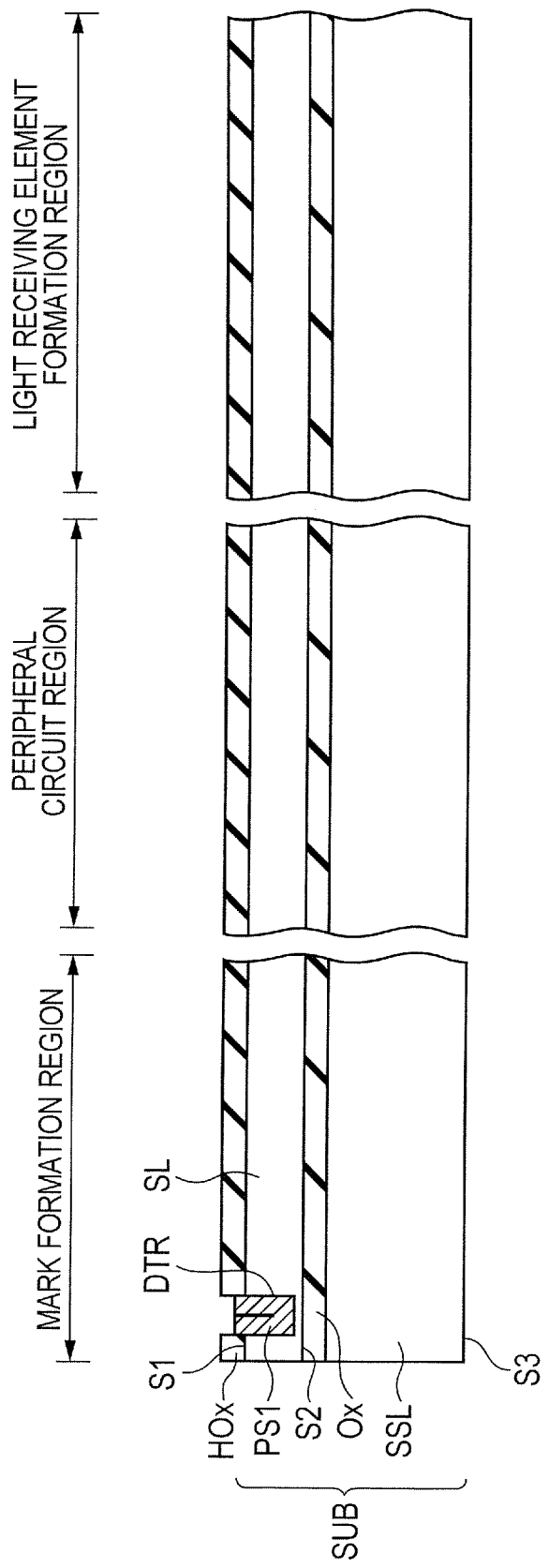
FIG. 32 is a schematic cross-sectional view showing a third step in a manufacturing method of the semiconductor device in the third embodiment.

Referring to FIG. 32, the polycrystalline silicon layer PS1 is etched back with the polycrystalline silicon layer PS1 in the trench DTR remaining.

Figure 33:
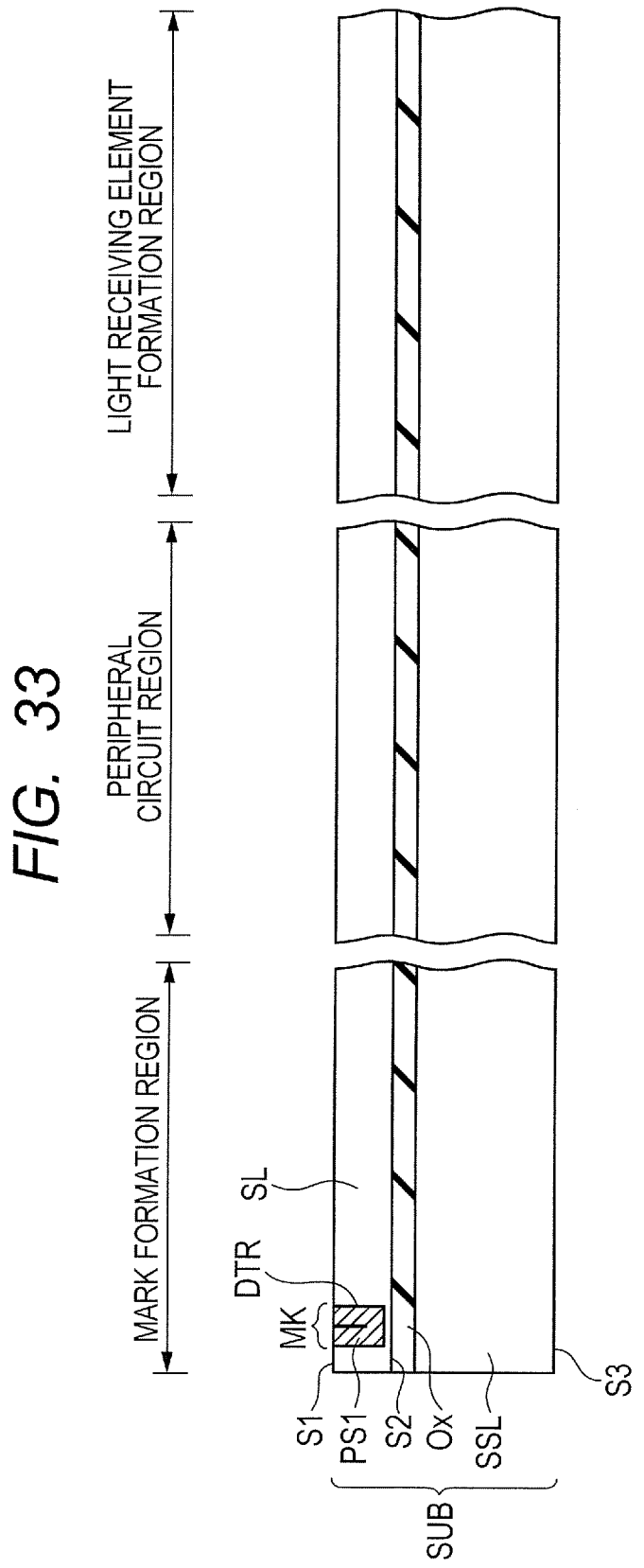
FIG. 33 is a schematic cross-sectional view showing a fourth step in a manufacturing method of the semiconductor device in the third embodiment.

Referring to FIG. 33, the silicon oxide film HOx is etched and removed by chemicals, for example, hydrofluoric acid. After the above step, the same processes as those shown in FIGS. 13 to 21 are performed.

Now, the operation and effects of this embodiment will be described below.

This embodiment differs from the first and second embodiments in that the semiconductor layer SL is disposed in a region from the deeply located surface DSF of the mark MK up to the back-side main surface S2. Also in this embodiment, like the first embodiment, the mark MK is formed to have the deeply located surface DSF on the front-side main surface S1 side rather than the back-side main surface S2 side. Thus, the distance in the vertical direction (not shown) from the upper surface S5 of the planarized layer FF (see FIG. 29) to the deeply located surface DSF is longer than that in the vertical direction from the upper surface S5 to the back-side main surface S2. Like the first and second embodiments, this embodiment can suppress the damage on the mark MK which might be caused by the erosion of the defects by the wet etching solution (alkaline solution) upon removing the base substrate SSL.

When the trench DTR penetrates between the main surfaces S1 and S2 of the semiconductor layer SL like the first and second embodiments, the mark MK is formed of the same silicon as the semiconductor layer SL having the mark formed therein, but the mark MK can be identified by observing the inner peripheral walls of the trench DTR formed at the back-side main surface S2. In the third embodiment, however, the back-side main surface S2 does not include the inner peripheral walls of the trench DTR, and the mark MK is formed of the same silicon as that of the semiconductor layer SL having the mark formed therein. The mark MK of the third embodiment is difficult to identify by viewing the inner peripheral walls of the trench DTR, unlike the first and second embodiments.

However, the deeply located surface DSF of the polycrystalline silicon layer PS1 embedded in the semiconductor layer SL and made of the same silicon as that of the semiconductor layer SL can be identified by irradiating the back-side main surface S2 with infrared light having a wavelength at which the light passes through the silicon material of the polycrystalline silicon layer PS1.

Fourth Embodiment

In the above respective embodiments, in one example of the manufacturing method, after forming the marks MK, the components, such as the element isolation regions SPT and the photodiodes PD, are formed at the front-side main surface S1, and bonded over the support substrate SS. The timing of forming the mark MK or respective elements is not limited thereto, and for example, the element isolation region SPT and the photodiode PD can be formed at an arbitrary timing before the bonding step of the substrate shown in FIG. 14.

Referring back to FIG. 1, the solid-state imaging element is formed in each of the chip regions IMC formed over the semiconductor wafer SW as mentioned above. Thus, it is necessary to arrange the chip regions IMC over the semiconductor wafer SW without misalignment.

Figure 34:
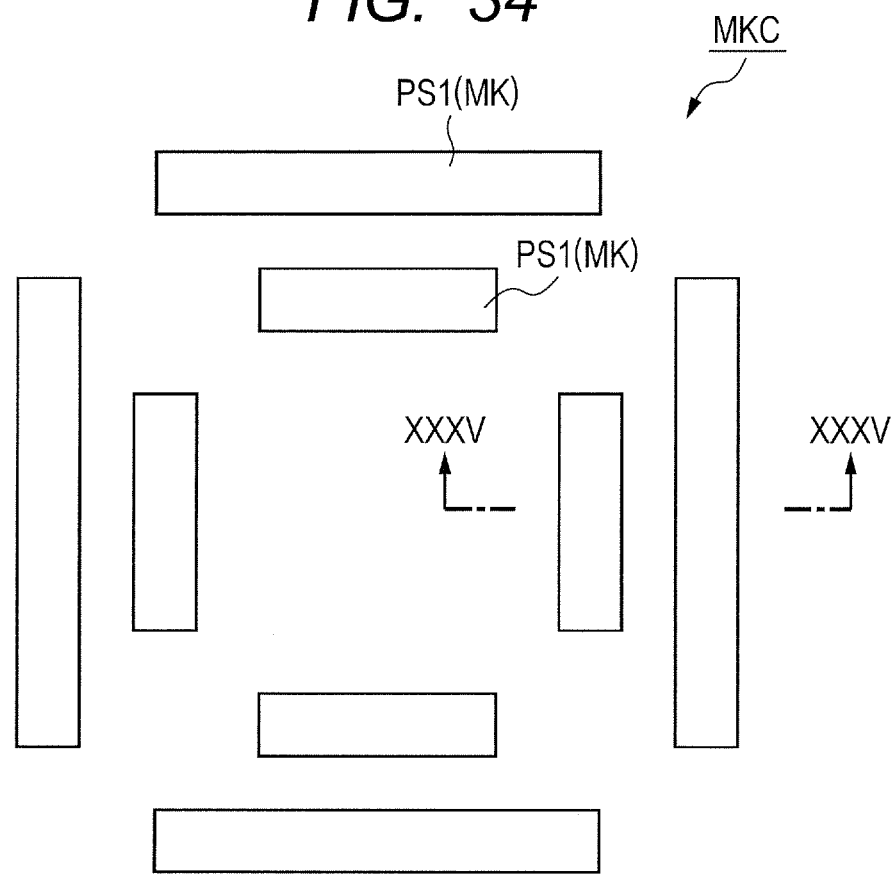
FIG. 34 is a schematic enlarged view showing an example of a plane form of a mark according to a fourth embodiment of the invention.
Figure 35:
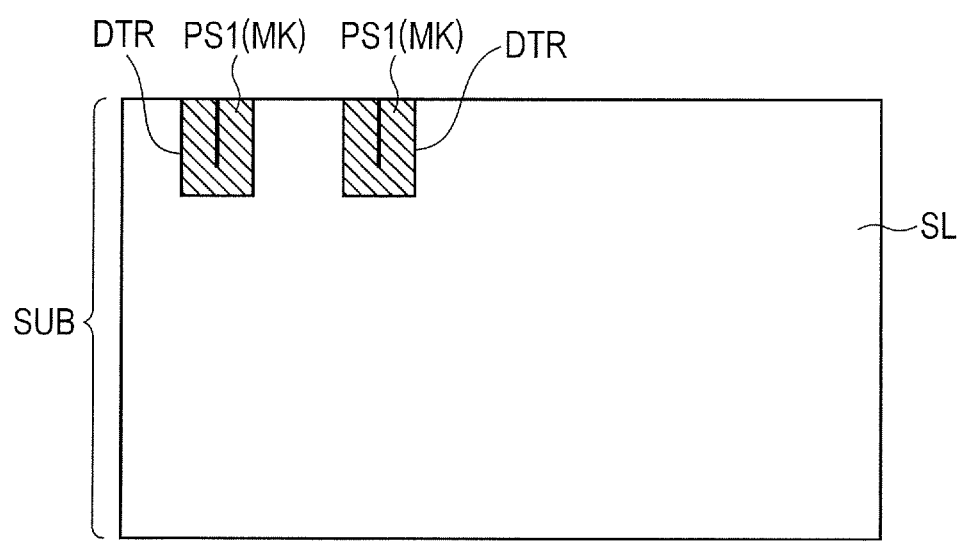
FIG. 35 is a schematic cross-sectional view showing one example of the form of the mark taken along the line XXXV-XXXV of FIG. 34 in the fourth embodiment.

Referring to FIGS. 34 and 35, the mark MKC is used to confirm the misalignment of the chip regions IMC. The mark MKC shown in FIG. 34 is similar to the mark MKC shown in FIGS. 5 and 6, and differs from that shown in FIGS. 5 and 6 in that the individual rectangular marks MK are doubly arranged.

The four marks MK forming an outer (large) rectangle shown in FIG. 34 are marks indicative of the position of an arbitrary chip region IMC over the semiconductor wafer SW. In this case, the four marks MK forming an inner (small) rectangle shown in FIG. 34 are marks (marks for detecting misalignment) for detecting the misalignment of the other chip region IMC adjacent to the one chip region IMC, with respect to the one chip region IMC. Specifically, as shown in FIG. 34, when the rectangular formed by the inner marks MK is located within the rectangular formed by the outer marks MK as shown in FIG. 34, the other chip region IMC is determined to be disposed in the appropriate position with respect to the one chip region IMC.

Before forming the solid-state imaging element or the like as mentioned above, first, the marks MK (MKC) for partitioning the semiconductor wafer SW into the respective chip regions IMC are required.

The mark MK (MKC) is formed at the front-side main surface S1 of the semiconductor substrate SUB in the first step for the semiconductor substrate SUB. Since the marks MK for processing the back-side described in the above respective embodiments can be formed at any arbitrary timing, the marks (second marks for processing the back-side main surface) in the first to third embodiments can be formed at the same time as the marks for detecting misalignment (first marks for processing the front-side main surface) of the chip region IMC at the front-side main surface S1.

Next, referring to FIGS. 36 to 38, a manufacturing method of the mark MK according to a first example of this embodiment will be described below.

Figure 36:
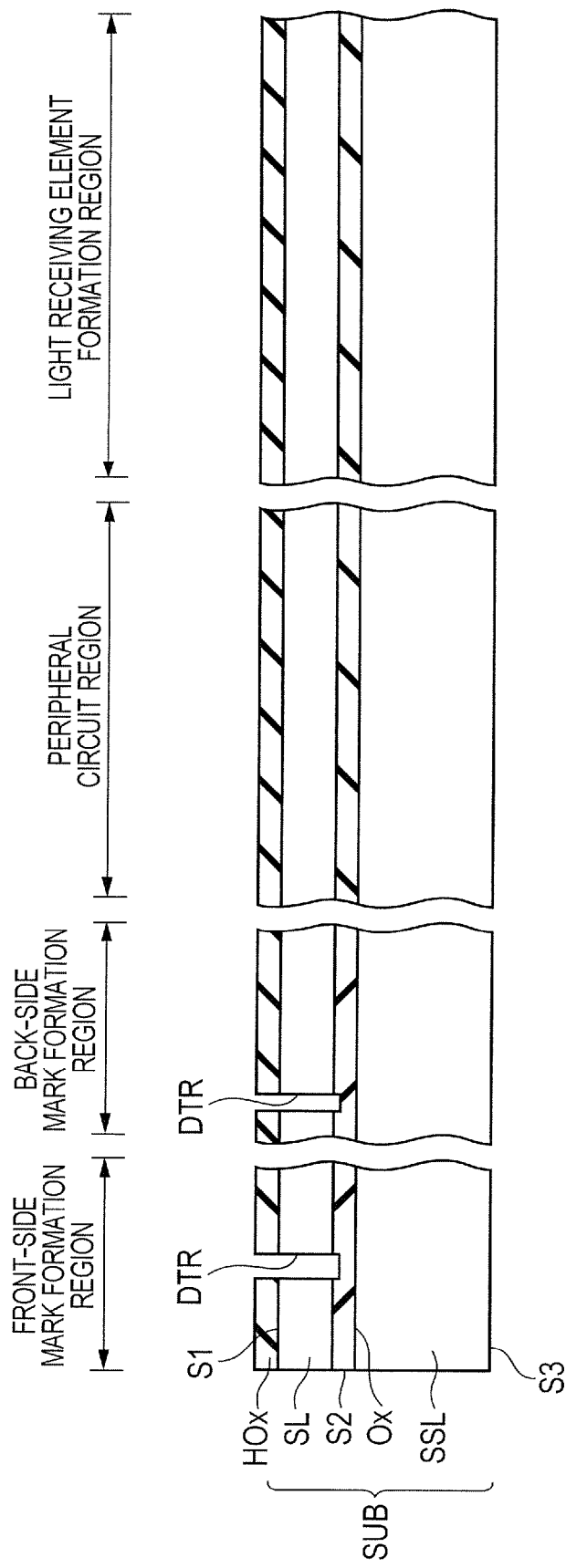
FIG. 36 is a schematic cross-sectional view showing a first step in a manufacturing method of a semiconductor device in a first example of the fourth embodiment.
Figure 37:
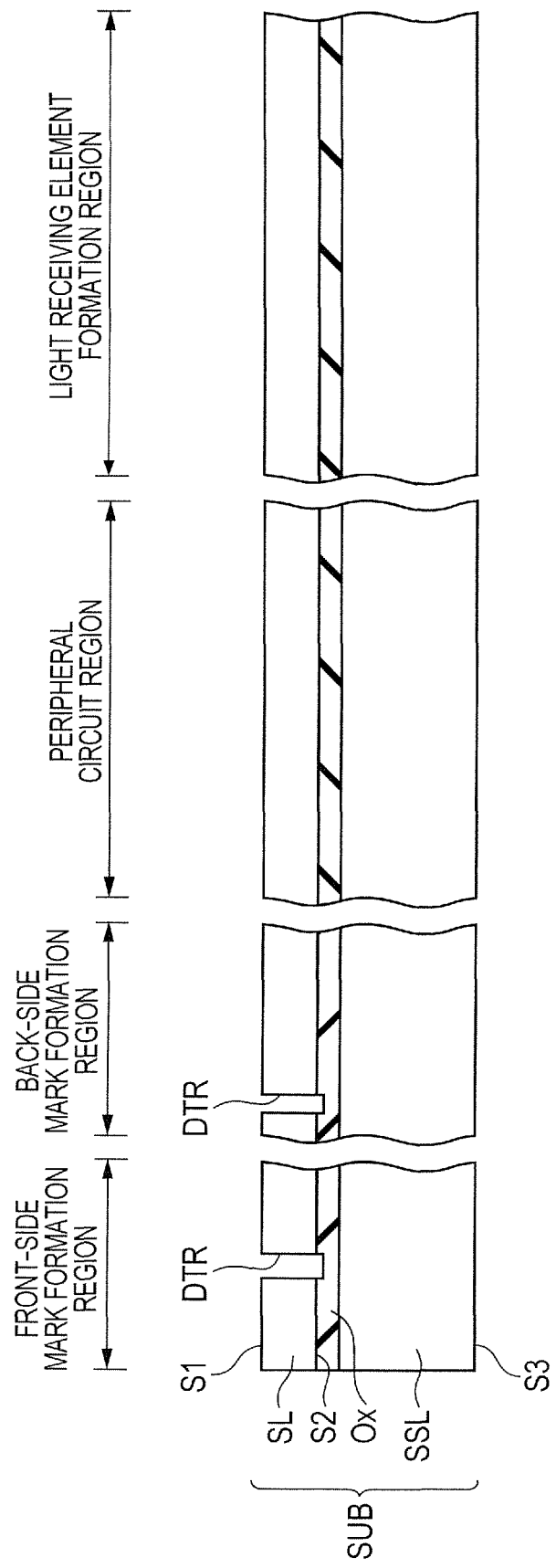
FIG. 37 is a schematic cross-sectional view showing a second step in a manufacturing method of the semiconductor device in the first example of the fourth embodiment.
Figure 38:
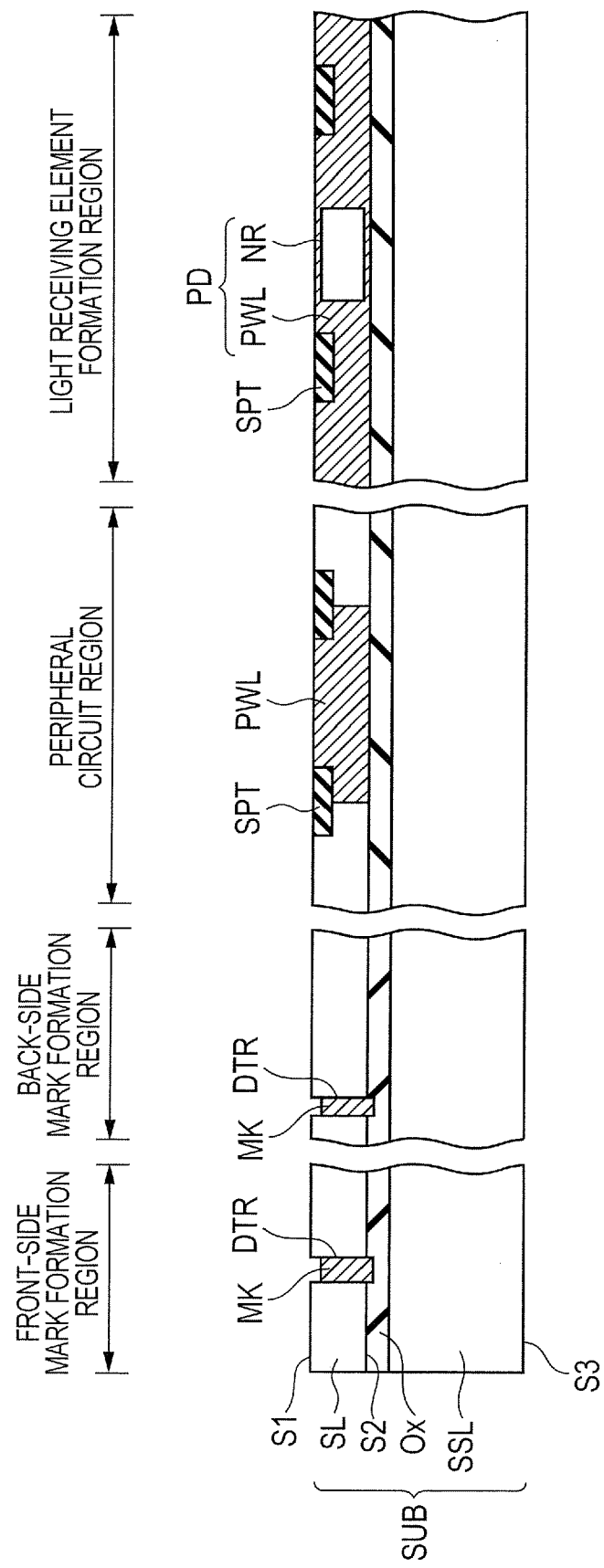
FIG. 38 is a schematic cross-sectional view showing a third step in a manufacturing method of the semiconductor device in the first example of the fourth embodiment.

As shown in FIGS. 36 to 38, the mark formation region is separated into a front-side mark formation region and a back-side mark formation region. The front-side mark formation region indicates a formation region for forming the mark for detecting the misalignment at the front-side main surface S1. The back-side mark formation region indicates a formation region for a mark for the back-side processing, which corresponds to the mark formation region of the first to third embodiments.

Referring to FIG. 36, for example, like the step shown in FIG. 8, the semiconductor substrate SUB is provided as the so-called SOI substrate without being processed. A silicon oxide film HOx for the mask is formed over the substrate. The trenches DTR are provided to simultaneously form the marks both in the front-side mark formation region and the back-side mark formation region.

Referring to FIG. 37, the silicon oxide film HOx shown in FIG. 36 is removed.

Referring to FIG. 38, the pattern for each mark MK is formed in the trench DTR, and the respective components including the element isolation region SPT, the p-type well region PWL, and n-type region NR are formed. The following steps in this embodiment are the same as those in the manufacturing method of the first embodiment, and a description thereof will be omitted below.

Alternatively, in this embodiment, the marks for detecting misalignment of the chip region IMC at the front-side main surface S1 (first mark for processing the front-side main surface), and the marks of the first to third embodiments (second mark for processing the back-side main surface) may be formed in the form of the same mark.

That is, in the first example shown in FIGS. 36 to 38, the mark for processing the front-side main surface and the mark for processing the back-side main surface are independently formed. In contrast, in a second example to be described later, both these marks are the same.

Figure 39:
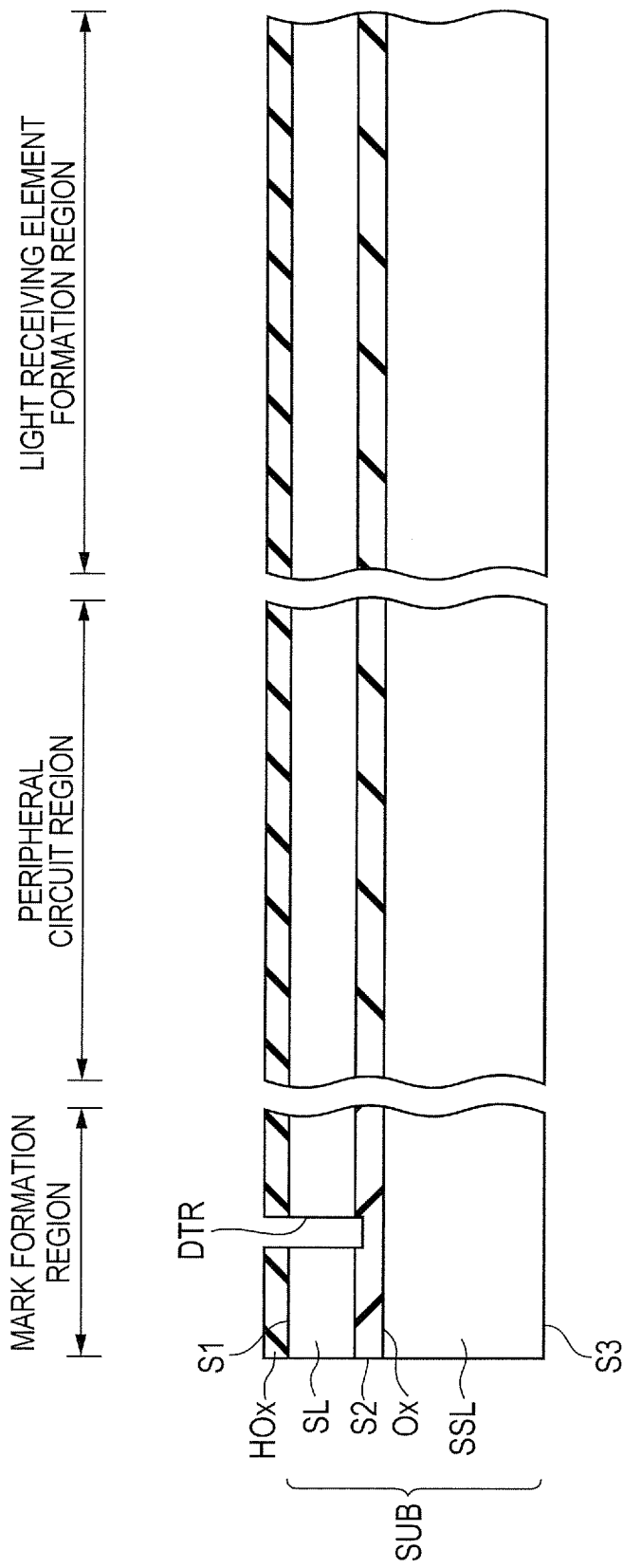
FIG. 39 is a schematic cross-sectional view showing a first step in a manufacturing method of a semiconductor device in a second example of the fourth embodiment.
Figure 40:
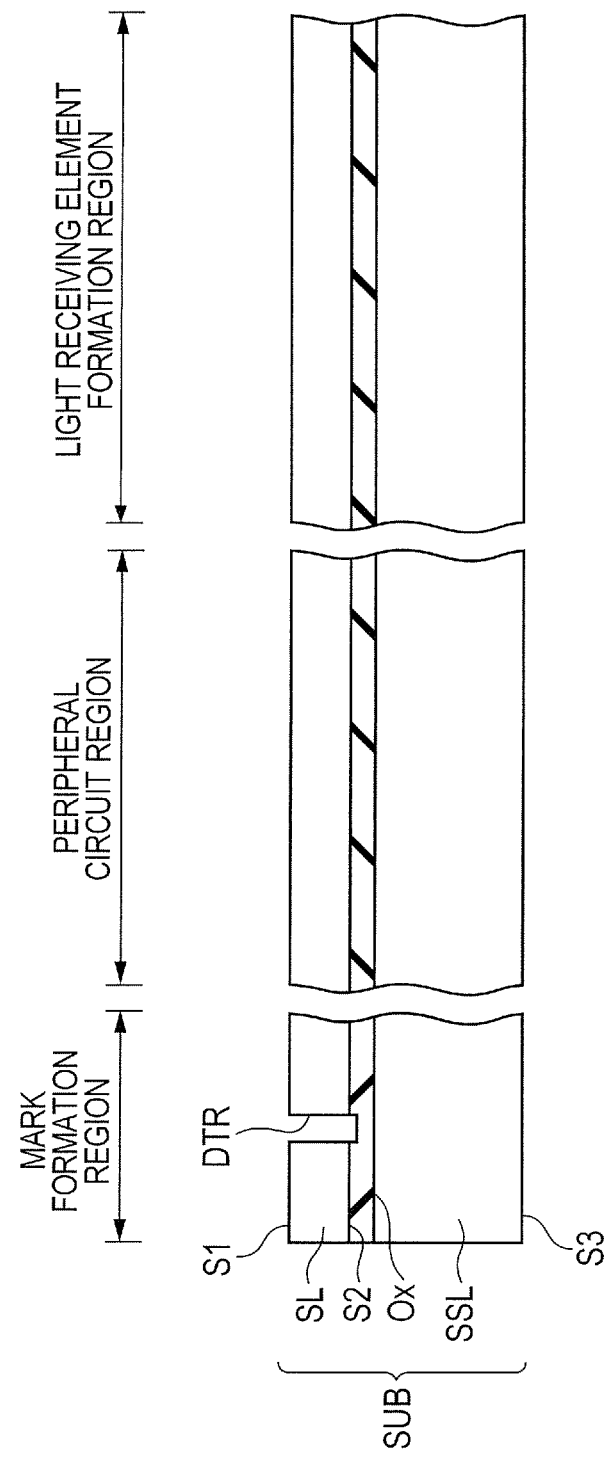
FIG. 40 is a schematic cross-sectional view showing a second step in a manufacturing method of the semiconductor device in the second example of the fourth embodiment.
Figure 41:
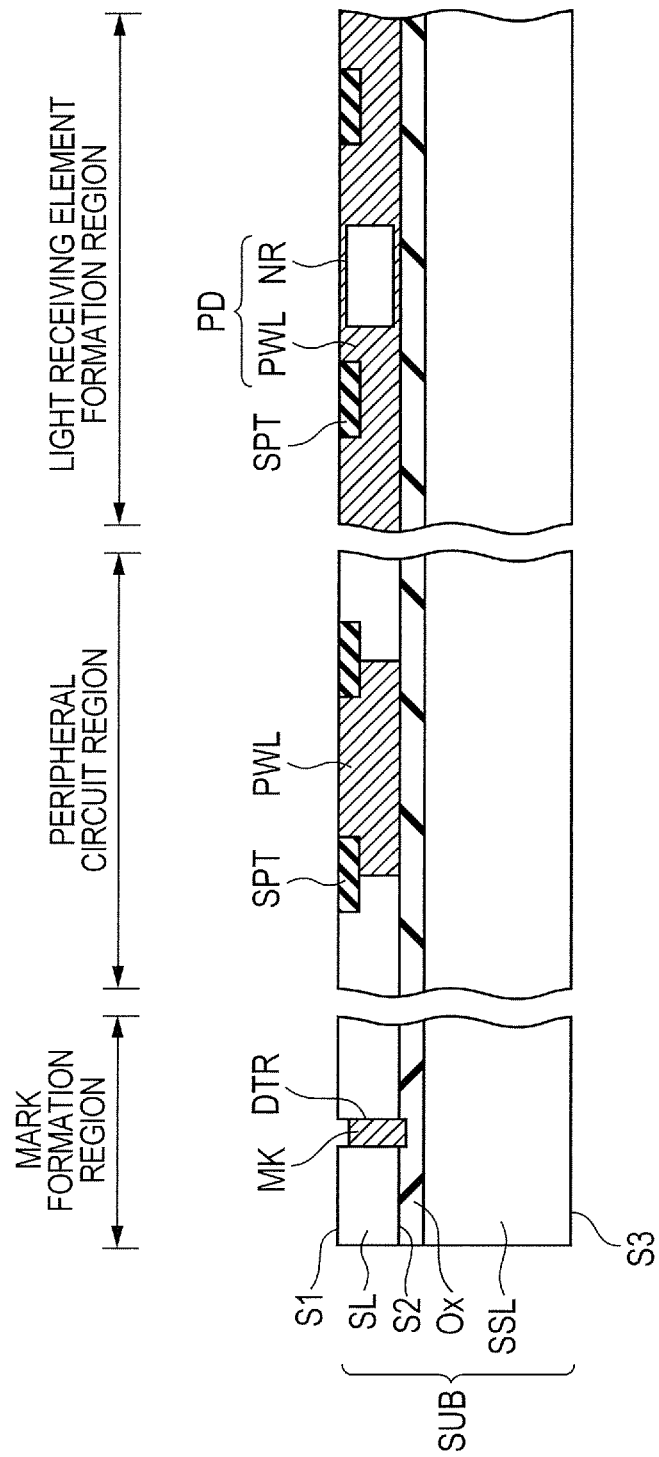
FIG. 41 is a schematic cross-sectional view showing a third step in a manufacturing method of the semiconductor device in the second example of the fourth embodiment.

Referring to FIGS. 39 to 41, the mark MK according to the second example of this embodiment is formed by the same procedure as that in the first example. The mark MK formed in the mark formation region can be used not only for the front side processing, but also for the back side processing.

According to the procedure of the first example of this embodiment, the number of photo masks for processing can be decreased as compared to the case where the mark for processing the front-side main surface and the mark for processing for the back-side main surface are formed at different timings. Further, the first example can reduce the processing time to thereby reduce the manufacturing costs of products.

According to the procedure of the second example of this embodiment, the mark for processing the front-side main surface can also be used as the mark for processing the back-side main surface to thereby reduce areas occupied by the marks with respect to the chip region IMC (semiconductor wafer SW).

Fifth Embodiment

This embodiment differs from the first embodiment in structure of the mark MK. Now, a semiconductor device of this embodiment will be described below with reference to FIG. 42.

Figure 42:
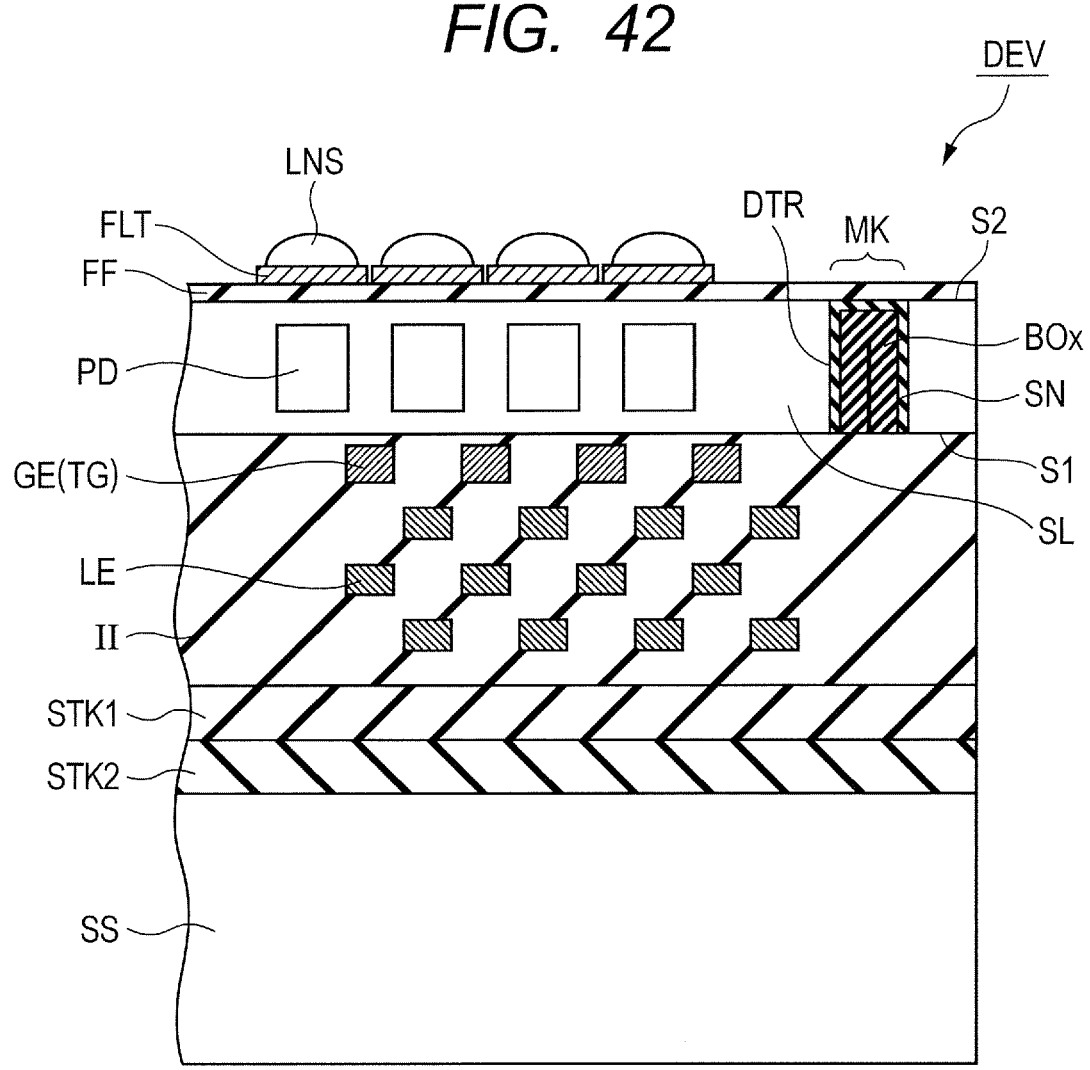
FIG. 42 is a schematic cross-sectional view showing the form of a light receiving element formation region with photodiodes and transistors formed therein, and a mark formation region with the marks formed therein in a semiconductor device according to a fifth embodiment of the invention.

Referring to FIG. 42, the semiconductor device DEV of this embodiment basically has the same structure as that of the semiconductor device DEV of the first embodiment. As shown in FIG. 42, the trench DTR extends through the semiconductor layer SL from the front-side main surface S1 to the back-side main surface S2, whereby the mark MK in the trench DTR is formed to extend from the front-side main surface S1 to the back-side main surface S2.

The trench DTR extends through the semiconductor layer SL from the front-side main surface S1 as a starting point to the back-side main surface S2 as an end point in the direction from the front-side main surface S1 to the back-side main surface S2. Thus, the trench DTR forms the inner bottom in such a position as to be superimposed on the back-side main surface S2.

The mark MK includes a silicon nitride film SN (first mark component), and an embedded silicon oxide film BOx (second mark component). The silicon nitride film SN is formed to be in contact with the inner peripheral walls of the trench DTR (to cover the inner peripheral walls of the trench DTR). The embedded silicon oxide film BOx extends in the direction in which the trench DTR extends, while covering the silicon nitride film SN in the trench DTR, and turns back in the vicinity of the inner bottom of the trench DTR to change its extending direction by 180 degrees. That is, after extending from the main surface S1 to the main surface S2, the embedded silicon oxide film BOx turns back at the deeply located surface DSF to change its extending direction by 180 degrees, while being in contact with the silicon nitride film SN at the inner bottom, and then extends in the direction from the main surface S2 to the main surface S1.

As shown in FIG. 42 (fifth embodiment), the trench DTR forms the inner bottom in such a position as to be superimposed on the back-side main surface S2. Thus, the mark MK forms the end surface in the position where the mark is superimposed on the back-side main surface S2. More specifically, the silicon nitride film SN covering the inner peripheral walls of the trench DTR is disposed to be in contact with the end surface of the embedded silicon oxide film BOx (and in contact with the inner bottom of the trench DTR) at the boundary between the embedded silicon oxide film BOx in the trench DTR and the back-side main surface S2.

The structure shown in FIG. 42 differs from the structure shown in FIG. 7 in the above respective points, but is the same in other points, and thus the description thereof will not be repeatedly described below.

Next, referring to FIGS. 43 to 50, a manufacturing method of the semiconductor device DEV according to this embodiment, mainly, a manufacturing method of the mark MK will be described below.

Figure 43:
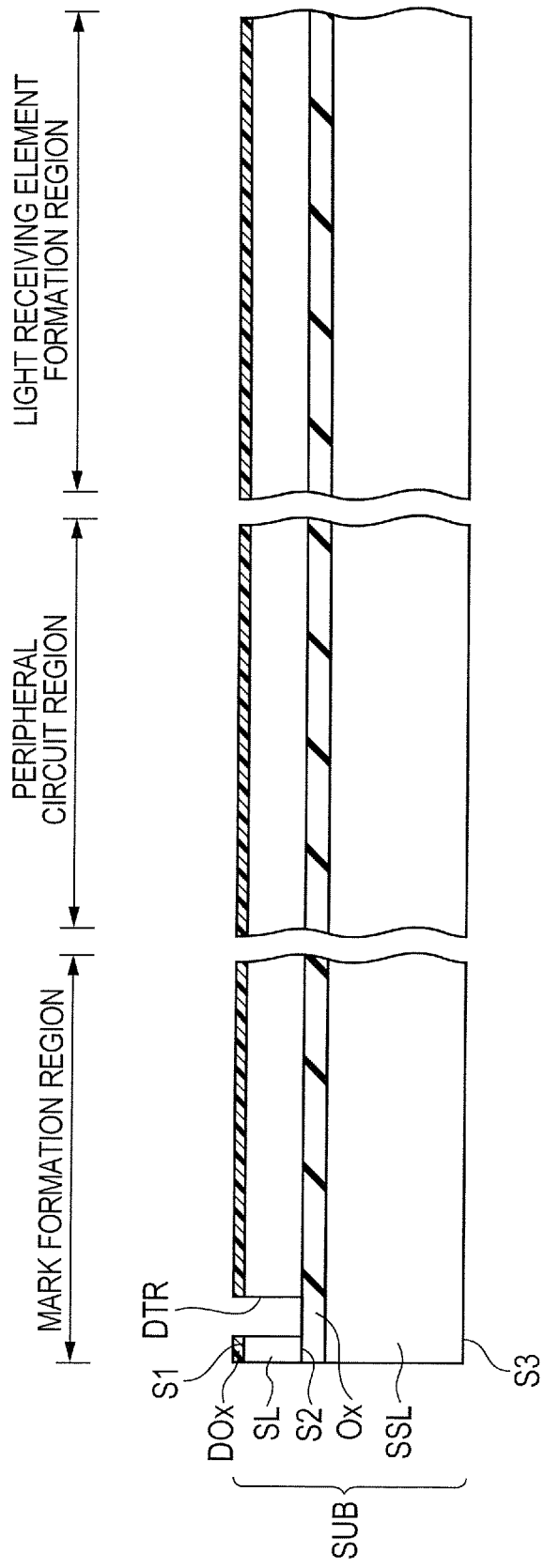
FIG. 43 is a schematic cross-sectional view showing a first step in a manufacturing method of the semiconductor device in the fifth embodiment.

Referring to FIG. 43, the semiconductor substrate SUB is provided as the so-called SOI substrate which is the same as that shown in FIG. 8. A base silicon oxide film DOx (pad oxide film) is formed, for example, by the thermal oxidation method so as to cover the entire front-side main surface S1 (in contact with the upper surface thereof). Then, a pattern including, for example, a silicon nitride film (not shown) is formed over the base silicon oxide film DOx by use of the normal photoengraving and etching techniques. The base silicon oxide film DOx and the semiconductor layer SL are subjected to the normal etching using the pattern of the silicon nitride film as a hard mask to thereby form the trench DTR. The trench DTR is preferably formed to reach the back-side main surface S2 from the front-side main surface S1.

Figure 44:
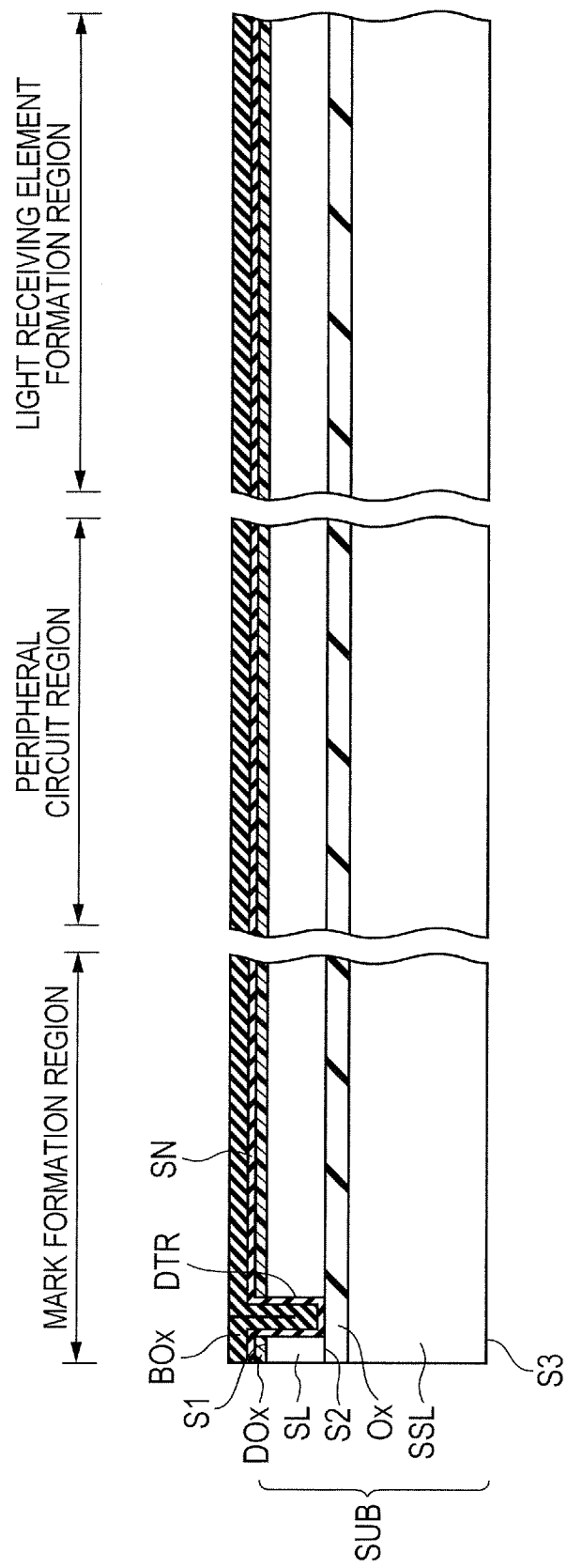
FIG. 44 is a schematic cross-sectional view showing a second step in a manufacturing method of the semiconductor device in the fifth embodiment.

Referring to FIG. 44, the silicon nitride film SN and the embedded silicon oxide film Box are formed in that order to cover the inner peripheral walls of the trench DTR and the upper surface of the base silicon oxide film DOx. The silicon nitride film SN and the embedded silicon oxide film Box are formed to fill in the trench DTR.

Figure 45:
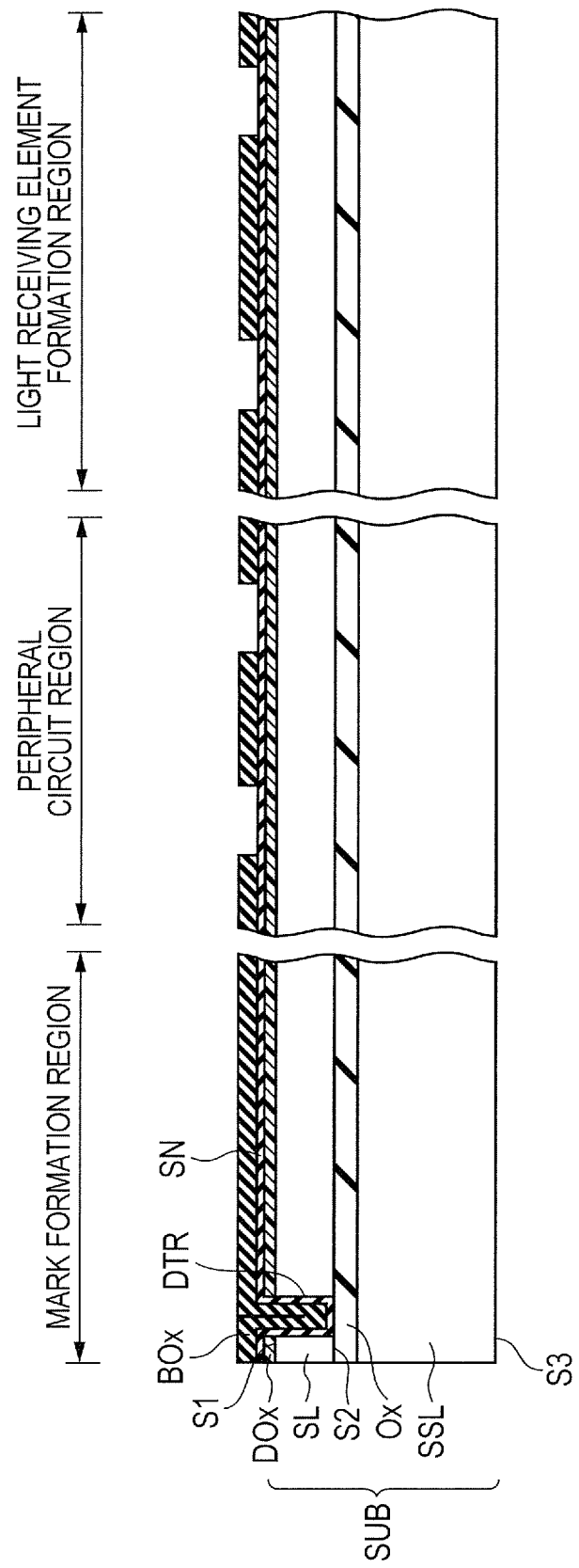
FIG. 45 is a schematic cross-sectional view showing a third step in a manufacturing method of the semiconductor device in the fifth embodiment.

Referring to FIG. 45, the embedded silicon oxide film Box in the regions where the element isolation regions are to be formed in the peripheral circuit region and the light receiving formation region are removed by the normal photoengraving and etching techniques to thereby form the openings.

Figure 46:
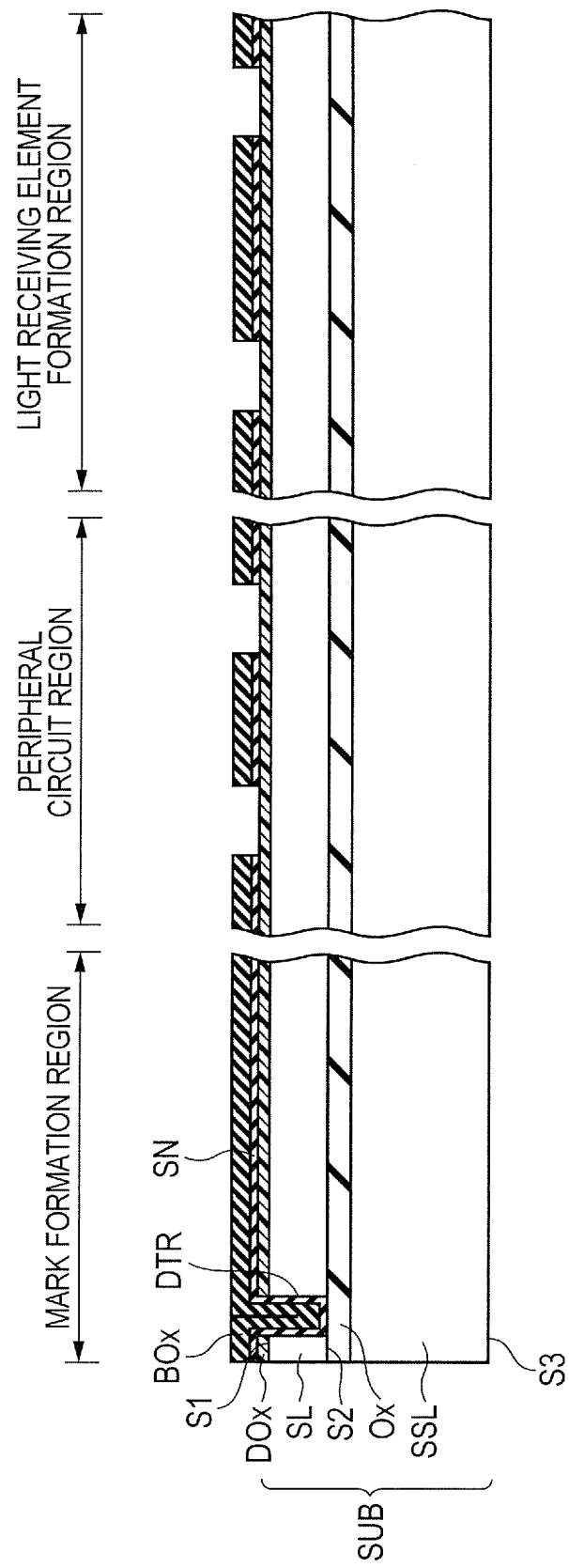
FIG. 46 is a schematic cross-sectional view showing a fourth step in a manufacturing method of the semiconductor device in the fifth embodiment.

Referring to FIG. 46, the silicon nitride film SN is subjected to the normal etching using the embedded silicon oxide film Box pattern formed in the step shown in FIG. 45 as a mask. In this way, the pattern of the silicon nitride film SN is formed as a nitride film for processing in contact with the base silicon oxide film DOx.

Figure 47:
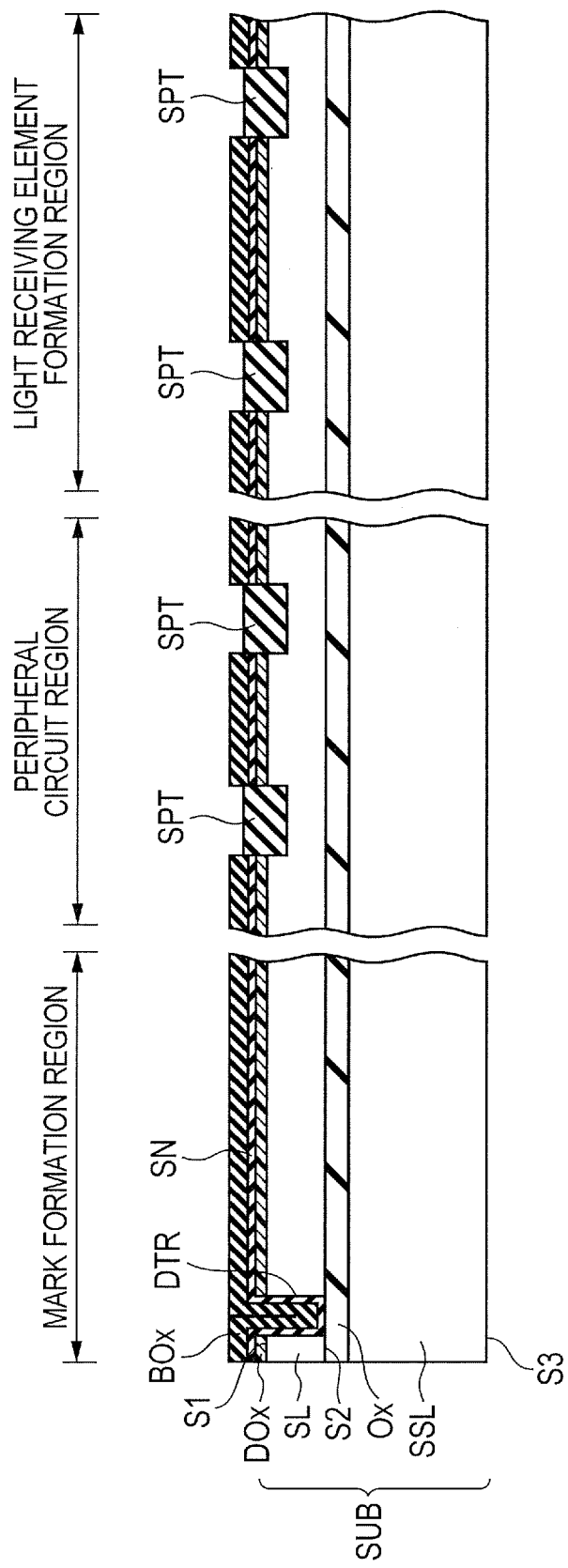
FIG. 47 is a schematic cross-sectional view showing a fifth step in a manufacturing method of the semiconductor device in the fifth embodiment.

Referring to FIG. 47, the base silicon oxide film DOx directly under each opening of the silicon nitride film SN is converted by wet oxidation into a thick oxide film, which is formed as the element isolation region SPT.

Figure 48:
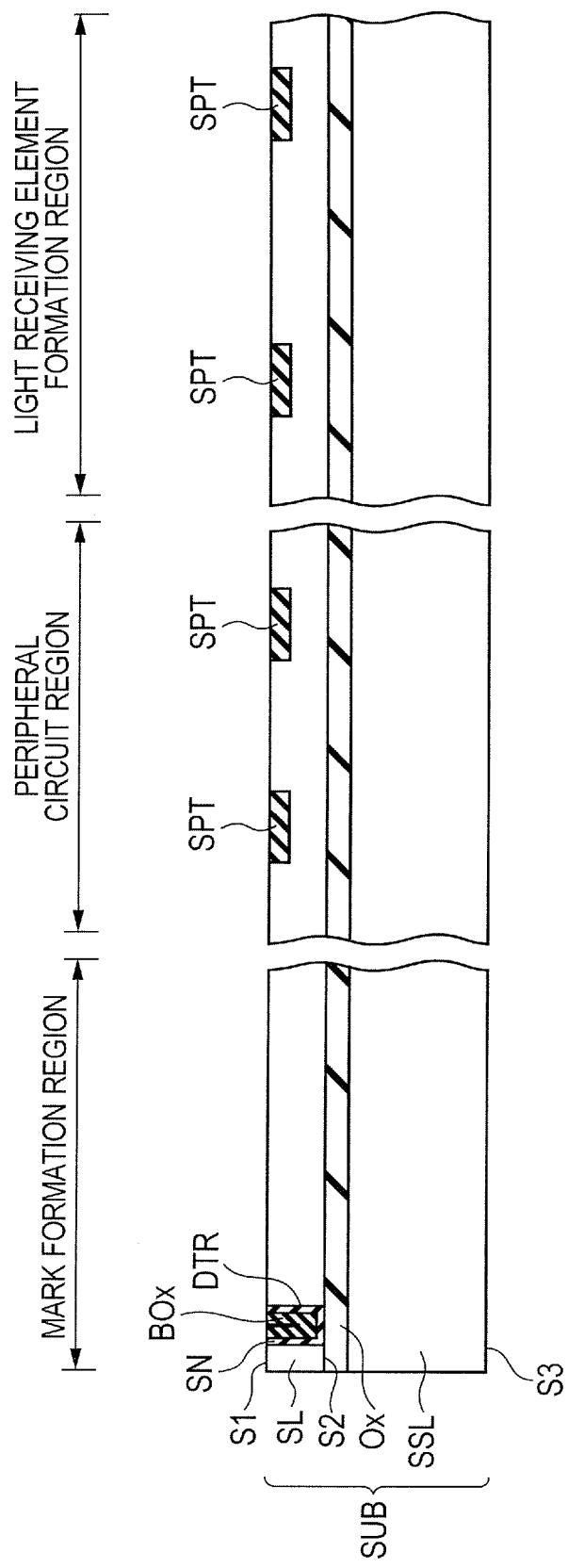
FIG. 48 is a schematic cross-sectional view showing a sixth step in a manufacturing method of the semiconductor device in the fifth embodiment.

Referring to FIG. 48, with the inside of the trench DTR left behind, the embedded silicon oxide film Box, the silicon nitride film SN, and the base silicon oxide film DOx are etched back. The element isolation region SPT has the sufficient thickness, and thus cannot be etched and remains within the semiconductor layer SL. Under the above process, the mark MK is formed of the silicon nitride film SN and the embedded silicon oxide film BOx within the trench DTR Referring to FIGS. 49 and 50, the following processes (processes in steps following the formation of the element isolation region SPT, which has already been performed) are the same as those in the respective steps shown in FIGS. 12 to 21, FIG. 49 shows the form (the same form as that shown in FIG. 16) in which the photodiode PD is formed and the region from the opposed main surface S3 to the back-side main surface S2 of the semiconductor substrate SUB is removed.

Figure 50:
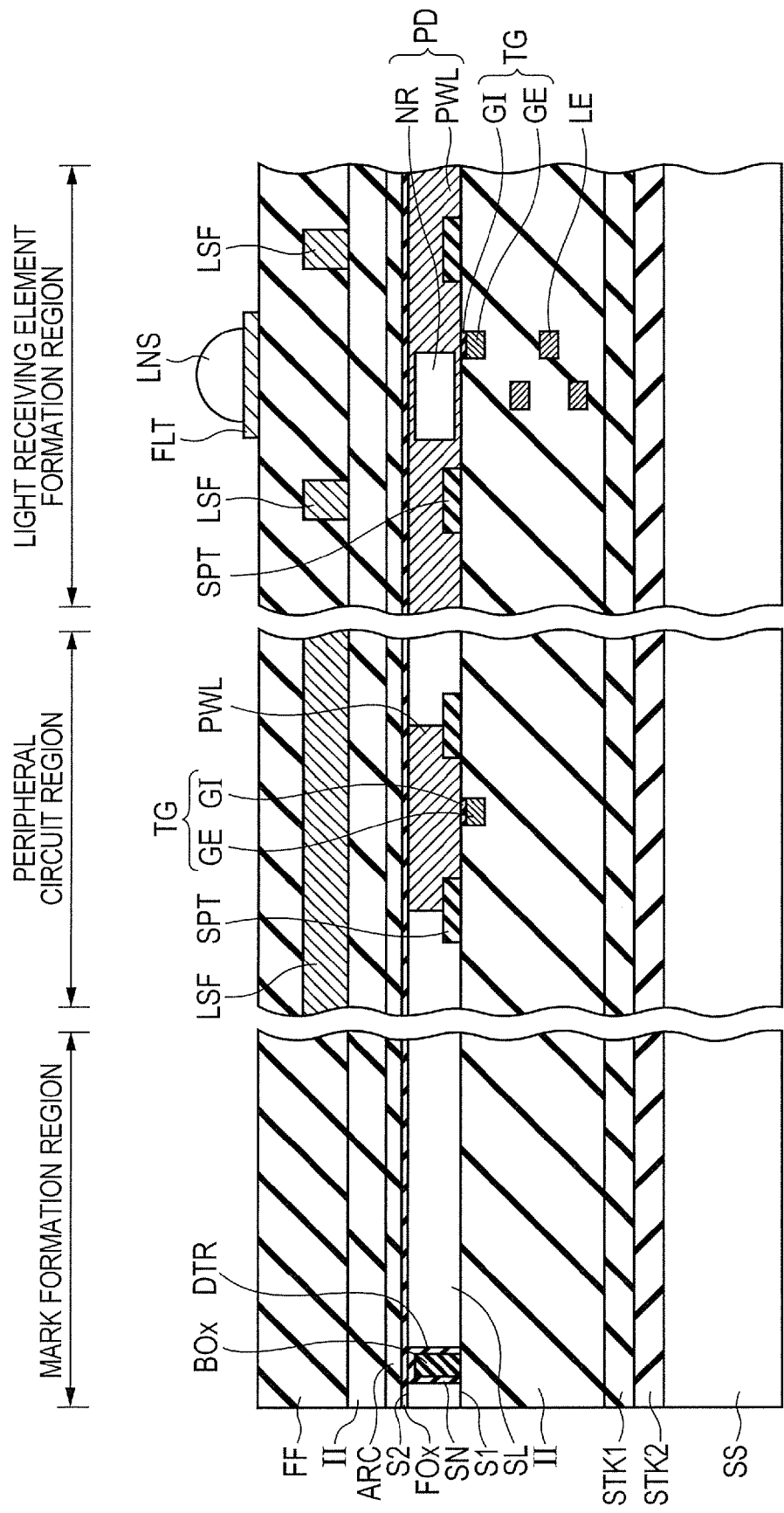
FIG. 50 is a schematic cross-sectional view showing a eighth step in a manufacturing method of the semiconductor device in the fifth embodiment.

FIG. 50 shows the form in which the on-chip lens LNS or the like is formed in the same way as the steps shown in FIGS. 18 to 21.

Next, the problems to be solved by this embodiment, the operation, and effects achieved by this embodiment will be described below. When the mark MK is formed of a laminated film including a silicon nitride film embedded in the trench DTR and other films, processes for forming these films are required, which leads to an increase in number of manufacturing steps, thus making it difficult to reduce the manufacturing cost.

However, when the mark MK is formed of silicon, such as a polycrystalline silicon, the substrate (semiconductor layer SL) with the marks MK formed therein is also formed of silicon. The optical characteristics of both the mark MK and the substrate are the same, which makes it difficult to identify the mark MK (in this case, the mark MK is required to be identified using the infrared light having a specific wavelength as mentioned above). From this point, the substrate (semiconductor layer SL) is formed of silicon and the mark MK is formed of material with different optical properties from those of silicon. Thus, the difference in optical property between both mark and substrate can be used to easily identify the mark MK.

Like this embodiment, the mark for use is formed of a different material (silicon oxide film and silicon nitride film) from that of the semiconductor layer SL (silicon), and thus can be easily identified.

As mentioned above, in this embodiment, the silicon nitride film SN forming the mark MK is formed in the same layer as the silicon nitride film SN for forming the element isolation region SPT. The embedded silicon oxide film BOx for forming the mark MK is formed in the same layer as the pattern (see FIG. 45) for forming the pattern of the silicon nitride film SN.

That is, in this embodiment, the mark MK is simultaneously formed in the same layer at the same time as the step of forming other components, which can reduce the number of photo masks for processing as compared to the case where a step of depositing the mark MK is independently performed from other steps. Further, the first example can reduce the processing time interval to thereby reduce the manufacturing costs of products.

Sixth Embodiment

This embodiment differs from the first embodiment in structure of the mark MK. Now, a semiconductor device of this embodiment will be described below with reference to FIG. 51.

Figure 51:
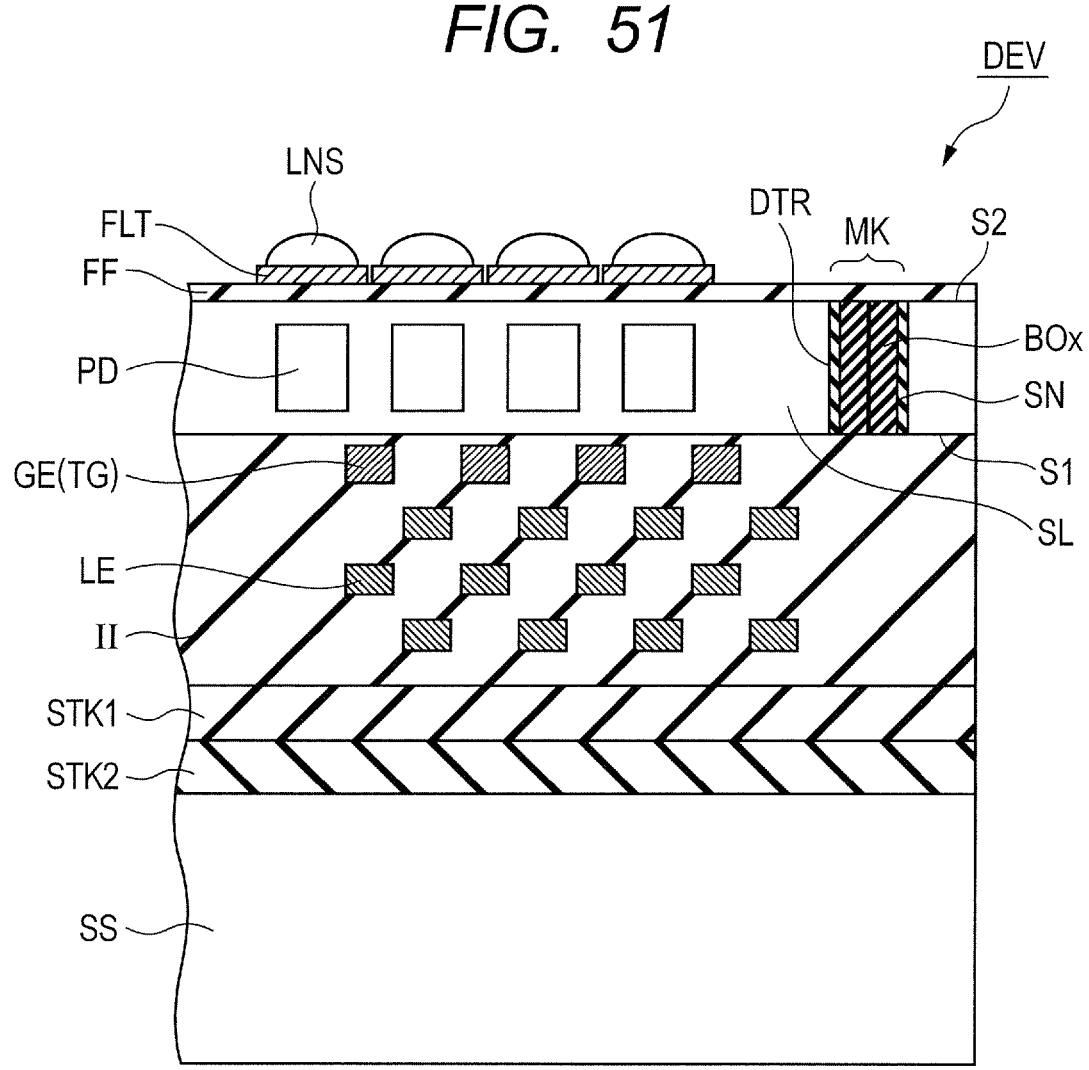
FIG. 51 is a schematic cross-sectional view showing the form of a light receiving element formation region with photodiodes and transistors formed therein, and a mark formation region with the marks formed therein in a semiconductor device according to a sixth embodiment of the invention.

Referring to FIG. 51, the semiconductor device DEV of this embodiment basically has the same structure as that of the semiconductor device DEV of the fifth embodiment (see FIG. 42). As shown in FIG. 51, the trench DTR extends from the front-side main surface S1 to the back-side main surface S2 to penetrate the semiconductor layer SL from the front-side main surface S1 of the semiconductor layer SL as a starting point to the back-side main surface S2 thereof. The inner bottom of the trench DTR is not formed in such a position as to be superimposed on the back-side main surface S2, and the silicon nitride film SN is not formed over the back-side main surface S2.

As shown in FIG. 51, like the mark MK shown in FIG. 42, a longitudinal line made by turning back the embedded silicon oxide film BOx to change its extending direction in the trench DTR by 180 degrees extends from the main surface S1 to the main surface S2. This is because the mark MK with the same structure as that shown in FIG. 42 is cut (seamed) at the back-side main surface S2.

The structure shown in FIG. 51 differs from the structure shown in FIG. 42 in the above respective points, but is the same as the structure shown in FIG. 7 in other points, and thus the description thereof will not be repeatedly described below.

Next, referring to FIGS. 52 to 58, a manufacturing method of the semiconductor device DEV according to this embodiment, mainly, a manufacturing method of the mark MK will be described below.

Figure 52:
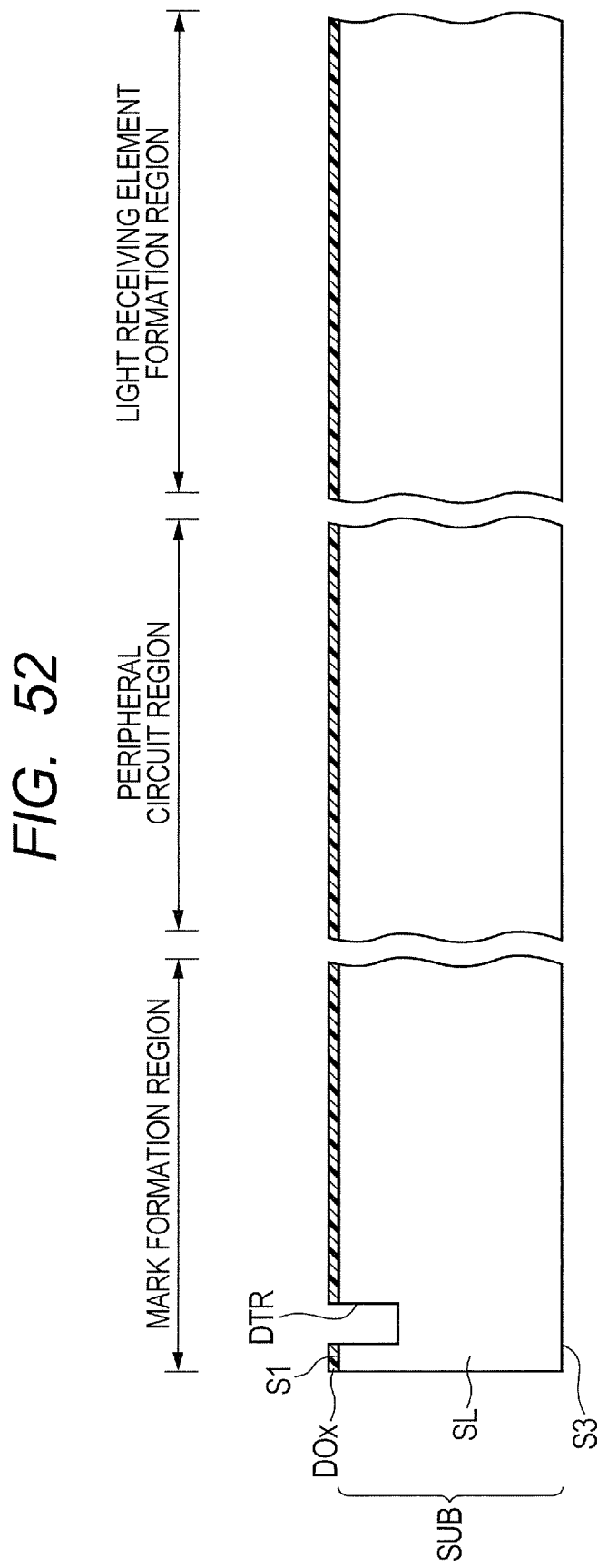
FIG. 52 is a schematic cross-sectional view showing a first step in a manufacturing method of the semiconductor device in the sixth embodiment.

Referring to FIG. 52, this embodiment differs from the above respective embodiments in that a semiconductor substrate SUB is provided which includes the front-side main surface S1, and a main surface S3 opposed to the main surface S1 without the insulating film layer Ox. The semiconductor substrate SUB is a normal single crystal silicon substrate including the semiconductor layer SL made of single crystal silicon, and is not the so-called SOI substrate with the insulating layer Ox embedded therein.

The pattern of the base silicon oxide film DOx is formed at the semiconductor substrate SUB in the same way as the step shown in FIG. 43. The trench DTR is formed using the pattern of the silicon nitride film as a hard mask by the normal etching which is the same as that shown in FIG. 43. Since the insulating layer Ox is not formed in the semiconductor substrate SUB, the semiconductor substrate SUB is etched such that the depth of the trench DTR in the vertical direction shown in FIG. 52 is substantially the same as that shown in FIG. 43.

Figure 53:
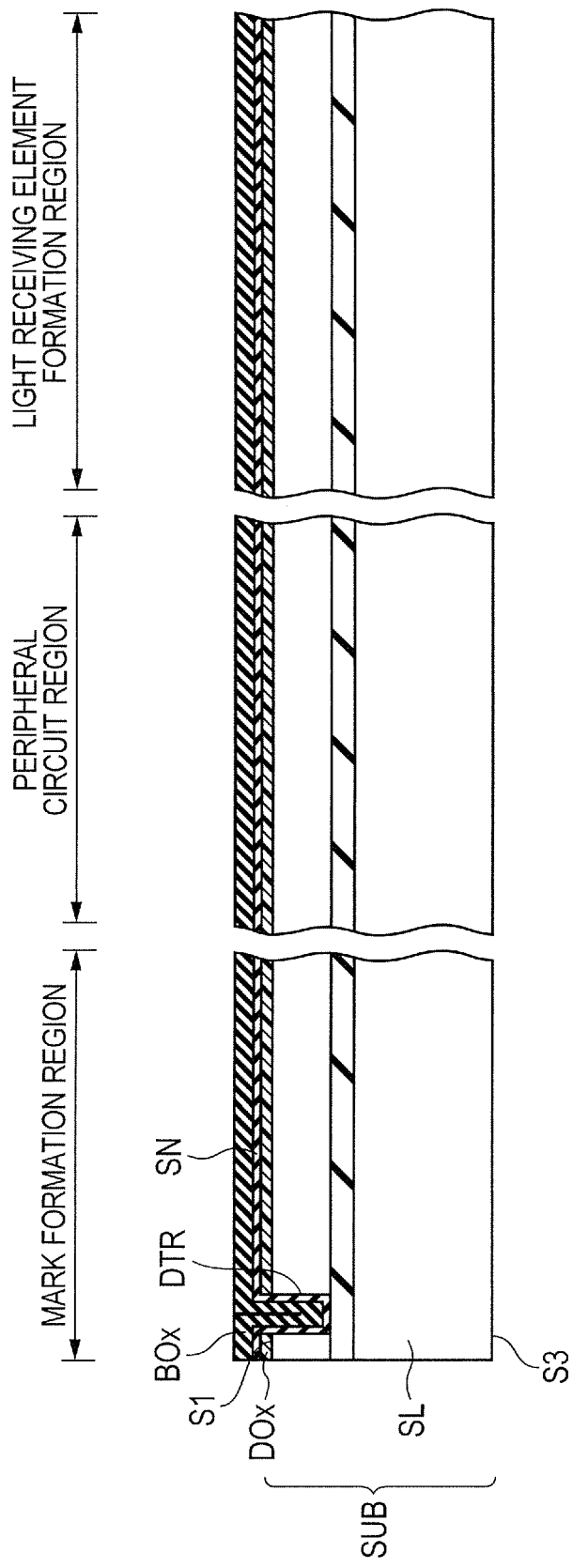
FIG. 53 is a schematic cross-sectional view showing a second step in a manufacturing method of the semiconductor device in the sixth embodiment.
Figure 54:
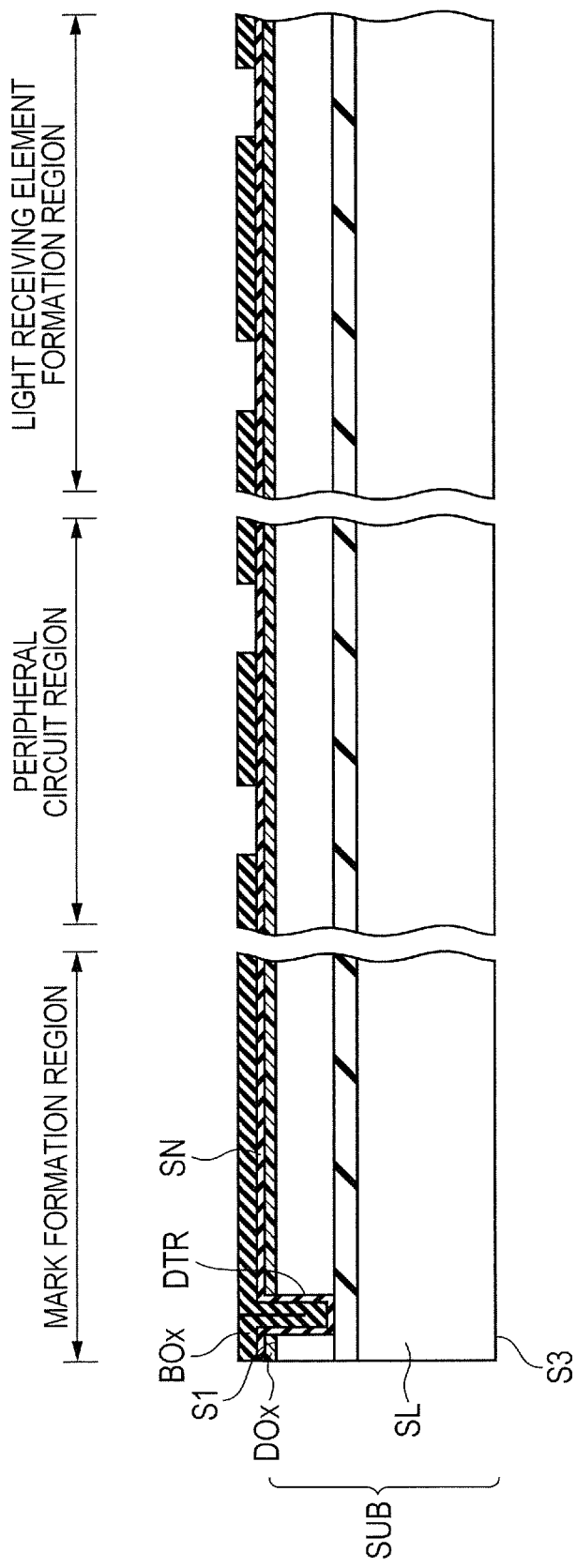
FIG. 54 is a schematic cross-sectional view showing a third step in a manufacturing method of the semiconductor device in the sixth embodiment.
Figure 55:
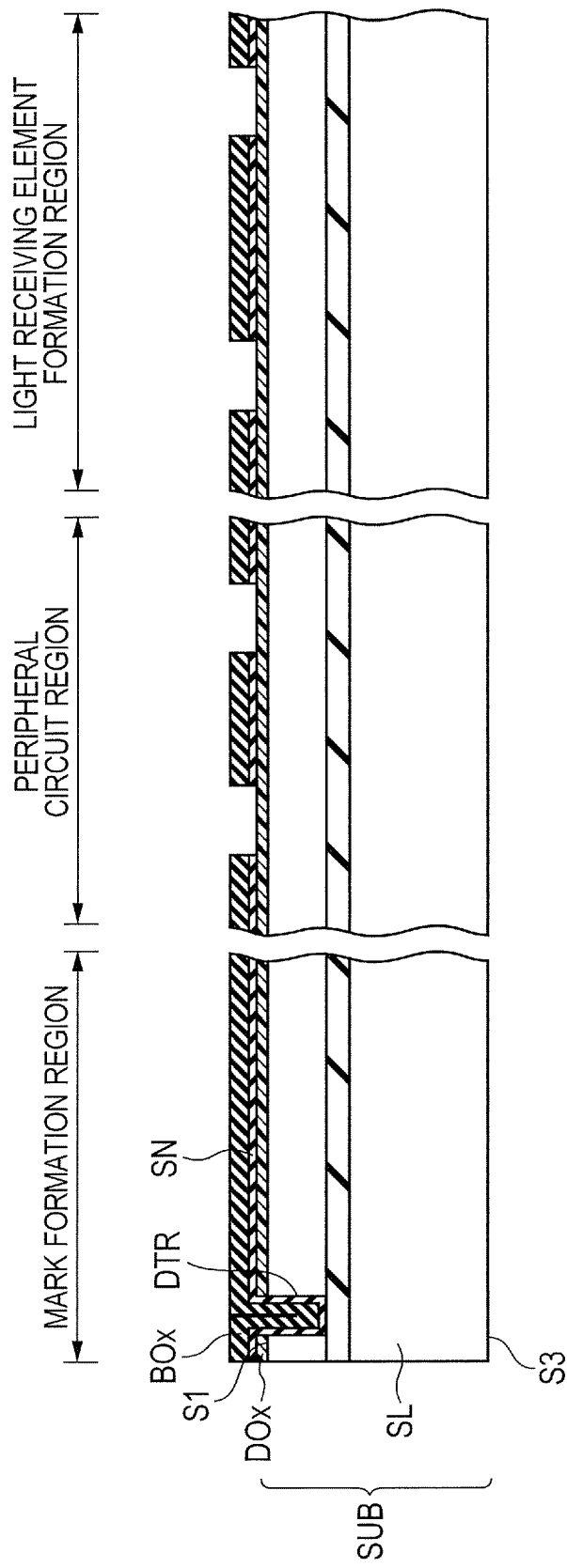
FIG. 55 is a schematic cross-sectional view showing a fourth step in a manufacturing method of the semiconductor device in the sixth embodiment.
Figure 56:
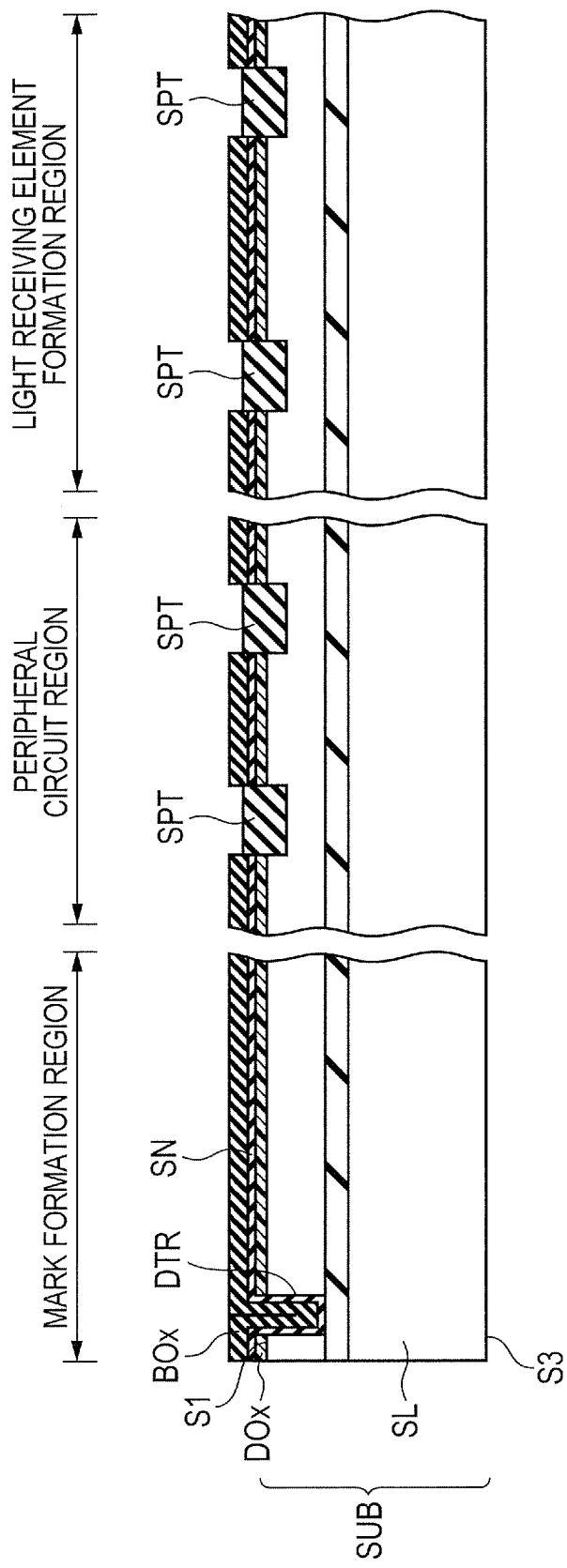
FIG. 56 is a schematic cross-sectional view showing a fifth step in a manufacturing method of the semiconductor device in the sixth embodiment.
Figure 57:
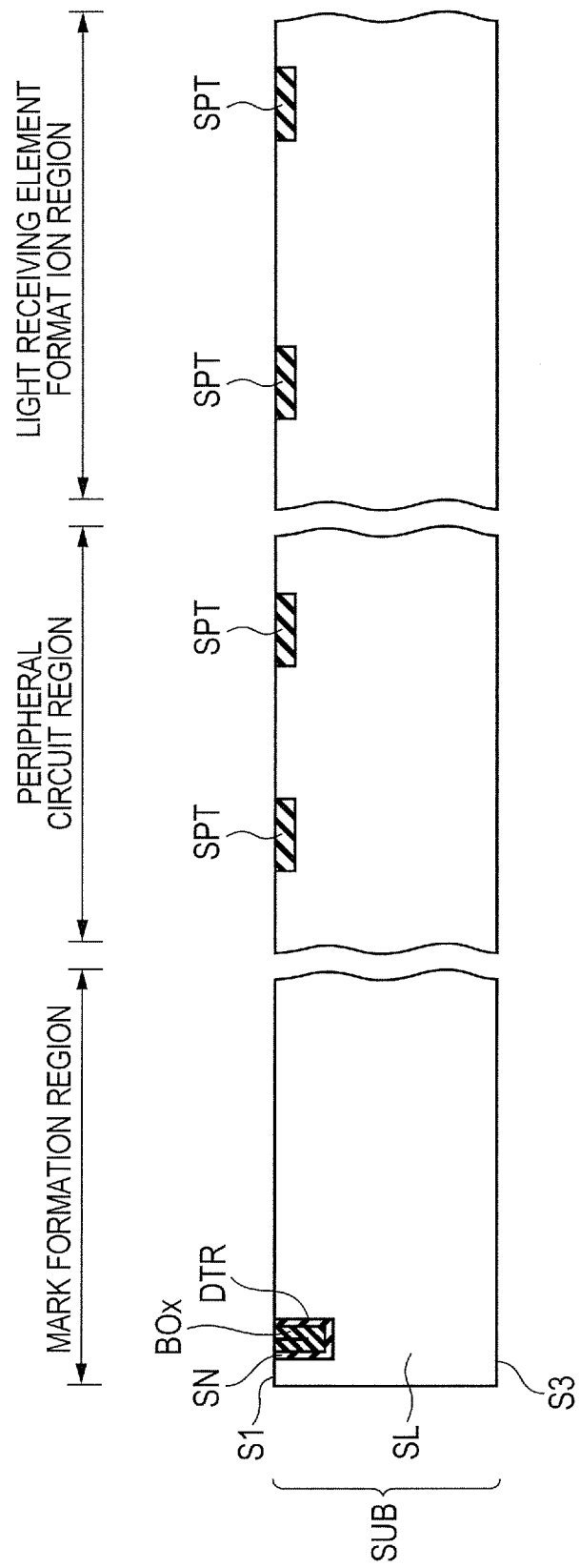
FIG. 57 is a schematic cross-sectional view showing a sixth step in a manufacturing method of the semiconductor device in the sixth embodiment.

Referring to FIG. 53, the silicon nitride film SN and the embedded silicon oxide film BOx are formed in that order to cover the inner peripheral walls of the trench DTR and the upper surface of the base silicon oxide film DOx in the same way as the step shown in FIG. 44. The silicon nitride film SN and the embedded silicon oxide film BOx are formed to fill in the trench DTR.

Referring to FIGS. 54 to 57, the same processes as those in the steps shown in FIGS. 45 to 48 are performed. After the step shown in FIG. 57, the same processes as those in respective steps shown in FIGS. 12 to 21 (steps other than the step of forming the element isolation region SPT which has been already performed) are basically performed, so that as shown in FIGS. 49 and 50 the photodiodes PD and the on-chip lenses LNS are formed.

Figure 49:
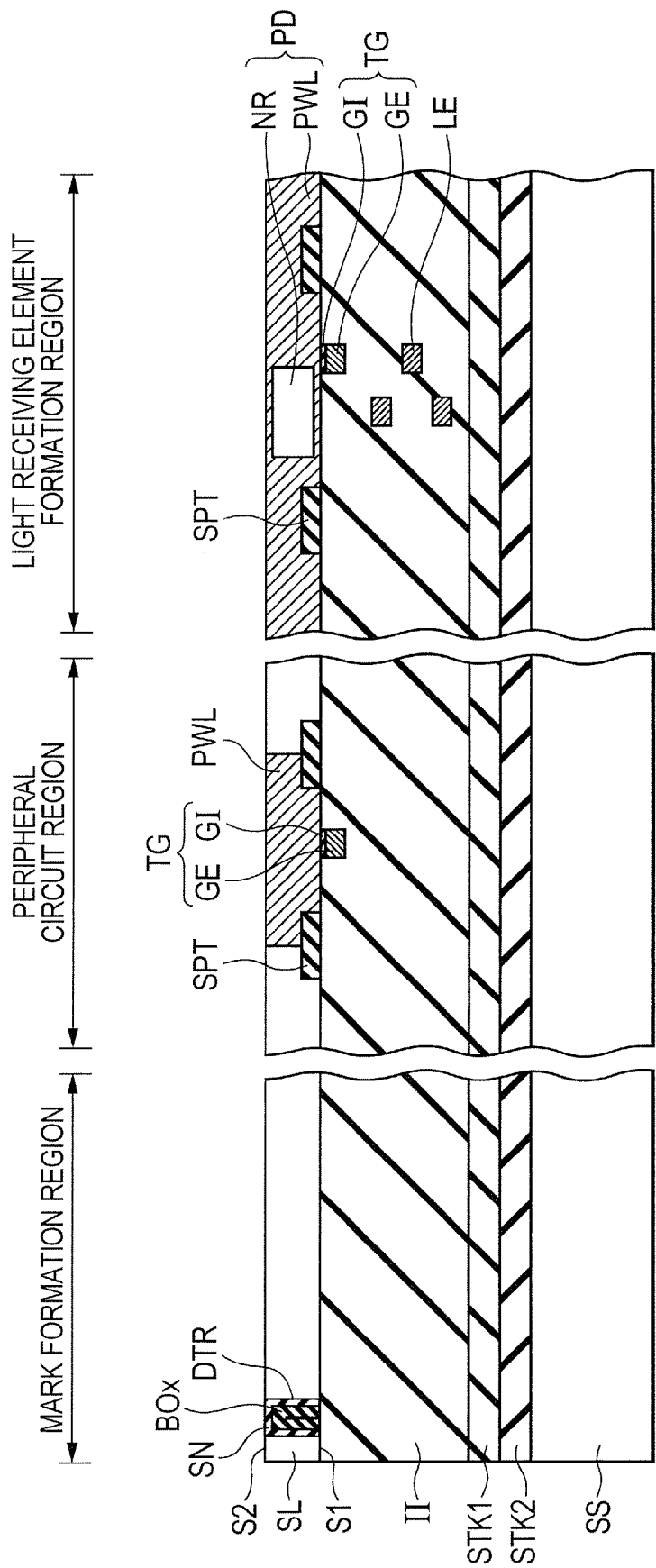
FIG. 49 is a schematic cross-sectional view showing a seventh step in a manufacturing method of the semiconductor device in the fifth embodiment.

In the same way as the step shown in FIG. 49, a region from the opposed main surface S3 of the semiconductor substrate SUB to the silicon nitride film SN covering at least an inner bottom of the trench DTR is removed, and the semiconductor layer SL with the back-side main surface S2 exposed is formed to thereby form the mark MK. When the removal ended in the silicon nitride film SN covering the inner bottom of the trench DTR, the embedded silicon oxide film BOx in the trench DTR is formed to have the same form as that shown in FIG. 42 (FIG. 49). When the semiconductor substrate SUB is further removed up to the front-side main surface S1 (up to the end of the above return longitudinal line of the embedded silicon oxide film BOx), the above return longitudinal line penetrates through the semiconductor layer SL as shown in FIG. 51.

Next, the operation and effects of this embodiment will be described. Also in use of the semiconductor substrate SUB made of the normal single crystal silicon and not the so-called SOI substrate in this embodiment, the mark MK is formed in the same layer at the same time as the step of forming other components, like the manufacturing method of the mark MK in the fifth embodiment (see FIGS. 54 to 57).

Thus, for example, this embodiment can reduce the number of photo masks for processing as compared to the case where the deposition step of forming the mark MK is independently performed from other steps. Further, this embodiment can also reduce the processing time, and the manufacturing cost of the product.

The mark MK of this embodiment includes the silicon nitride film SN, the silicon oxide film BOx, and is formed of different material from silicon contained in the semiconductor layer SL including the silicon nitride film and silicon oxide film. Thus, the mark MK can be easily viewed.

Figure 58:
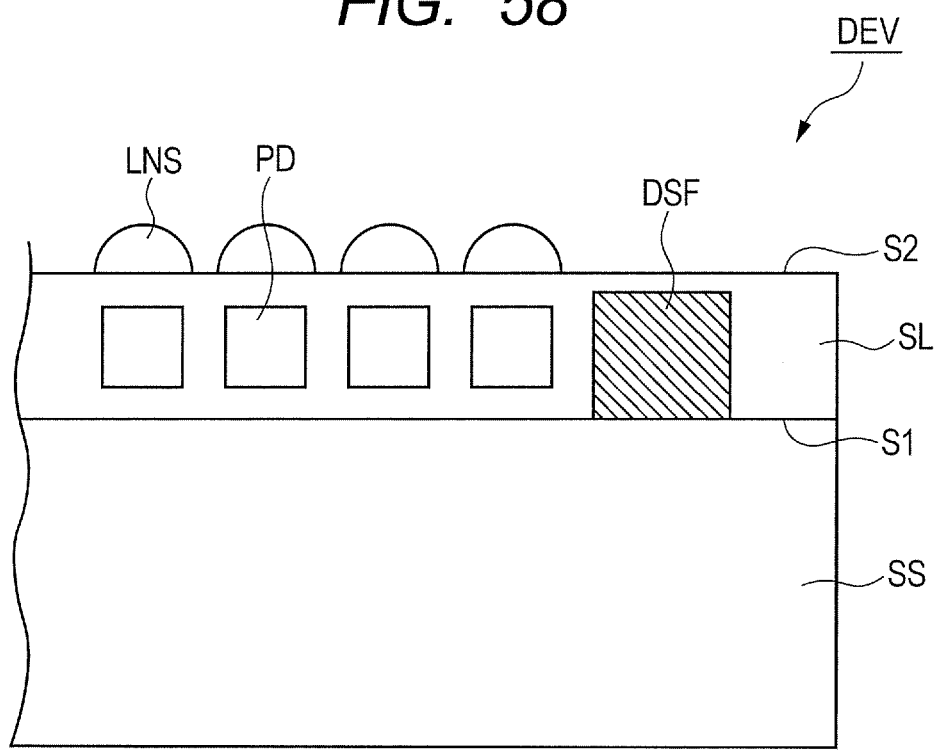
FIG. 58 is a schematic cross-sectional view showing main points of the structure according to one embodiment.

Finally, the points of the above embodiments will be described below. Referring to FIG. 58, the semiconductor device includes the semiconductor layer SL having the front-side main surface S1 and the back-side main surface S2 opposed to the front-side main surface, a plurality of photodiodes PD, on-chip lenses LNS for supplying light to the photodiodes PD, and the mark MK formed inside the semiconductor layer SL. The mark MK extends from the front-side main surface S1 to the back-side main surface S2. The mark MK is formed to have the deeply located surface DSF recessed toward the front-side main surface S1 to the back-side main surface S2. The deeply located surface DSF is formed of silicon.

Additionally, some parts of the contents described in the above embodiments will be described below.

(1) In the manufacturing method of the semiconductor device, first, a semiconductor substrate is provided which includes a front-side main surface and an opposed main surface opposed to the front-side main surface. The semiconductor substrate has an insulating layer embedded therein along the front-side main surface and the opposed main surface. The trench is formed to extend in the direction from the front-side main surface of the semiconductor substrate toward the back-side main surface thereof as a boundary with the insulating layer opposed to the front-side main surface to reach the back-side main surface. Within the trench, there are a first mark component formed of a silicon nitride film to cover the inner peripheral walls of the trench, and a second mark component formed of a silicon oxide film to cover the first mark component within the trench. The mark formed of the first and second mark components is formed. The region from the opposed main surface to the back-side main surface is removed from the semiconductor substrate. The region between the front-side main surface of the semiconductor substrate and the insulating layer is the semiconductor layer. A plurality of light receiving elements are formed from the front-side main surface in the semiconductor layer. By the use of the mark, the light receiving lens are disposed for supplying light to the light receiving element.

(2) The manufacturing method of the semiconductor device described in (1) further forms an element isolation region for electrically isolating a plurality of light receiving elements. In the step of forming the element isolation region, a pad oxide film is formed in contact with an upper surface of the front-side main surface, and a pattern of a nitride film for processing is formed in contact with an upper surface of the pad oxide film. The first mark component is formed in the same layer as the pattern of the nitride film for processing. The second mark component is formed in the same layer as the pattern of the nitride film for processing.

(3) In the manufacturing method of the semiconductor device, first, a semiconductor substrate is provided which includes a front-side main surface and an opposed main surface opposed to the front-side main surface. The trench is formed to extend in the direction from the front-side main surface to the opposed main surface to reach the inside of the semiconductor substrate. Within the trench, there are a first mark component formed of a silicon nitride film to cover the inner peripheral walls of the trench, and a second mark component formed of a silicon oxide film to cover the first mark component within the trench. A region of the semiconductor substrate extending from the opposed main surface up to the first mark component covering at least the bottom of the trench is removed to thereby form the mark including the first and second mark components. A plurality of light receiving elements are formed in the region formed as the semiconductor layer in the semiconductor substrate. By the use of the mark, the light receiving lens for supplying light to the light receiving element is positioned over the back-side main surface opposed to the front-side main surface of the semiconductor layer.

(4) The manufacturing method of the semiconductor device described in (3) further form an element isolation region for electrically isolating the light receiving elements. In the step of forming the element isolation region, a pad oxide film is formed in contact with an upper surface of the front-side main surface, and a pattern of a nitride film for processing is formed in contact with an upper surface of the pad oxide film.

The present invention made by the inventors has been specifically described based on the embodiments. It is apparent that the present invention is not limited to the above embodiments, and that various modifications and changes can be made without departing from the scope of the invention.

What is claimed is:

1. A manufacturing method of a semiconductor device, comprising the steps of:
    providing a semiconductor substrate with a front-side main surface and an opposed main surface, which is opposed to the front-side main surface, said semiconductor substrate having an insulating layer embedded therein between the front-side main surface and the opposed main surface and a semiconductor layer between the front-side main surface and the insulating layer;
    forming a trench extending from the front-side main surface to a back-side of the semiconductor layer, the back-side of the semiconductor layer facing the insulating layer;
    forming a mark within the trench, said mark having a deeply located surface recessed with respect to the back-side of the semiconductor layer, said mark comprising at least a film of material that is the same as a material of said semiconductor layer;
    forming in the semiconductor layer a plurality of light receiving elements at the front-side main surface;
    removing a region of the semiconductor substrate that is between the opposed main surface and the back-side of the semiconductor layer; and
    disposing a light receiving lens for supplying light to one of the light receiving elements using the mark for alignment.

2. The manufacturing method of the semiconductor device according to claim 1, wherein the semiconductor layer and the mark are entirely formed of silicon.

3. The manufacturing method of the semiconductor device according to claim 2, wherein the step of forming the mark includes a step of embedding a thin silicon film in the trench.

4. The manufacturing method of the semiconductor device according to claim 3, wherein the step of forming the mark further includes a step of forming an insulating film at an inner peripheral wall of the trench before the step of embedding the thin silicon film in the trench.

5. The manufacturing method of the semiconductor device according to claim 1, wherein the semiconductor substrate includes a base substrate, and wherein the step of removing comprises removing the base substrate with an alkaline solution.

6. The manufacturing method of the semiconductor device according to claim 1, wherein the step of forming the mark comprises the steps of:
    forming a thin insulating film at a bottom of the trench such that the thin insulating film has a bottom surface in contact with the insulating layer;
    embedding a thin silicon film in the trench such that the thin silicon film is in contact with an upper surface of the thin insulating film; and
    removing the insulating layer and the thin insulating film such that the thin silicon film is recessed with respect to the back-side of the semiconductor layer.

7. The manufacturing method of the semiconductor device according to claim 1, wherein the trench is formed to reach the insulating layer from the front-side main surface.

8. The manufacturing method of the semiconductor device according to claim 1, wherein the trench is formed to have a bottom between the front-side main surface and the back-side of the semiconductor layer.

9. The manufacturing method of the semiconductor device according to claim 1, wherein in the step of forming the mark, a first mark for processing the front-side main surface and a second mark for processing the back-side of the semiconductor layer are simultaneously formed.

10. The manufacturing method of the semiconductor device according to claim 9, wherein the first mark and the second mark are the same.

11. The manufacturing method according to claim 9, wherein the light receiving lens is disposed over the back-side of the semiconductor layer so as to be closer to the back-side of the semiconductor layer than the front-side main surface.

12. The manufacturing method according to claim 9, wherein said material of the semiconductor layer is single crystal silicon and said film of material of the mark is a film of polysilicon or amorphous silicon.

13. A method of manufacturing a semiconductor device, the method comprising:
    forming a trench in a semiconductor substrate, the semiconductor substrate including a first semiconductor layer, a second semiconductor layer, and an insulating layer between the first and second semiconductor layers, the trench extending from a first surface of the first semiconductor layer to a second surface thereof facing the insulating layer;
    forming a first insulating film in said trench, the first insulating film contacting at least the insulating layer;
    forming a mark by depositing at least a semiconductor film within said trench over the first insulating film, the semiconductor film being formed of a same material as the first semiconductor layer;
    forming a light receiving element in the first semiconductor layer; and
    removing the second semiconductor layer, the insulating layer, and the first insulating film in contact with the insulating layer such that the mark is recessed with respect to the second surface of the first semiconductor layer.

14. The method according to claim 13, further comprising disposing a light receiving lens over the second surface in alignment with the light receiving element, the lens being closer to the second surface of the first semiconductor layer than the first surface.

15. The method according to claim 13, wherein the first semiconductor layer comprises single crystal silicon and the semiconductor film comprises polysilicon or amorphous silicon.

16. The method according to claim 13, wherein the first insulating film is formed over sidewalls of said trench such that the first insulating film is between at least a portion of the semiconductor film and the first semiconductor layer.

* * * * *